(12) United States Patent
Dubuc et al.

(10) Patent No.: US 7,872,383 B2
(45) Date of Patent: Jan. 18, 2011

(54) POWER INTERCONNECTING PART FOR ELECTRICAL ROTATING MACHINE

(75) Inventors: Cyril Dubuc, Sept Sorts (FR); Laurent Thery, Fontenay Sous Bois (FR)

(73) Assignee: Valeo Equipements Electriques Moteur, Creteil (FR)

( * ) Notice: Subject to any disclaimer, the term of this patent is extended or adjusted under 35 U.S.C. 154(b) by 314 days.

(21) Appl. No.: 11/915,898

(22) PCT Filed: Apr. 20, 2006

(86) PCT No.: PCT/FR2006/050362

§ 371 (c)(1),
(2), (4) Date: Nov. 29, 2007

(87) PCT Pub. No.: WO2006/129031

PCT Pub. Date: Dec. 7, 2006

(65) Prior Publication Data

US 2008/0311763 A1    Dec. 18, 2008

(30) Foreign Application Priority Data

May 31, 2005    (FR) .................................. 05 05501

(51) Int. Cl.
*H02K 11/00*    (2006.01)
(52) U.S. Cl. ...................... 310/68 R; 310/71
(58) Field of Classification Search .............. 310/71, 310/68 D, 68 B, 68 R
See application file for complete search history.

(56) References Cited

U.S. PATENT DOCUMENTS

| 5,194,772 | A | 3/1993 | Matsushita |
|---|---|---|---|
| 5,296,770 | A * | 3/1994 | Pflueger et al. ............... 310/14 |
| 5,451,823 | A | 9/1995 | Deverall et al. |
| 5,543,703 | A | 8/1996 | Kusase et al. |
| 5,587,890 | A | 12/1996 | Happ et al. |
| 6,232,683 | B1 | 5/2001 | Hirai et al. |
| 6,371,799 | B1 | 4/2002 | Alfaro et al. |
| 6,400,059 | B1 | 6/2002 | Hsu |
| 6,496,377 | B1 | 12/2002 | Happ et al. |
| 6,692,278 | B2 | 2/2004 | Abadia et al. |
| 6,737,786 | B2 | 5/2004 | Hsu |
| 6,911,750 | B2 | 6/2005 | Bradfield et al. |
| 6,995,486 | B2 | 2/2006 | Bradfield et al. |
| 7,019,424 | B2 | 3/2006 | Aeschlimann et al. |
| 7,046,518 | B2 | 5/2006 | Golightly et al. |
| 7,196,441 | B2 * | 3/2007 | Ueda et al. .................... 310/64 |
| 7,224,145 | B2 | 5/2007 | Pierret et al. |

(Continued)

FOREIGN PATENT DOCUMENTS

| DE | 1763103 A1 | 7/1971 |
|---|---|---|
| DE | 9218701 U1 | 2/1995 |
| DE | 10120414 A1 | 10/2002 |
| DE | 102004007395 A1 | 1/2005 |
| EP | 0660501 A1 | 6/1995 |

(Continued)

*Primary Examiner*—Nguyen N Hanh
(74) *Attorney, Agent, or Firm*—Jacox, Meckstroth & Jenkins

(57) ABSTRACT

A power interconnection piece for a rotary electrical machine, wherein the power interconnection piece comprises at least one power track provided with electrical power terminals intended to cooperate with a power track of at least one electronic module so as to distribute electrical power to the electronic module, the electronic module being integrated on the rotary electrical machine and wherein the power interconnection piece comprises a base plate made from insulating material that at least partially overmolds the power track.

22 Claims, 73 Drawing Sheets

U.S. PATENT DOCUMENTS

| | | |
|---|---|---|
| 2002/0043885 A1 | 4/2002 | Asao et al. |
| 2002/0196609 A1 | 12/2002 | Golightly et al. |
| 2003/0109149 A1 | 6/2003 | Abadia et al. |
| 2003/0160537 A1 | 8/2003 | Hsu |
| 2003/0178899 A1 | 9/2003 | Aeschlimann et al. |
| 2005/0001492 A1 | 1/2005 | Bradfield et al. |
| 2005/0194850 A1 | 9/2005 | Bradfield et al. |
| 2005/0253457 A1 | 11/2005 | Pierret et al. |

FOREIGN PATENT DOCUMENTS

| | | |
|---|---|---|
| EP | 1199785 A1 | 4/2002 |
| FR | 2749715 A | 12/1997 |
| FR | 2797112 A1 | 2/2001 |
| FR | 2842041 A1 | 1/2004 |
| WO | 02060038 A1 | 8/2002 |
| WO | 2004006423 A2 | 1/2004 |

* cited by examiner

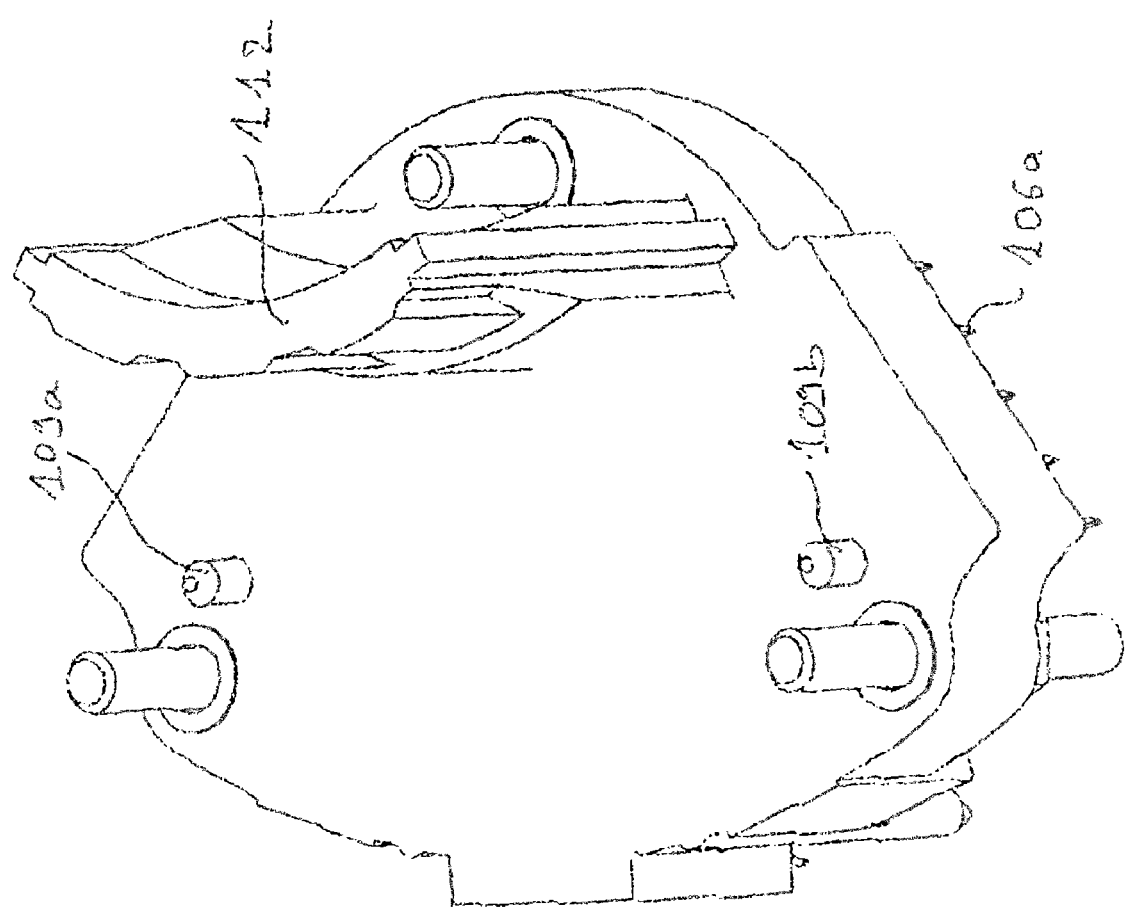

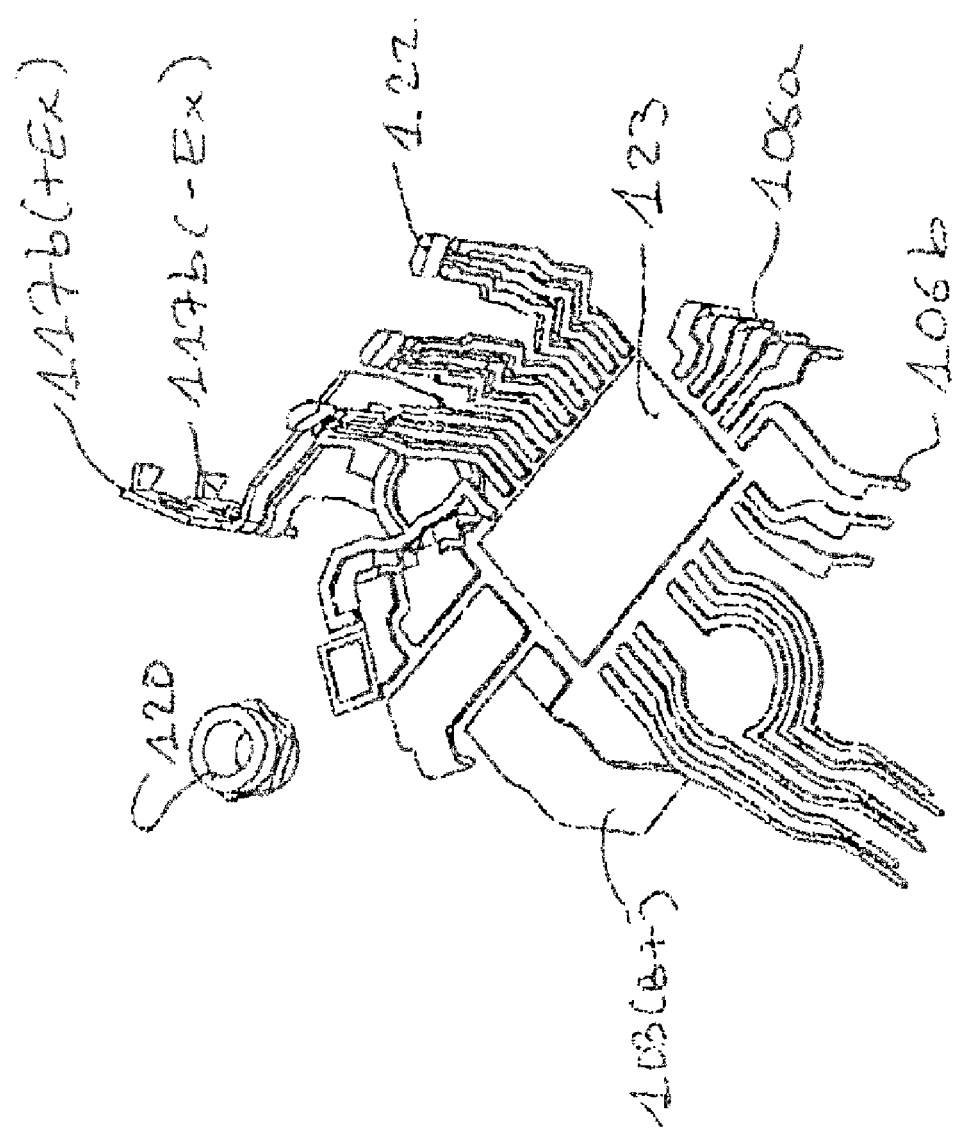

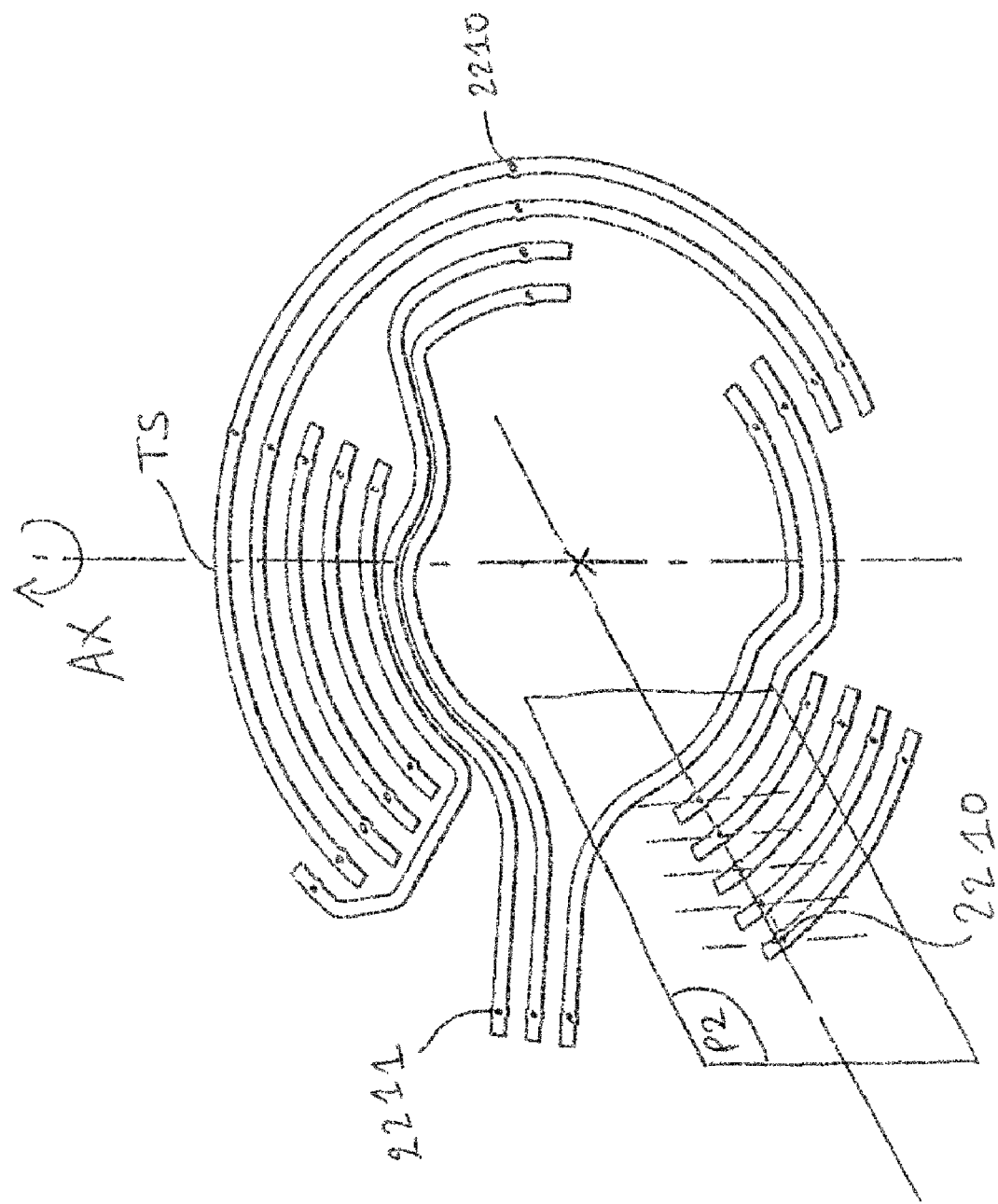

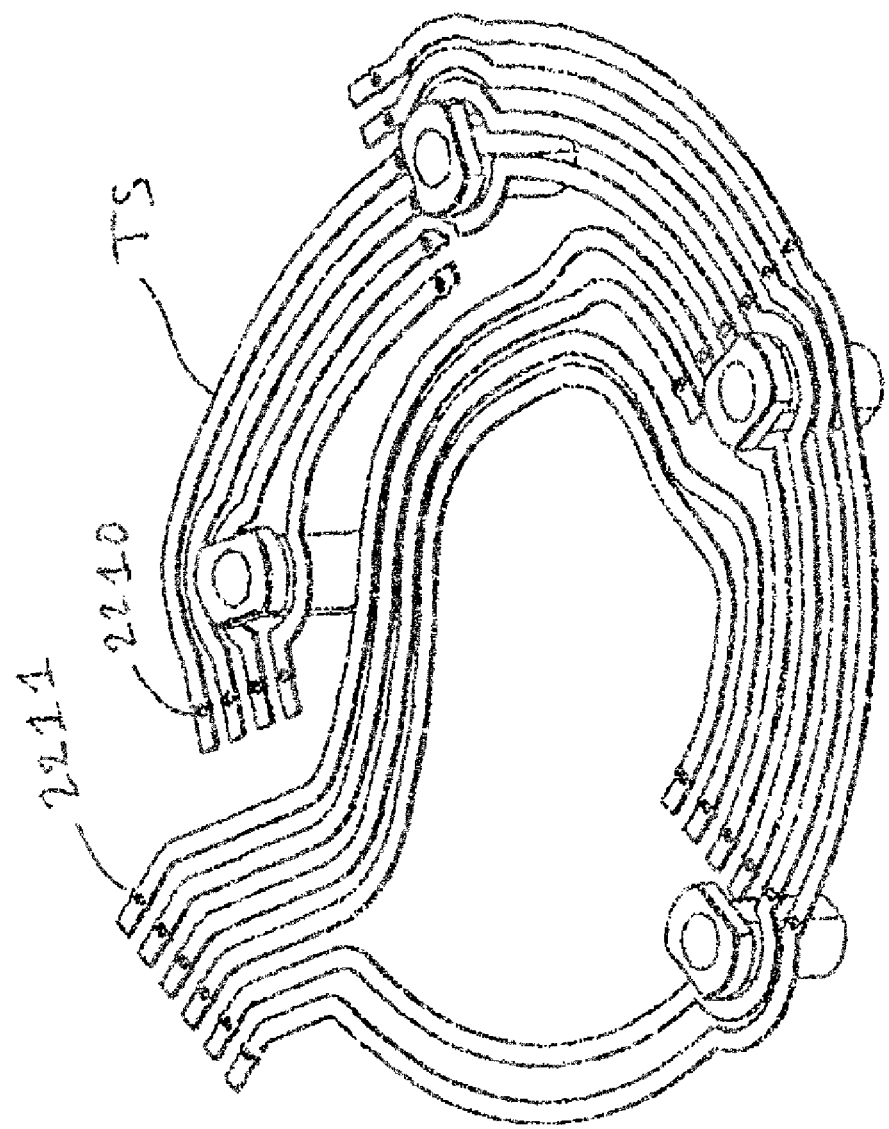

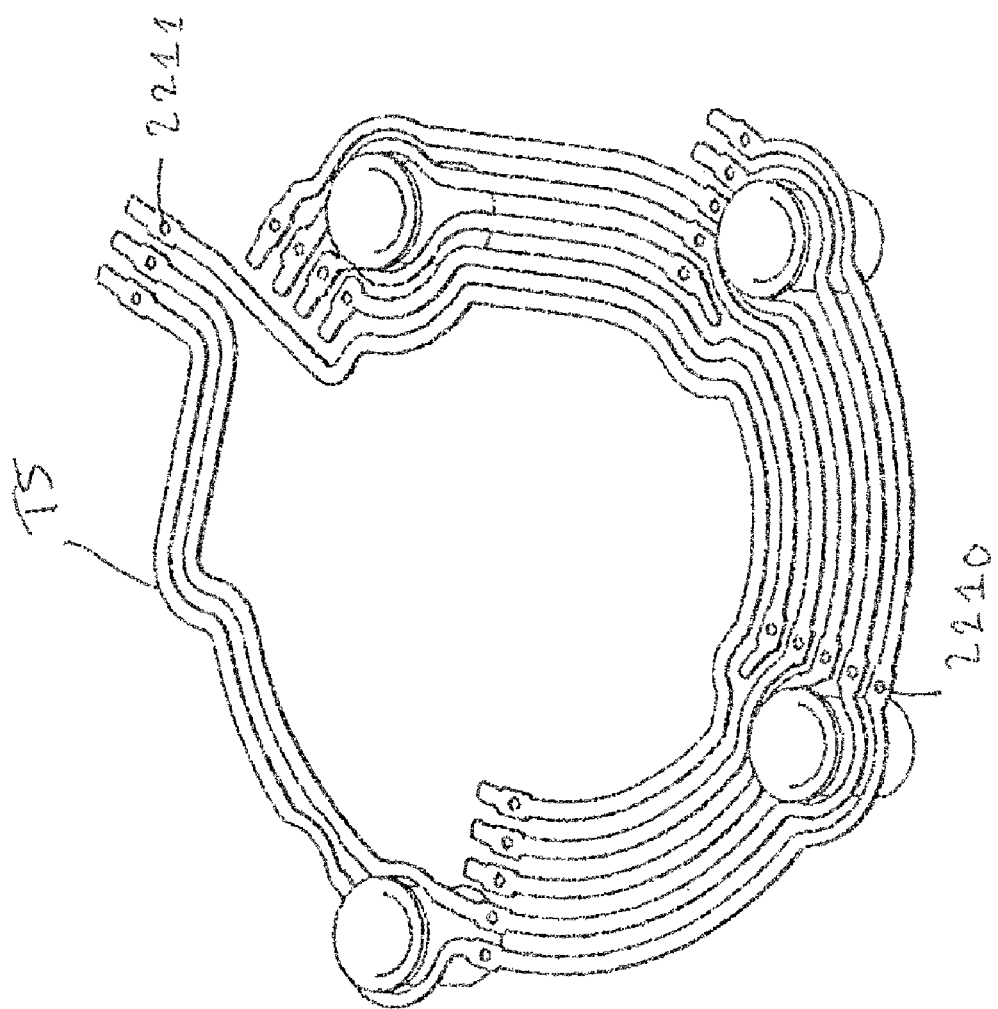

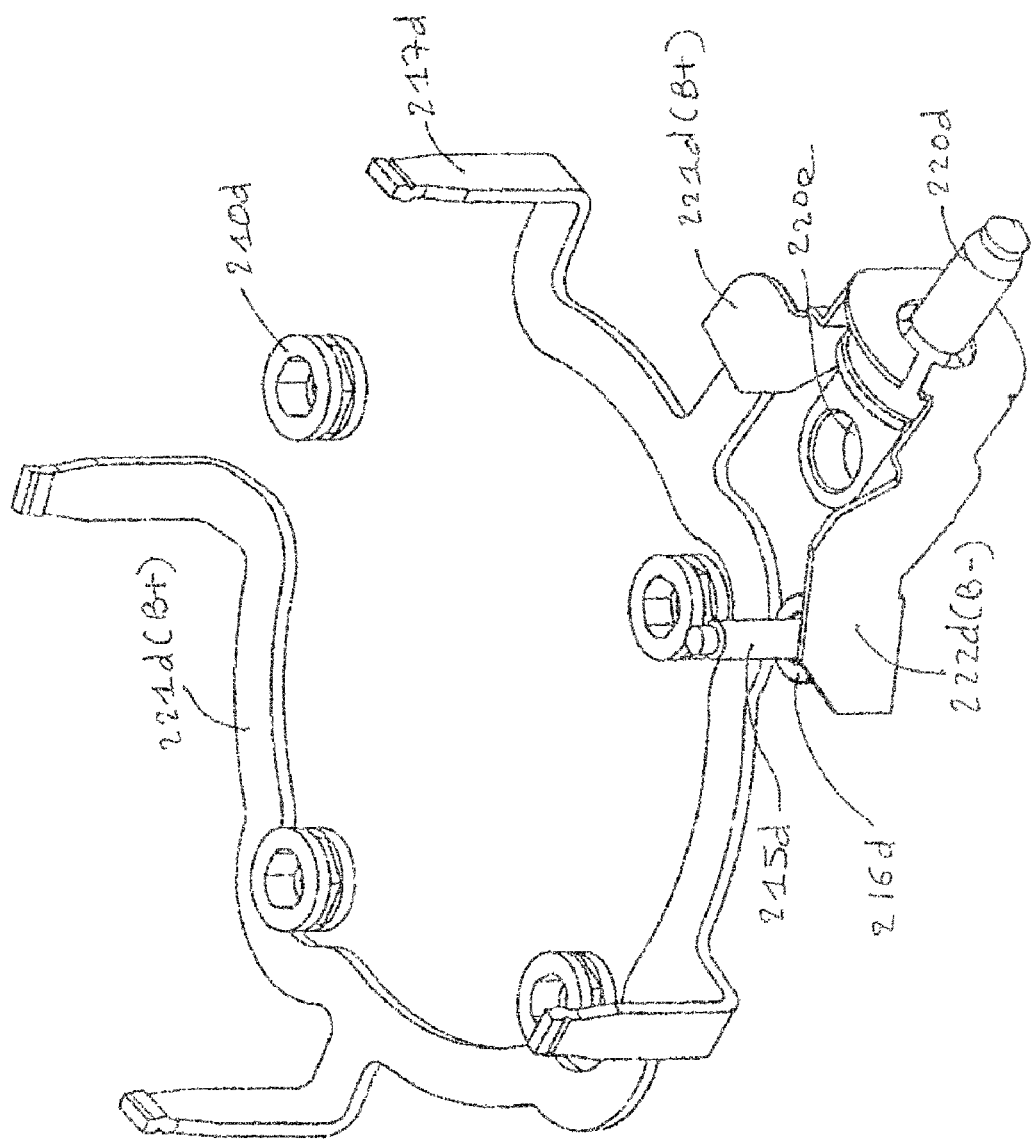

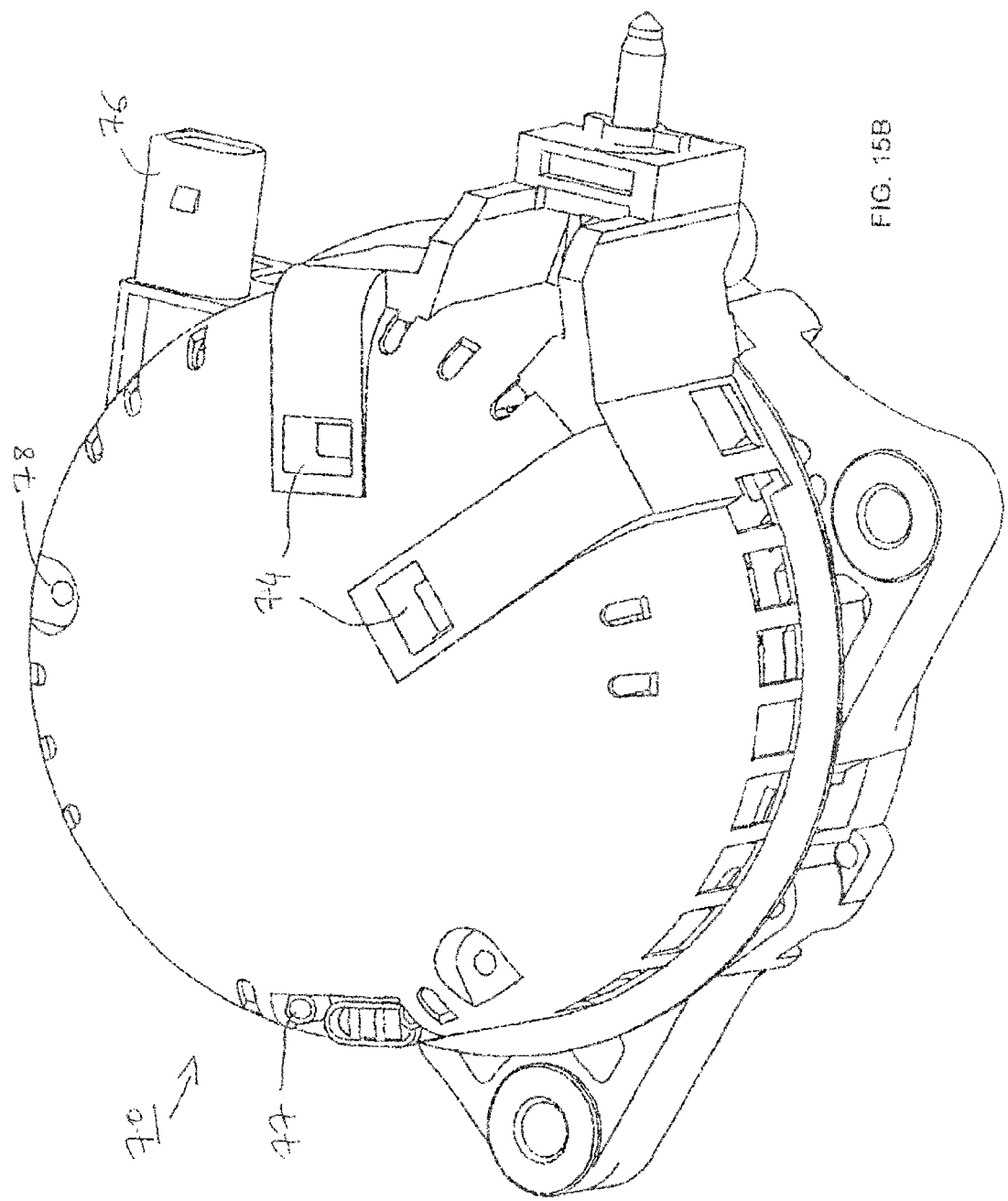

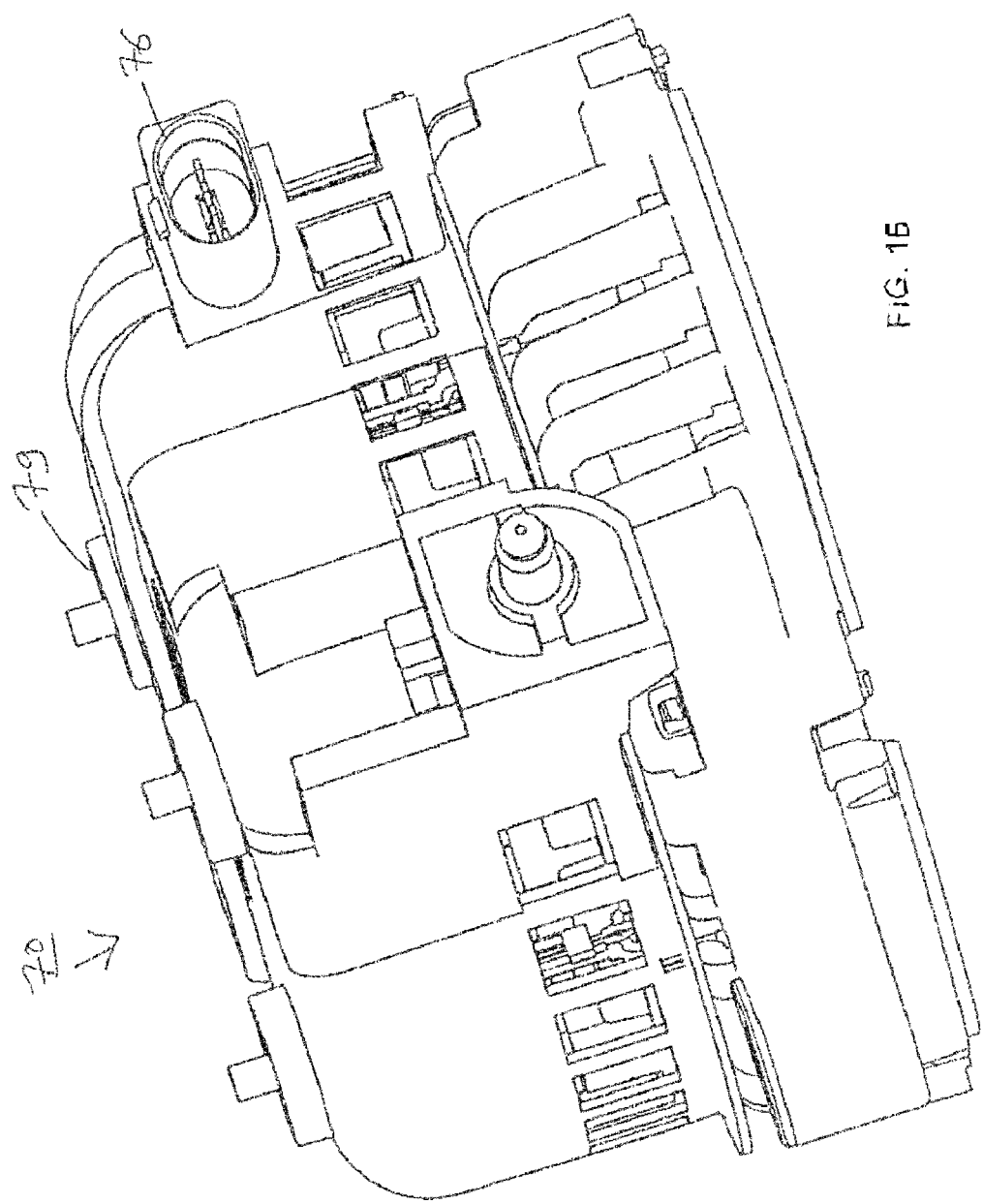

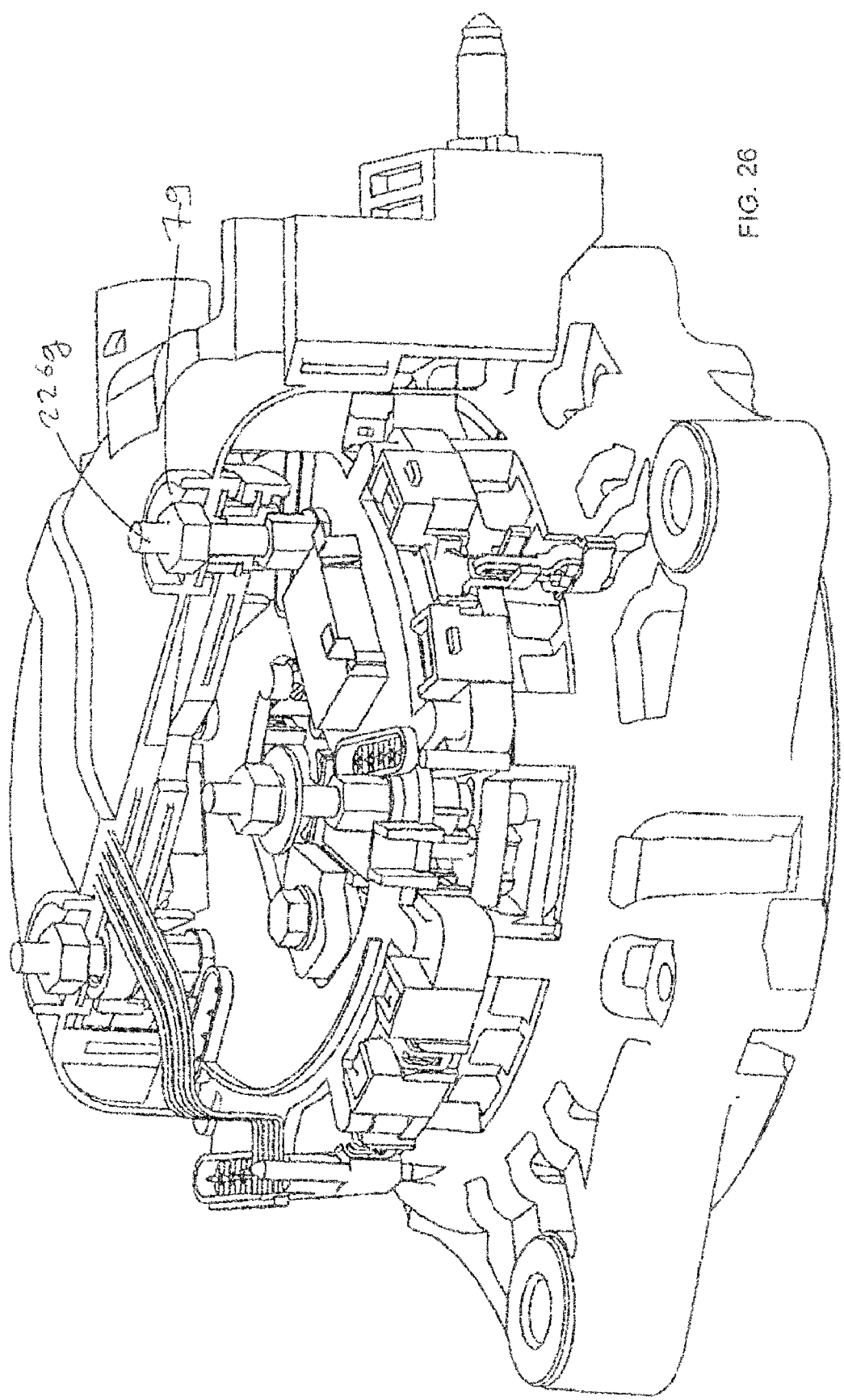

POWER INTERCONNECTING PART FOR ELECTRICAL ROTATING MACHINE

CROSS-REFERENCE TO RELATED APPLICATIONS

This application claims priority to PCT Application PCT/FR2006/050362 filed Apr. 20, 2006 and also to French Application No. 0505501 filed May 31, 2005, which applications are incorporated herein by reference and made a part hereof.

BACKGROUND OF THE INVENTION

1. Field of the Invention

The invention concerns a power interconnection piece for a rotary electrical machine.

The present invention applies to any type of polyphase rotary electrical machine, synchronous or asynchronous, such as alternators or alternator starters, and also whether it is a case of electrical machines for motor vehicles and driven for example by belt, with cooling by air, liquid or any other solution that can be envisaged.

2. Description of the Related Art

In a motor vehicle comprising a thermal engine and a rotary electrical machine such as an alternator starter, such an electrical machine comprises for example, non-limitatively:

- a rotor comprising a field winding into which an excitation current is brought; and
- a stator comprising a polyphase winding.

The alternator starter functions in motor mode or in generator mode. It is a so-called reversible machine.

In generator or alternator mode, the machine converts a rotation movement of the rotor driven by the thermal engine of the vehicle into an electric current induced in the phases of the stator. In this case, a bridge rectifier connected to the phases of the stator rectifies the sinusoidal induced current into a DC current in order to supply consumers on the vehicle such as a battery.

On the other hand, in motor mode, the electric machine serves as an electric motor for rotating, via the shaft of the rotor, the thermal engine of the vehicle. It converts electrical energy into mechanical energy. In this case, an inverter converts a DC current coming from the battery into an alternating current for supplying the phases of the stator in order to rotate the rotor.

Control signals are used to determine the operating mode of the rotary electrical machine (motor mode or generator mode).

Finally, it is necessary to supply all the electronic components with power.

In the document DE 102004007395 A1, use is made of the electronic components that are inside an external peripheral band. These components comprise power ends that are also inside the band. The band comprises internal partitions in which metal power interconnection tracks are molded on with signal tracks. They are superimposed on one another. These power tracks connect the components via their power ends to the battery so as to supply them. The band is positioned on the rear bearing of the machine. This solution proves to be problematic because firstly of the complex design of the superimposed tracks and secondly the cross-sections of power interconnection tracks that are too small compared with the current necessary, around 150 A in alternator mode and 600A on starting, for the application of a starter or alternator starter, so that the said tracks reach an excessively high temperature.

SUMMARY OF THE INVENTION

Thus an object of the present invention is to propose a power interconnection piece for a rotary electrical machine that can easily be integrated on a rotary electrical machine and that can have sufficiently large conductors to withstand the currents that pass through them.

To this end, according to a first object of the present invention, the power interconnection piece comprises at least one power track provided with power electrical terminals intended to cooperate with a power track of at least one electronic module so as to distribute electrical power to the said module, the said module being integrated on the said machine.

Thus, as will be seen in detail below, having a power interconnection piece comprising electrical terminals intended to cooperate with the electronic components makes it possible to have a power interconnection piece independent of the said modules and to stack the said piece in a plane different from that used by the said electronic components. Thus this avoids problems of overmolding of the tracks. Moreover, offsetting the interconnections on a plane different from the electronic components releases more surface area for the electronic modules and therefore for the electronic components and also for the power interconnection tracks. Thus there is a larger cross-section of power tracks so as to convey more power. The interconnection tracks are thus defined independently of the space taken up by the electronic components on the machine.

According to non-limitative preferential embodiments, the power interconnection piece that is the object of the invention has the additional characteristics stated below.

- it comprises a base plate made from insulating material that moulds on the power interconnection track;
- it is configured so as to be placed on a plane different from that of the electronic module;
- it is independent of the electronic module;
- the power terminals extend towards the external periphery of the piece;
- the power terminals are not molded on;
- the power terminals comprise curved free ends;
- a power track is flat;
- it comprises at least one positive power interconnection track and at least one negative interconnection track;
- it is configured so as to be disposed above the electronic module;
- the power tracks are interleaved;
- the tracks are concentric;
- the power tracks are on the same plane;
- the power tracks are not superimposed so as to allow electrical connection with tracks on a cover;
- the respective power terminals of the positive and negative power tracks are intended to cooperate respectively with positive and negative tracks of an electronic module;
- there exist at least one positive power terminal and at least one negative power terminal for one electronic module;
- there exist a single positive power terminal and a single negative power terminal for one electronic module;
- the base plate comprises at least one recess for an electrical connection of a power interconnection track with a cover;
- it also comprises fixing devices for fixing to an electronic module, the devices extending radially on the external periphery of the piece;
- electrical terminals are flexible;

it also comprises devices for pre-assembly on a signal interconnection piece, the signal piece conveying control signals between electronic modules;

it also comprises inserts for receiving fixing means for fixing to the machine;

it also comprises a mechanical stop disposed on the outside diameter of the piece;

it also comprises support devices for supporting the piece on a dissipator of the rotary electrical machine during assembly;

it comprises a central recess for the insertion of a brush holder;

it is configured so as to be placed on the bottom face of a dissipator;

it also comprises at least one insert for receiving a hollow rivet and effecting a pre-assembly with an electronic module and a signal interconnection piece and a dissipator;

it also comprises means of protecting stator phases of the rotary electrical machine;

it also comprises means of positioning on the bearing of the rotary electrical machine, the means extending over a bottom face of the piece;

it also comprises at least one force stay for axial deformation of the piece;

the force stay has a greater height than the insert;

it also comprises devices for positioning the piece on a dissipator of the rotary electrical machine;

it also comprises a metal insert so as to effect an electrical connection with the negative power track;

the power interconnection terminals issue from a positive power track;

the electrical interconnection terminals are axial tongues projecting beyond the top face of the piece;

it also comprises means of protecting the positive power interconnection terminals;

it also comprises a power connector in which positive and negative power tracks are inserted in a visible fashion;

it also comprises a terminal for mechanical connection to a client connector;

it also comprises a mechanical connection orifice for preventing transmission of the mechanical stresses on overmolding when the client power connector is fixed to the connecting terminal;

it also comprises a collar intended to cover air outlet openings in the bearing of the rotary electrical machine so as to guide the outlet air and attenuate any looping of air;

it is placed on an electronic modules plus signal interconnection piece plus dissipator assembly, the signal piece conveying control signals between the various electronic modules, and the assembly being disposed on a bearing of the rotary electrical machine;

it is placed on a face of a dissipator opposite to that on which there is disposed an electronic modules plus signal interconnection piece assembly, the signal piece conveying control signals between the various electronic modules, the whole being placed on a bearing of the rotary electrical machine;

it is fixed to an attached dissipator; and it forms with the electronic modules plus dissipator plus signal interconnection piece assembly an independent electronic sub-assembly of a bearing of the machine.

Other characteristics and advantages of the present invention will emerge from the following description. This is purely illustrative and must be read with regard to the accompanying drawings, given by way of non-limitative examples.

BRIEF DESCRIPTION OF THE DRAWINGS

FIG. 2B is a view from below of the module of FIG. 2A;

FIG. 5F is a fourth view from below without pre-molding and without overmolding of the module of FIG. 5B;

FIG. 9C is a view without overmolding of the piece of FIG. 9A;

FIG. 10B is a view from below of the signal interconnection piece of FIG. 10A;

FIG. 10C is a view without overmolding of the signal interconnection piece of FIG. 10A;

FIG. 11D is a view without overmolding of the signal interconnection piece of FIG. 11A;

FIG. 14C is a view without of the overmolding of the piece of FIG. 14A;

FIG. 15B is a view from above of the cover of FIG. 15A;

FIG. 16 is a second embodiment of a cover intended to be situated above the power piece of FIG. 13;

FIG. 26 depicts the arrangement of FIG. 25 with a cover in partial cross-section;

DESCRIPTION OF THE PREFERRED EMBODIMENTS

It should be noted that, in the remainder of the description, the diameter of a bearing of the machine without fixing lug is defined as the outside diameter of the machine.

Electronic Module

It should be noted that an electronic module, in the context of the invention, is a set of electronic components that are disposed in a housing and comprises connection elements accessible from the outside for its functioning, these elements making it possible to transmit control and/or power signals.

Figure 1A:
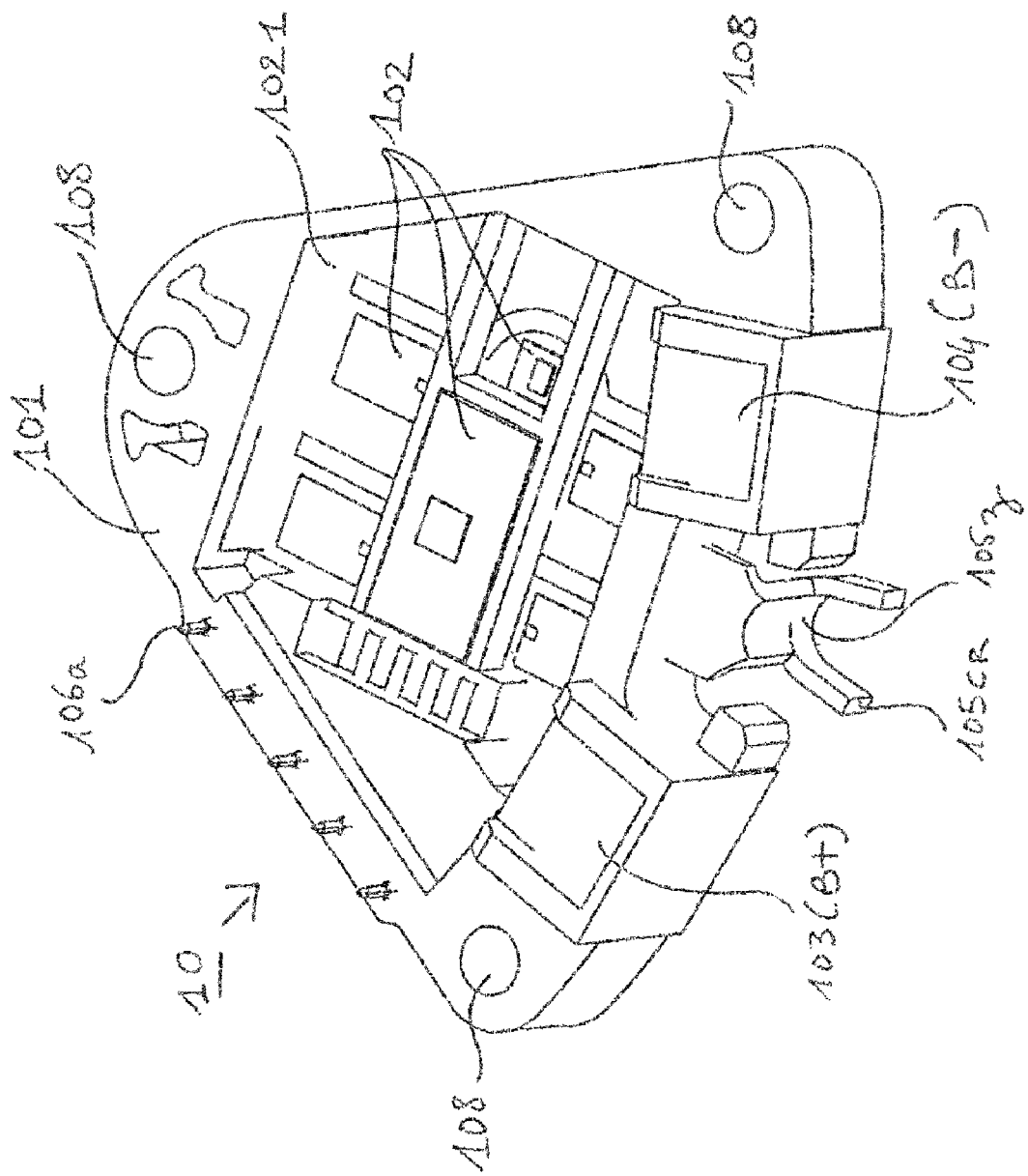
FIG. 1A depicts the first embodiment of an electronic module according to the invention.

FIG. 1A depicts a first non-limitative embodiment of an electronic module 10 according to the invention.

The electronic module 10 comprises:
 a housing 101;
 electronic components 102 located in a central zone 1021 covered with a protective gel such as a gel of the silicone or epoxy resin type, and a protective plastic cover;
 electrical conductors 103 (B+), 104 (B−);
 signal connection elements 106; and
 fixing points 108.

In addition, the electronic module 10 comprises, as indicated on the view from below in FIG. 1B:
 means 109 of positioning the electronic module 10 on a dissipator bearing.

The various elements of the electronic module 10 are described below.

The housing 101 is made from electrically insulating material. Preferably, the housing has a substantially triangular basic shape and therefore has at least three lateral faces and one top face and one bottom face. This shape will make it possible to use a maximum amount of surface area on the cylindrical rear of the machine, and this in an optimum fashion.

Moreover, preferentially, one of the faces of the electronic module 10 is an arc of a circle. This is appropriate to the general shape of the machine.

Naturally it would be possible to use other shapes, such as a substantially rectangular shape.

The electrical conductors 103 (B+), 104 (B−) convey a current coming from the battery through the electronic elements.

In a preferential embodiment, the electrical conductors 103, 104 are two power connection tracks, the ends of which are disposed on the external periphery of the module. Preferentially, the tracks are made from copper.

Thus, unlike an architecture in which the power necessary for each module passes through all the modules or in which an electronic power card is situated in a housing separate from the machine, this configuration has the following advantages:

- this allows a salt spray to flow towards the outside of the machine instead of banking up at the center of the machine, which prevents corrosion of the tracks by the salt spray;
- there is less heating in the modules since the power necessary for a module passes only through the module;
- the welds on the ends of the tracks are carried out on a single radius, which makes it possible to automate the welding better; and
- this also allows balancing of the current in the modules because each module is supplied independently, i.e. they are supplied in parallel.

In a first variant of this embodiment, the electrical conductors 103, 104 extend in a plane parallel to that along which the block of electronic elements extends. This allows laser welding axial with respect to the axis of the machine.

In a second variant, the tracks extend along two planes parallel to each other and parallel to the plane of the block of electronic elements.

It should be noted that track means a cropped metal sheet formed from a metal such as copper.

The signal connection elements 106, called signal connections, convey control signals for controlling the electronic components 102. They thus allow the sending and reception of information necessary for controlling the inverter arm (motor mode) and/or the arm of the bridge rectifier (generator mode). They afford connection with a signal plate (described below).

In a first preferential embodiment, these signal connection elements 106 comprise a first series of signal tongues 106a and are aligned on one of the lateral faces of the triangular housing of the module. Thus the axes of these signal tongues 106a are in the same plane P1 perpendicular to the bottom face of the module, the plane passing essentially through the rotor rotation axis AX.

This alignment makes it possible to carry out linear tongue welding, which limits the time needed for the manufacturing method, called the "process", and the size. This configuration has the advantage of having, for the signal interconnection piece, a signal track cut in one go, unlike another configuration in which the signal tracks overlap. It will be noted that, if the tongues are offset towards the inside of the module, i.e. if the plane does not pass through the rotation axis, the space for the electronic components 102 is reduced, and otherwise the space for the other modules is reduced.

Fixing means 108, represented here by orifices, are intended to facilitate the holding of the module on the electrical machine by means of studs 113 or screws etc, or any appropriate fixing means.

Figure 1B:
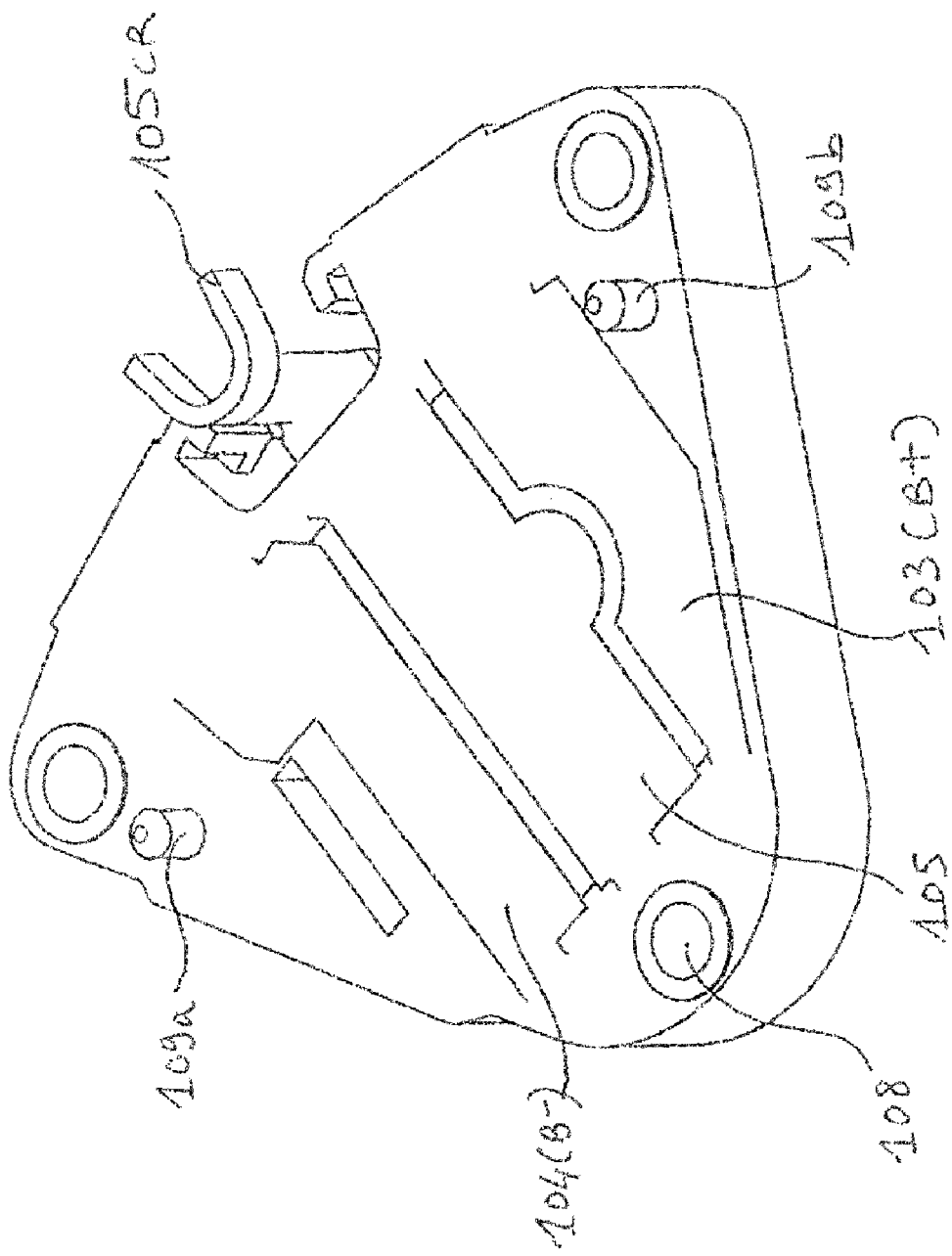
FIG. 1B depicts the module of FIG. 1A in a view from below.

The means 109 of positioning the electronic module 10 on a dissipator bearing or dissipator are here two in number 109a, 109b as illustrated in FIG. 1B, which are on the bottom face of the module, close to two opposite edges. In the example, these are pins situated on each side of the electronic components 102. They are here spaced at a maximum, which limits positioning errors.

Figure 2A:
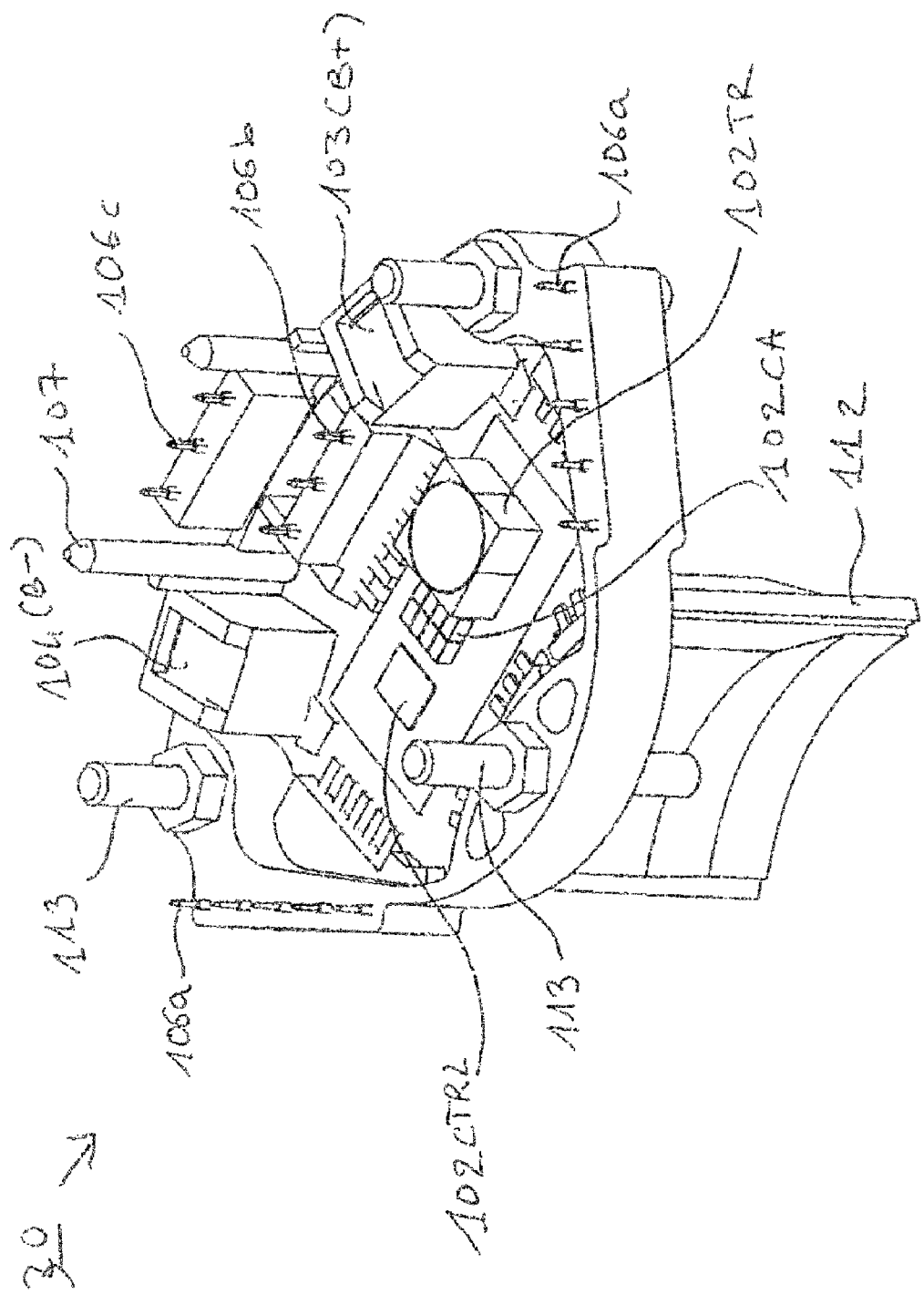
FIG. 2A is a first variant of the first embodiment of FIG. 1A.

In addition, preferentially, the electronic module 10 also comprises, as illustrated in FIG. 2A:

means 107 of protecting the signal connection element 106, facilitating the positioning of a cover (described below).

In addition, preferentially, the electronic module 10 also comprises, as illustrated in FIG. 1A:

a phase track 105 connecting the module to a phase of the stator.

In a preferential embodiment, the phase track 105 has an end 105z that comprises a hook 105cr and makes it possible to connect thereto, by welding, brazing or any other suitable method, a phase wire or phase tongue coming from the stator of the electrical machine. In the example depicted in FIG. 1A, the end 105z is perpendicular to the track, i.e. to the bottom face, and is situated below the plane; it extends downwards. Thus this allows a reduction in the length of the phase wire of the stator and involves a radial weld. In addition, the end 105z of the phase track 105 is situated on the external circumference of the module, which facilitates the connection with a phase of the stator. In addition, preferentially, the end 105z of the phase track 105 is placed between two electrical conductors 103, 104.

This optimizes the "wire bounding" hard-wired electrical connections between the transistor electronic components and the tracks, in particular their length, and this makes it possible to avoid overlapping of tracks. In addition, preferentially, the end of the phase track 105 is situated in line with a phase output of the stator, which facilitates the welding with the phase.

In addition, preferentially, according to a first variant or this embodiment, the electronic module 10 is a control module 30 that also comprises, as illustrated in FIGS. 2A and 2B:

a third series of signal tongues 106c that are aligned on the external periphery of the triangular housing of the module, the periphery coinciding with the outside diameter of the machine. This series of tongues makes it possible to be connected to a signal connector integrated in a cover, and a second series of signal tongues 106b that are aligned parallel to the third series of signal tongues 106c and offset towards the inside of the module. This second series of tongues conveys complementary signals that have not been able to be integrated in the first series of signal tongues 106a, for example signals SC for a control element of a switch. This enables the two series of signal tongues 106b and 106c to be cropped on a single occasion. It should be noted that the third series of signal tongues 106c is preferentially positioned higher than the second series of signal tongues 106b in order to facilitate the welding of a cover to the control module after having carried out the welding of a signal interconnection piece.

In other words, the second and third series of signal tongues 106b, 106c are aligned on the same face on which the ends of the power connections are disposed:

a housing 112 for stator position sensors.

Figure 2C:
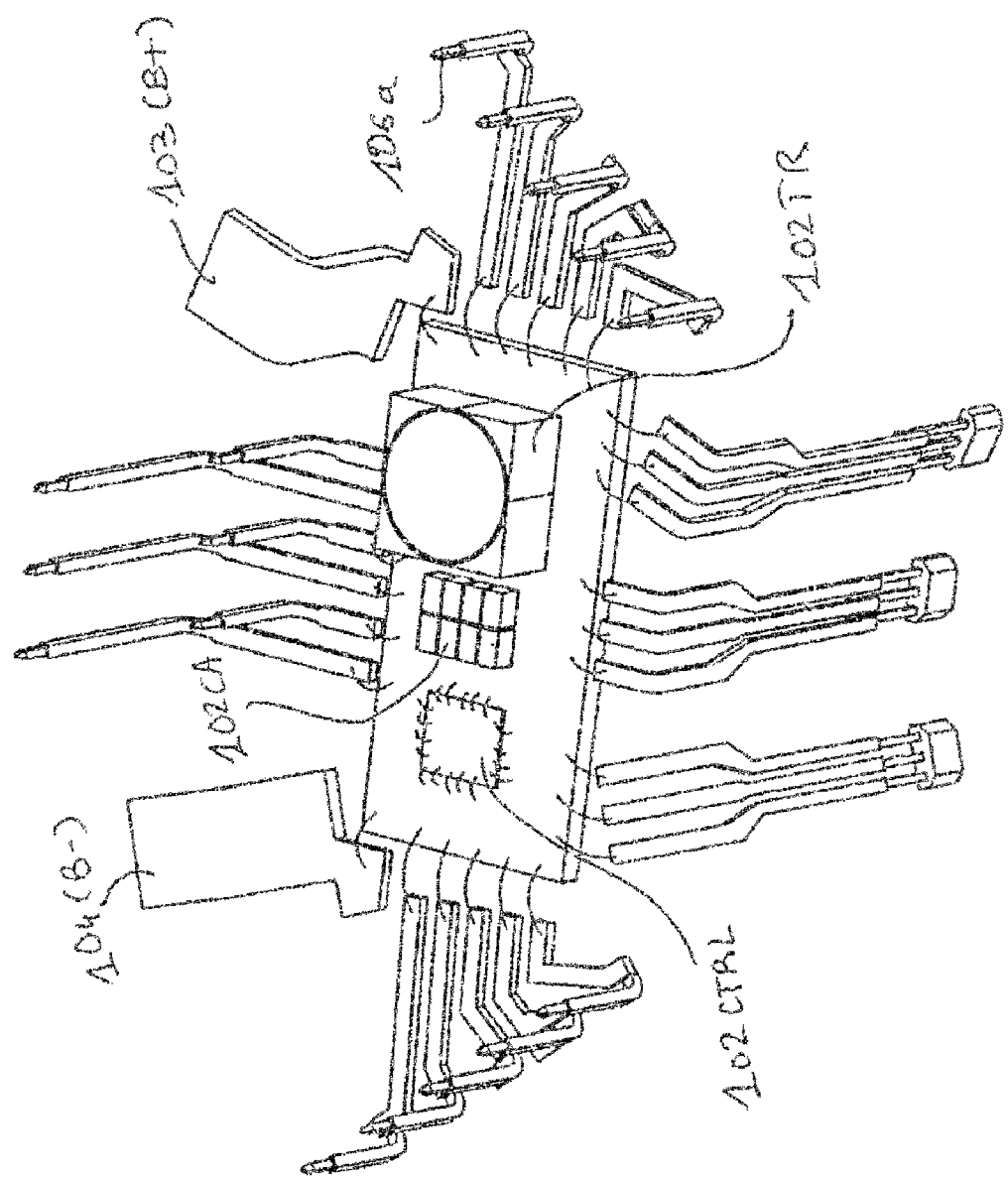
FIG. 2C is the view of FIG. 2A with hard-wired connections of the electronic components of the electronic module.

It should be noted that the interconnections between the transistors and the associated tracks are effected by "wire bounding" hard-wired connections as illustrated in FIG. 2C. In the context of a module with a single transistor per potential, there is one transistor disposed on the electrical conductor 103, which is connected to the phase track 105 and to the ceramic 1110 of the control element 111, while a second transistor is disposed on the phase track 105 and is connected to the negative electrical conductor 104 and also to the ceramic 1110. It should be noted that it would also be possible to have a transistor on the negative electrical conductor 104.

It should be noted that, in this example, there are four transistors, two transistors for the "low side", indicated LS, and "high side", indicated HS, of an arm, that is to say two transistors per potential in order to increase the power of the machine.

Figure 2D:
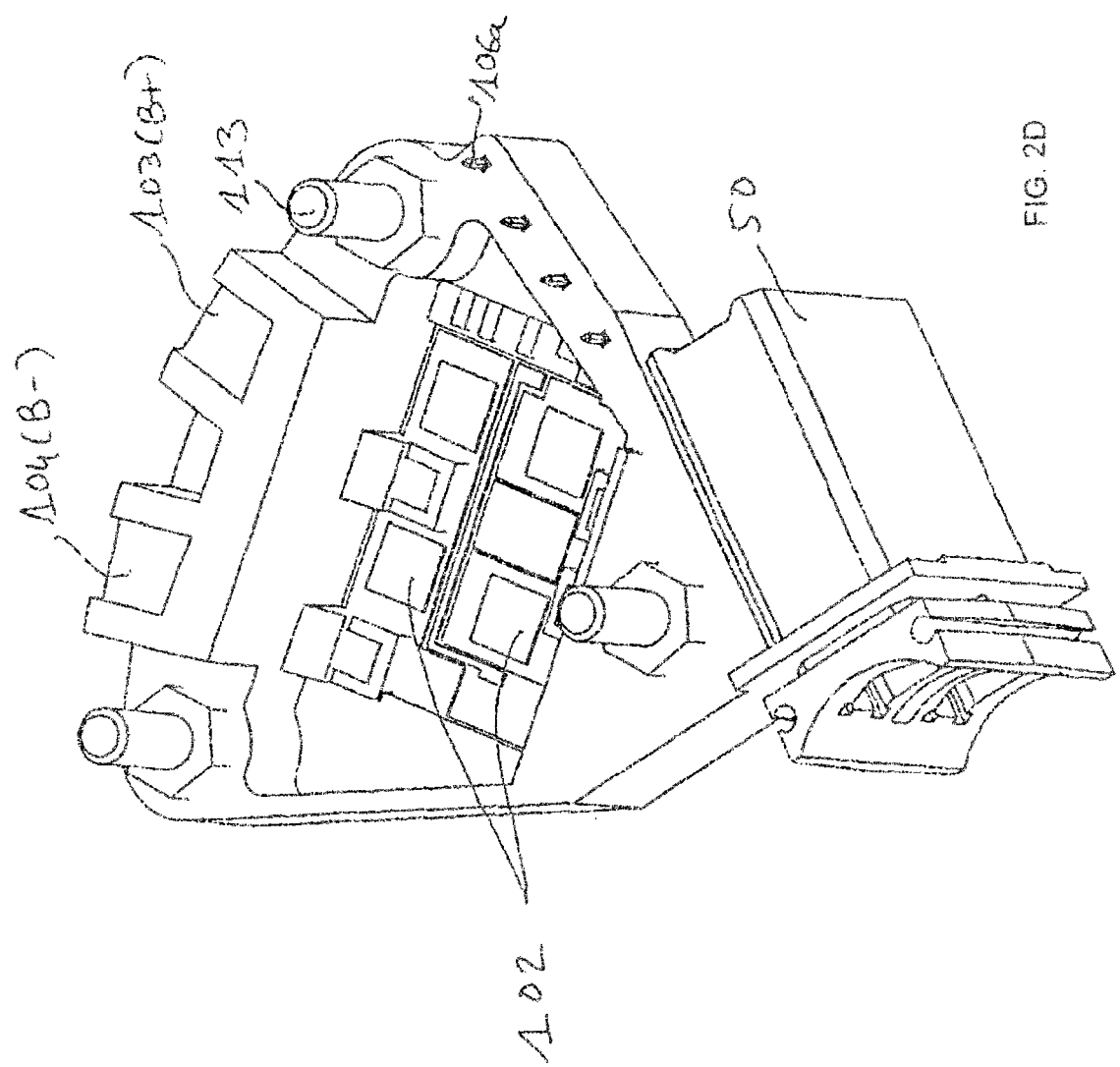
FIG. 2D is a second variant of the first embodiment of FIG. 2A.

In addition, preferentially, according to a second variant of this embodiment, the electronic module 10 is an excitation module 40, as illustrated in FIG. 2D. It comprises electronic components 102, in particular MOS transistors and diodes, which represent the excitation stage of the rotor of the machine.

Thus the electronic modules 10 have, with regard to the arrangement of the electrical conductors 103, 104 and their ends forming electrical conductors inside each module and with regard to the arrangement of the signal connection element 106, a standardized architecture makes it possible to use the modules on different types of electrical machine. This standardization of the architecture makes it possible to replace any electronic module 10 with a module with the same architecture. In addition, this makes it possible to integrate the modules directly on the rear bearing of the machine. In this way the power and control electronics are integrated on the machine directly. The electronics are no longer in an electronic power card in a separate housing.

Thus, according to the architecture of an electronic module 10 described previously, it is possible to have power modules 20 (FIGS. 1A to 1C), a control module 30 (FIGS. 2A to 2C) and an excitation module 40 (FIG. 2D).

Figure 1C:
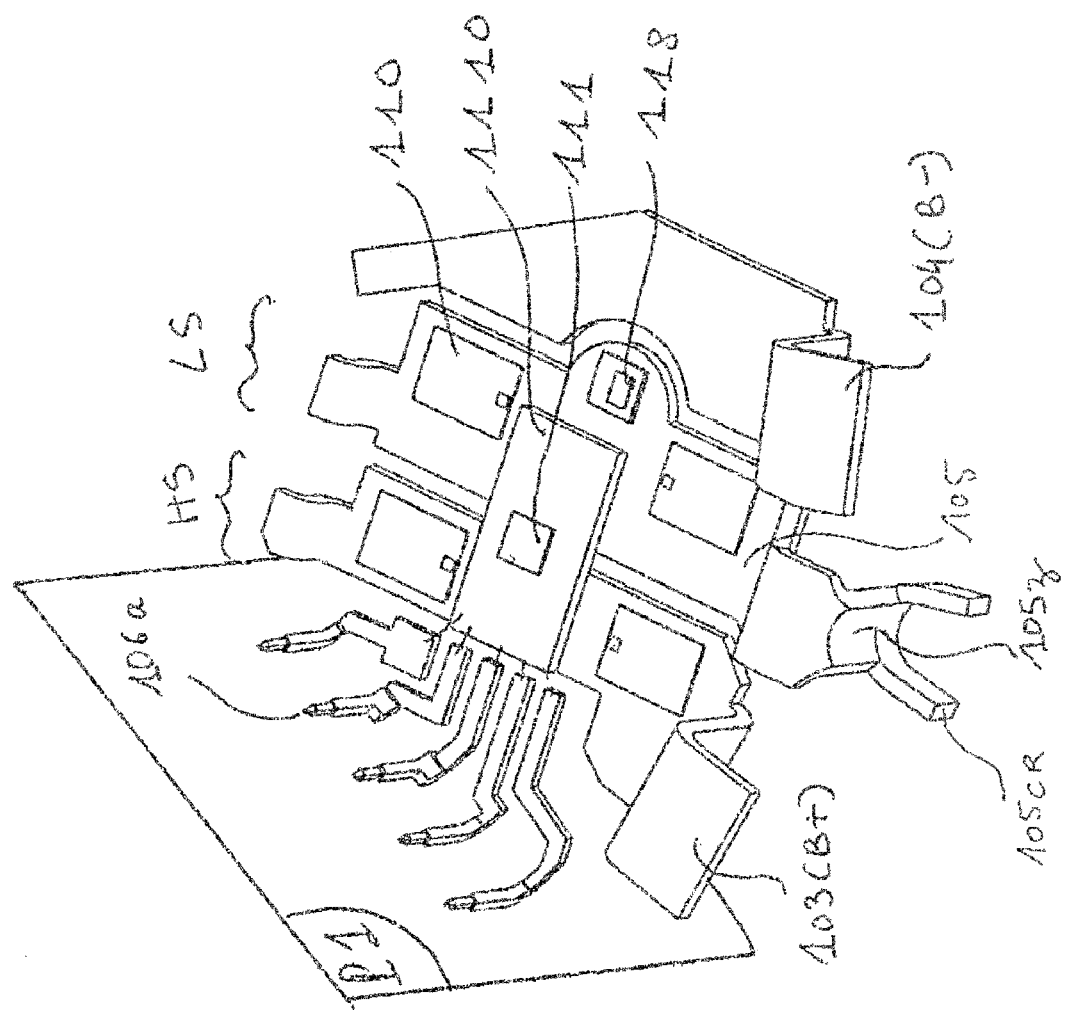
FIG. 1C is a view without overmolding of the module of FIG. 1A.

In the case of the power modules 20, the electronic components 102, illustrated in FIG. 1C, comprise for example:
- a set of electronic switches 110 intended to produce a rectifier bridge/inverter arm for a phase of the machine;
- control elements 111, called drivers, associated with the switches; and
- a temperature sensor 118 (positioned on a ceramic) for the phase track 105.

The electronic switches 110 can for example be MOSFET-technology transistors that are in the form of packaged components, that is to say presented with a can, or, in order to increase the compactness of the arrangement of the modules and to reduce costs, in the form of bare chips, that is to say without a can. The electronic switches (MOSFETs) 110 are controlled by the control elements 111, normally called drivers, on a ceramic 1110 with additional components. Preferentially, the drivers are ASICs. The electronic elements can also be diodes of an arm of a bridge rectifier, since MOSs have a better efficiency than diodes. The number of electronic components depends essentially on the constraints of the particular application (three-phase or hexaphase machine for example), the level of power required by the machine, etc.

For a three-phase machine, there will preferably be three power modules serving to produce an inverter (one module per phase). More generally, the machine is a polyphase machine (x phases), preferably having one module per phase.

Figure 1D:
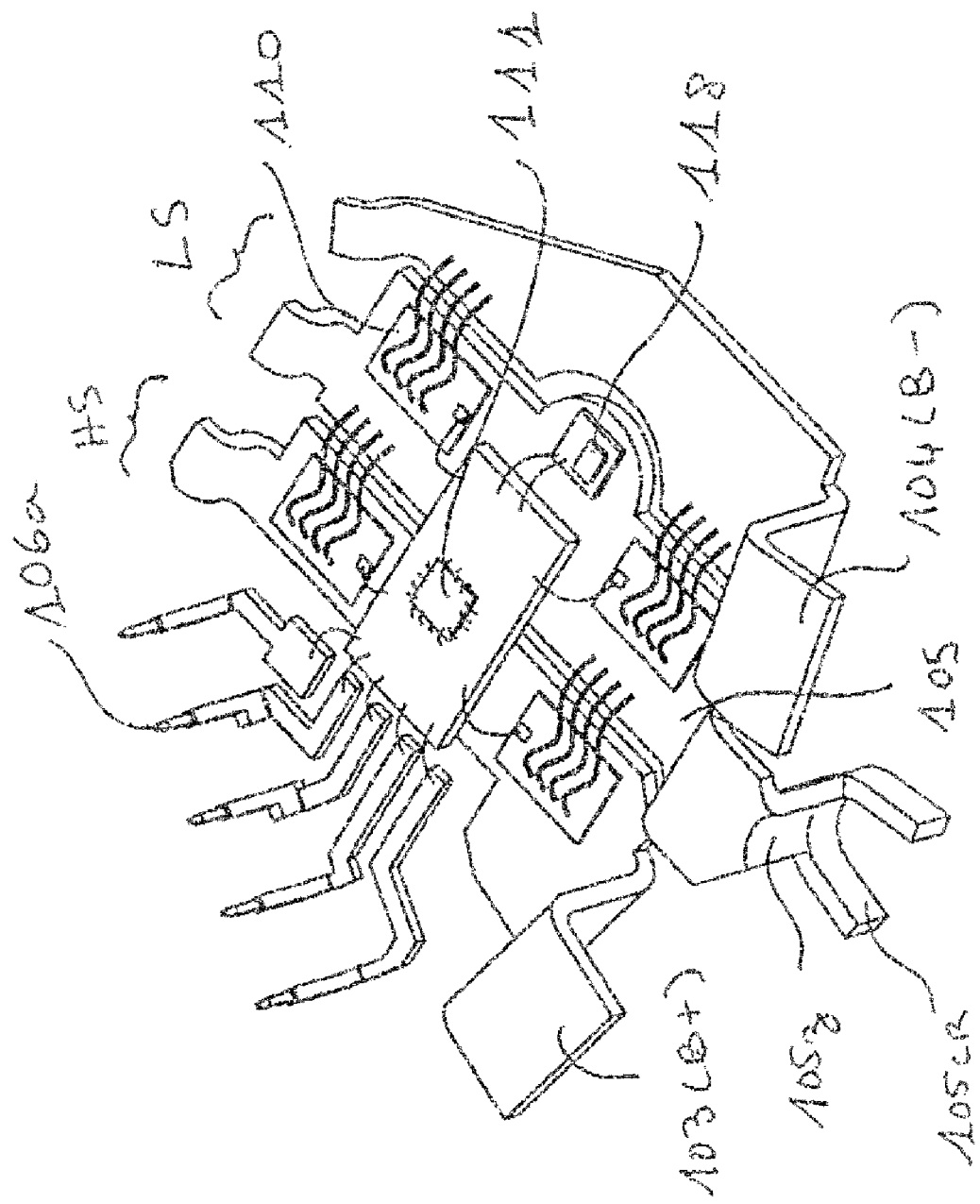
FIG. 1D is the view of FIG. 1C with hard-wired connections of the electronic components of the electronic module.

FIG. 1D illustrates the hard-wired connections, normally referred to as "wire bounding", between the transistors and the electrical conductor 104 and the phase track 105. It should be noted that, in this example, there exist four MOS transistors, so as to increase the power of the machine. Naturally there may be only two of them. It should be noted that the ceramic 1110 also serves as a support for electronic components but also as interconnection between the transistors and the control element 111.

The control module 30 makes it possible to control the machine and in particular the adjustment of the excitation current by controlling the drivers of the MOS transistors. It also has, as illustrated in FIG. 2A, an electronic control component 102CTRL, capacitors 102CA and a transformer 102TR for supplying the control element 111 of the power modules. Control signals will thus be sent from the control component 102CTRL to the control element 111 of the power modules.

The excitation module 40 makes it possible to supply the coil of the rotor of the machine, the module comprising in a conventional manner MOS transistors and diodes for determining the current in the rotor.

Thus the control module 30 and the excitation module 40 repeat the architecture of the electronic module 10 and in particular the arrangement of the ends of the electrical conductors 103, 104 and the signal connection element 106.

According to a variant embodiment, the control module 30 and the excitation module 40 can be replaced by a common excitation and control module.

All the modules 20, 30 and 40 are mounted on a rear bearing of the rotary electrical machine.

Figure 3A:
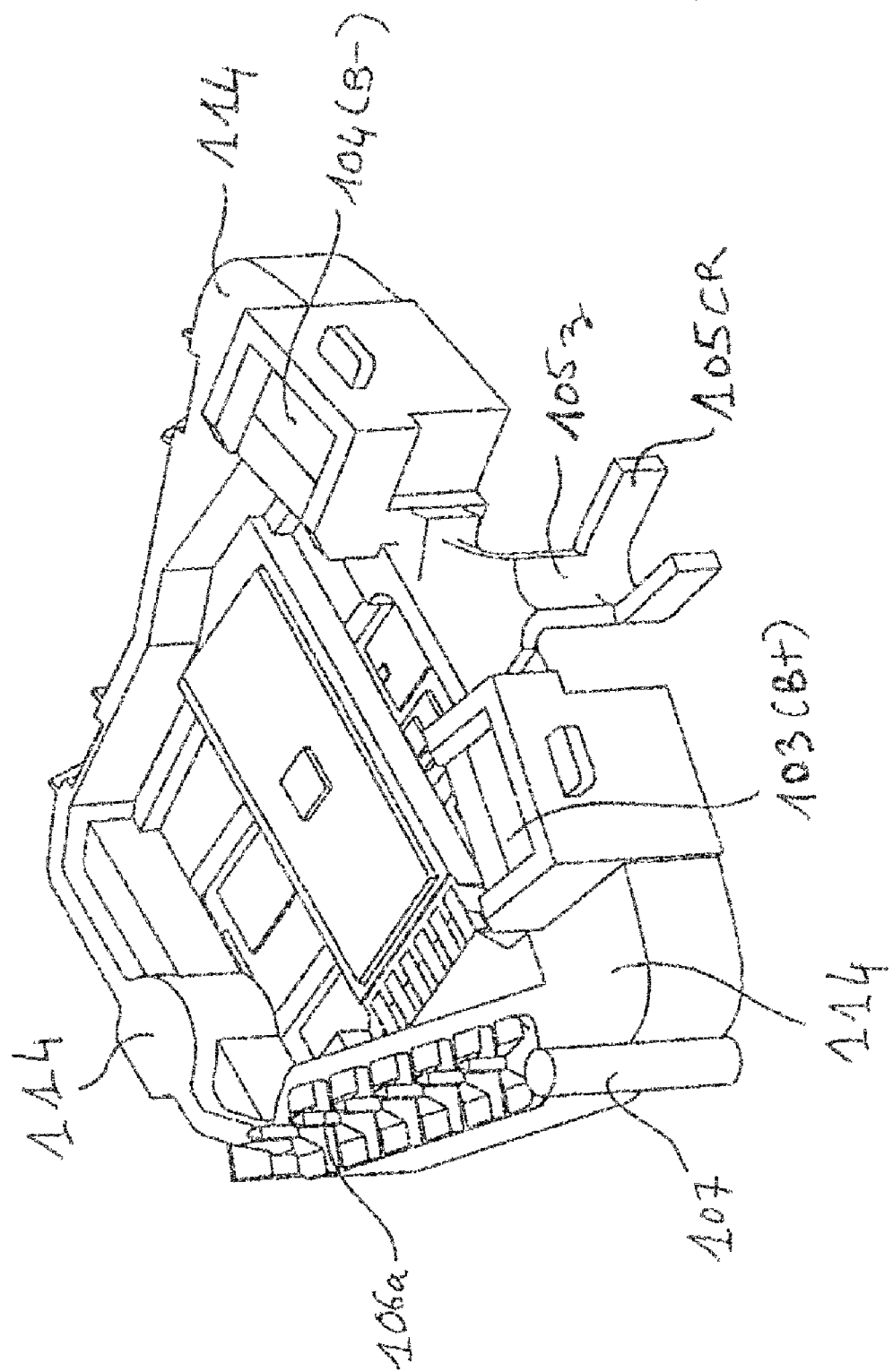
FIG. 3A shows a second embodiment of an electronic module according to the invention.

In a second non-limitative embodiment, illustrated in FIG. 3A, the electronic module 10 differs from the first embodiment in that:
- in place of the fixing means 108, it has support zones 114 for receiving stays belonging to a signal interconnection piece, as will be described below, which makes it possible to omit the fixing studs 113 so that the cost of the parts and assembly are reduced, and this makes it possible to obtain a simpler assembly.

Figure 3B:
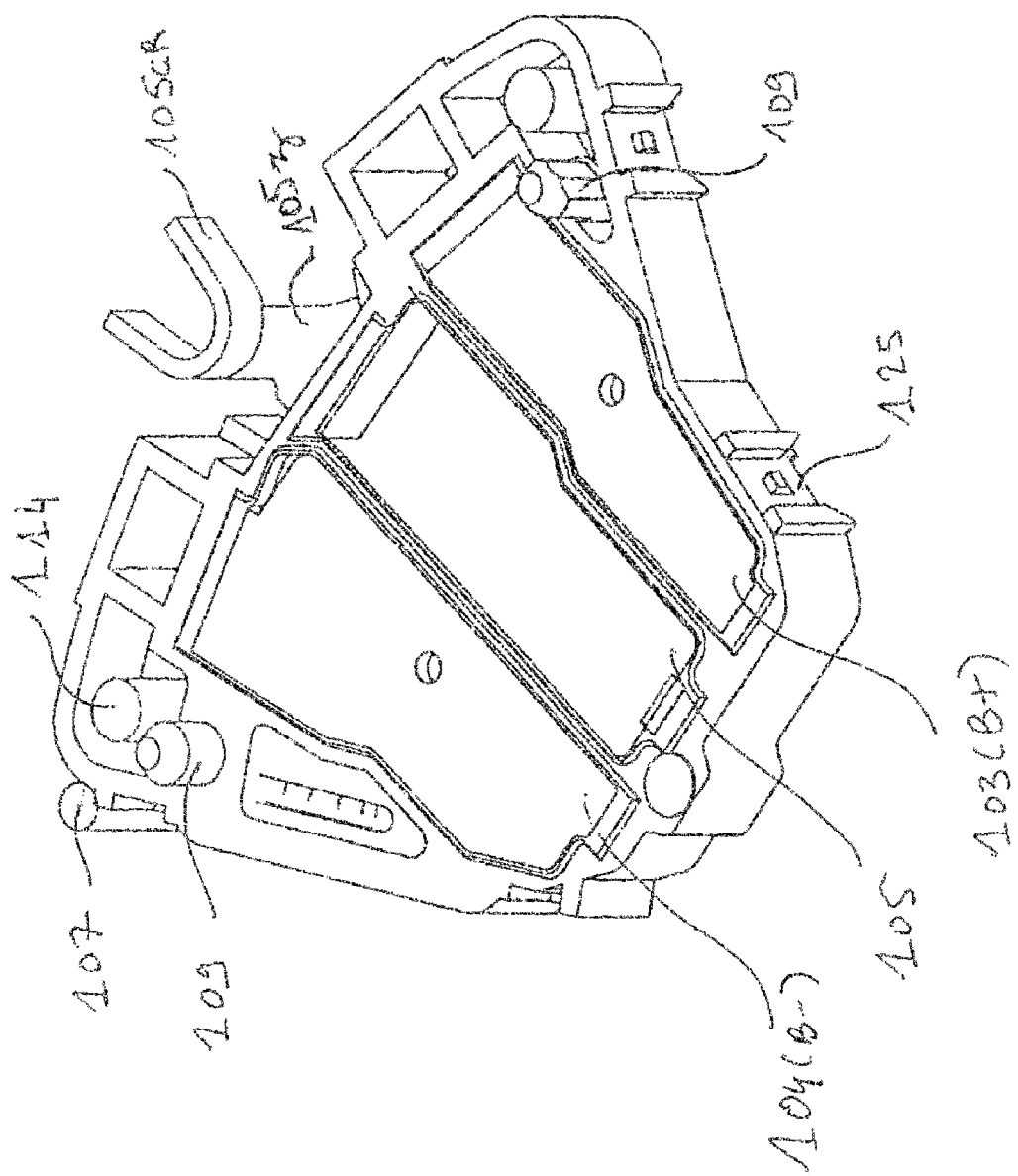
FIG. 3B is a view from below of the module of FIG. 3A.
Figure 3C:
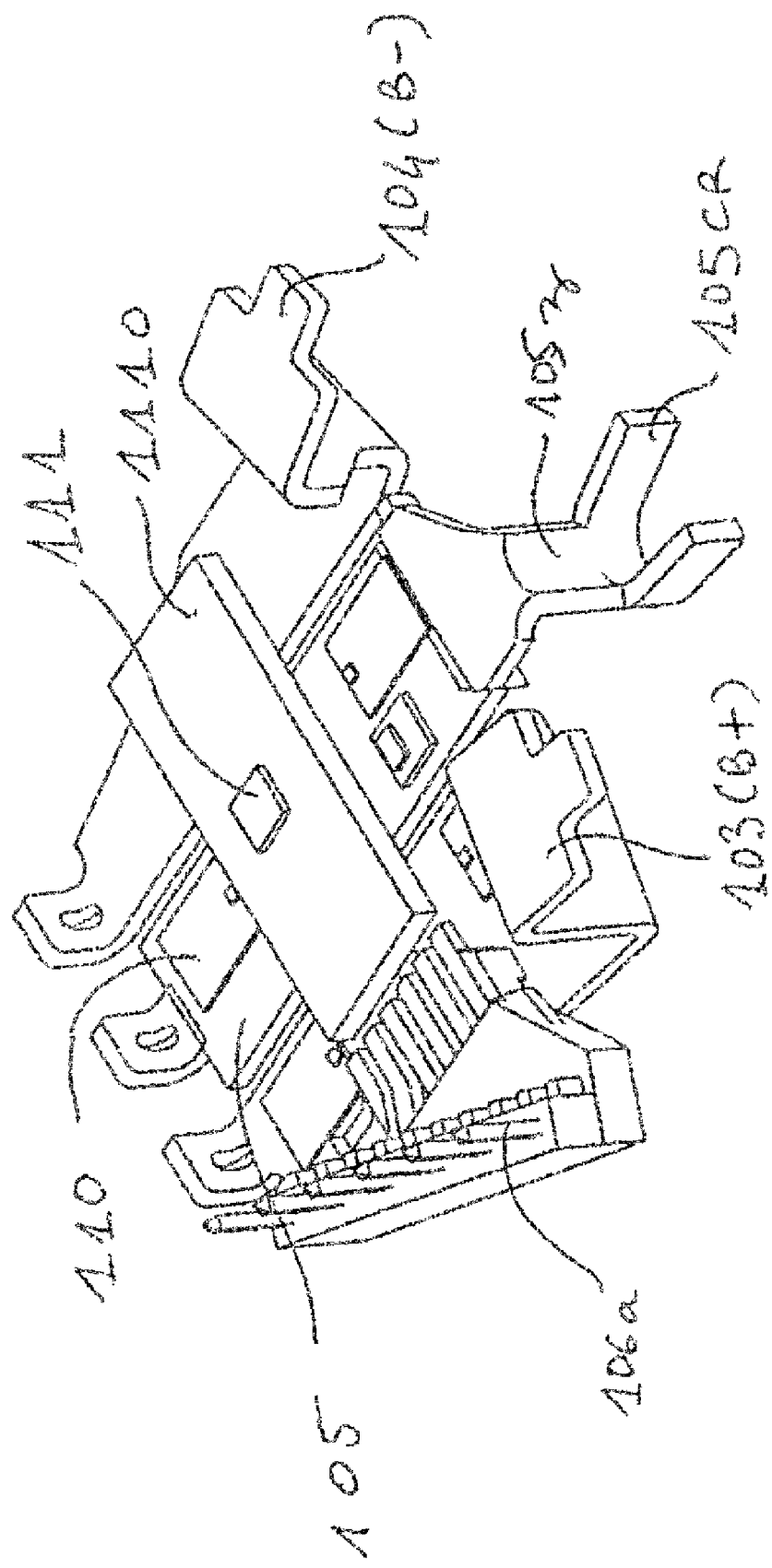
FIG. 3C is a view without overmolding of the module of FIG. 3A.

The electronic module 10 can be seen in view from below in FIG. 3B and in a view without overmolding in FIG. 3C for a power module. It should simply be noted in FIG. 3B that the module preferably comprises a fixing clip 125 for a plastic cover for a module in order to protect the protective gel for the components. This fixing clip can be replaced by a bonding of the cover or ultrasonic welding for example.

Figure 3D:
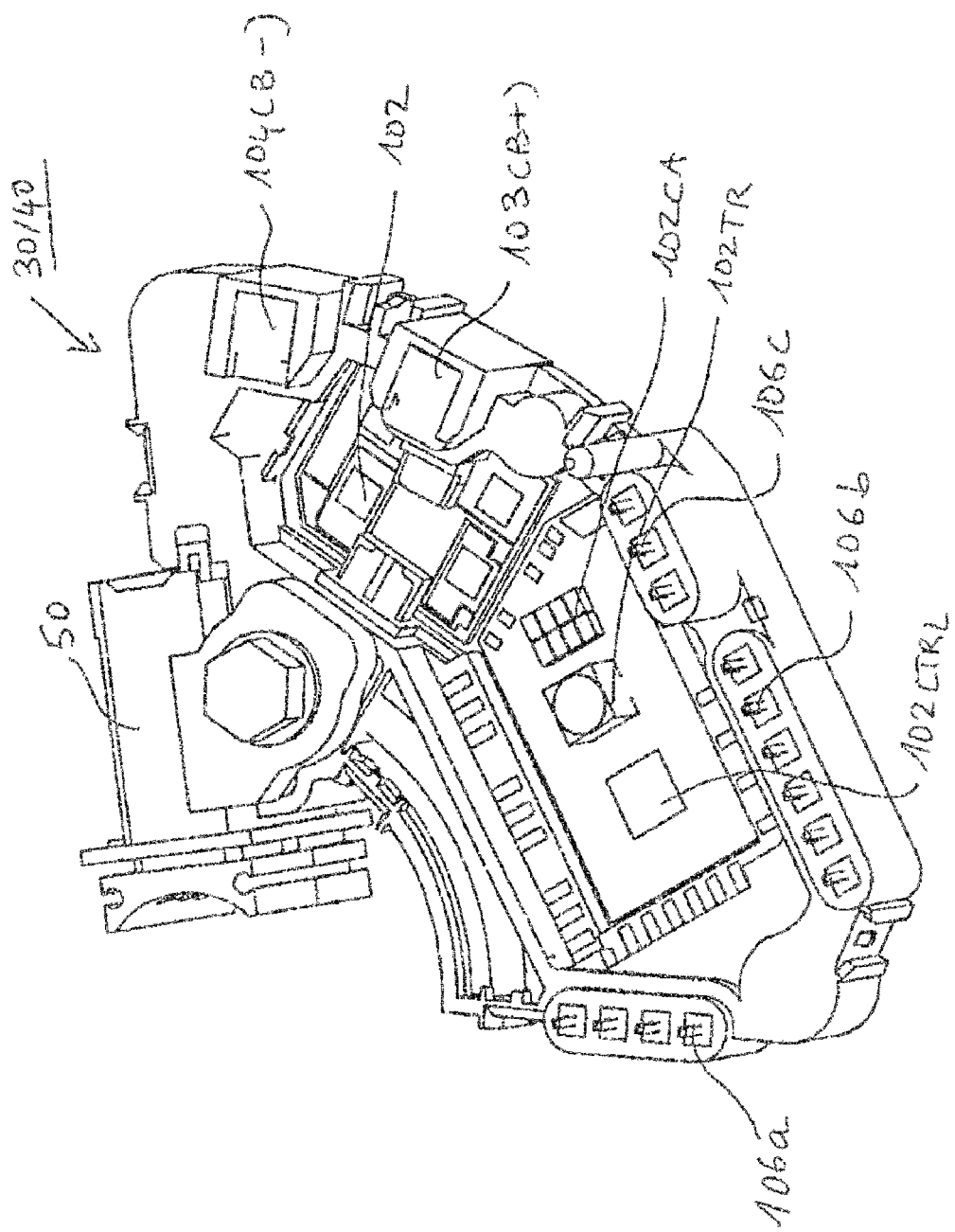
FIG. 3D is a variant of the second embodiment of FIG. 3A.

FIG. 3D presents a variant embodiment for a control/excitation module 30/40. It should be noted that having a single module for the control and excitation function makes it possible to save in terms of size.

Figure 3E:
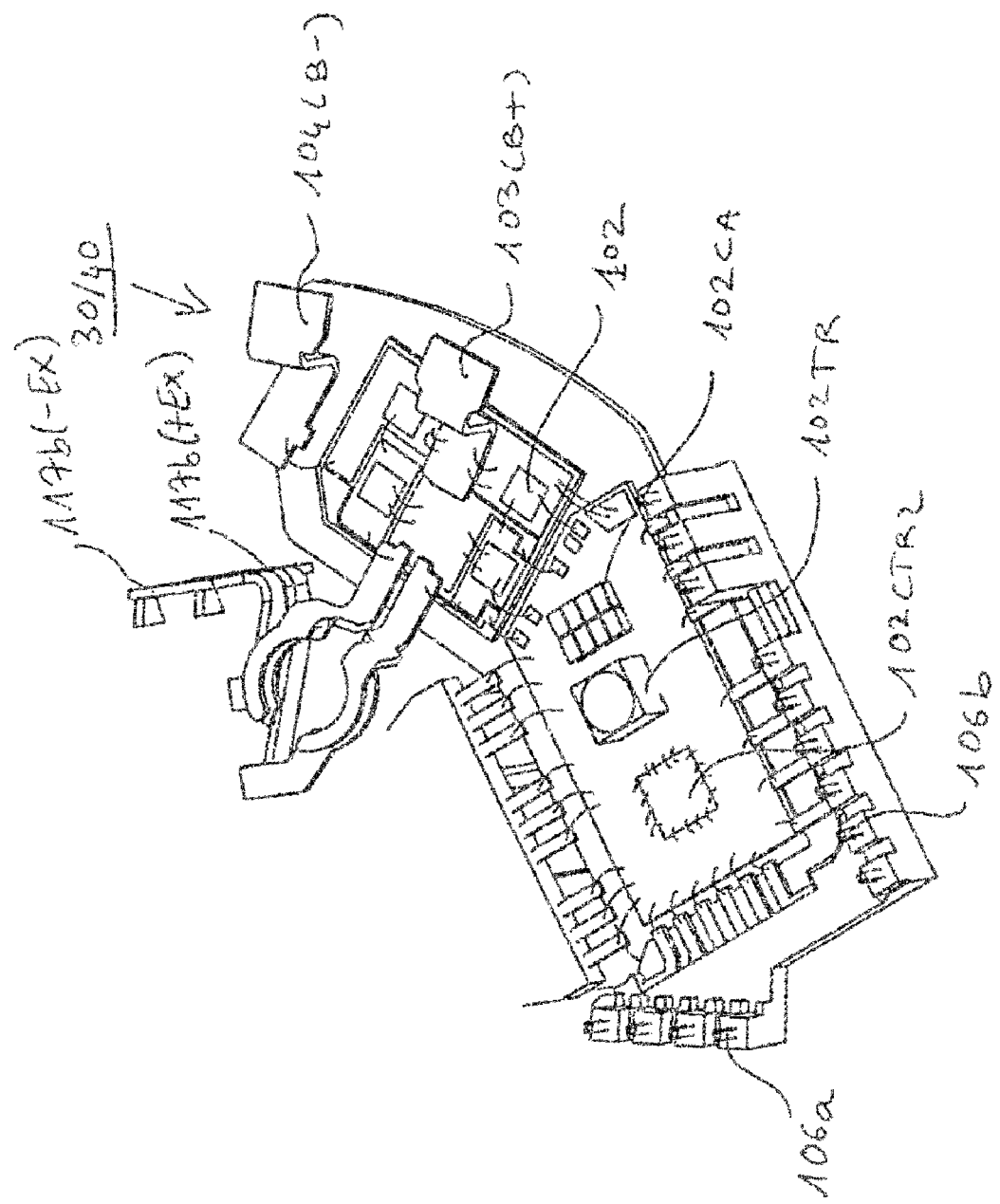
FIG. 3E is the view of FIG. 3D with hard-wired connections of the electronic components of the electronic module.

FIG. 3E presents the "wire bounding" hard-wired connections of this variant. It should be noted that there exists an interconnection between the control ceramic and the excitation ceramic (substrate) produced by a "wire bounding" hard-wired connection to allow transmission of signals between the excitation part and the control part.

In the first two embodiments described, preferentially, the ends of the electrical conductors 103, 104 are flat and flush on the bottom face of the module. Thus this configuration has the advantage of being able to weld tracks of a power plate (described in detail below) on the ends of tracks of a module by transparency (flat on flat).

Figure 4A:
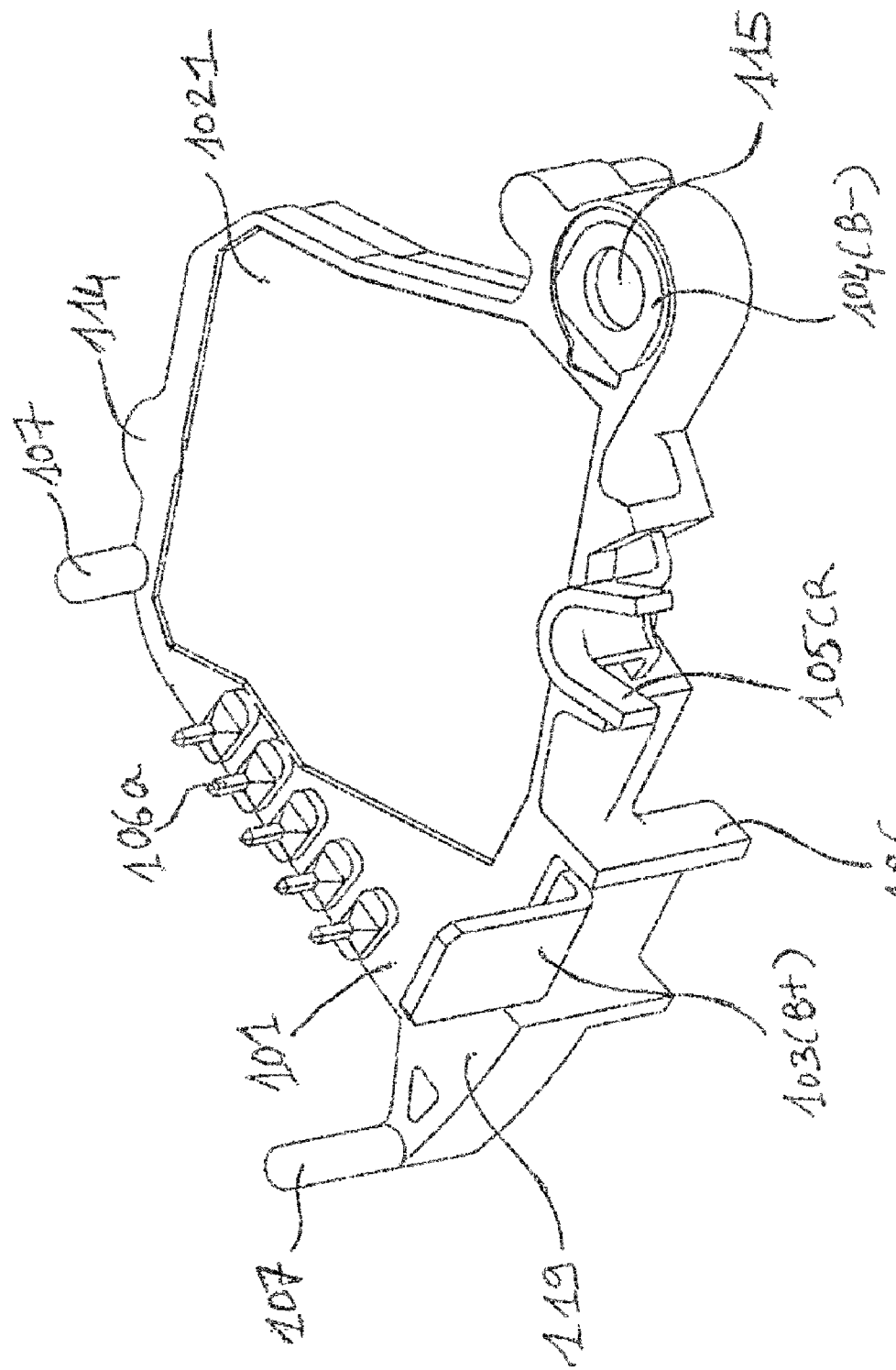
FIG. 4A is a third embodiment of the electronic module according to the invention.

In a third non-limitative embodiment, illustrated in FIG. 4A the electronic module 10 is configured so as to be fixed to a dissipator, itself fixed to the rear bearing of the machine.

Figure 4B:
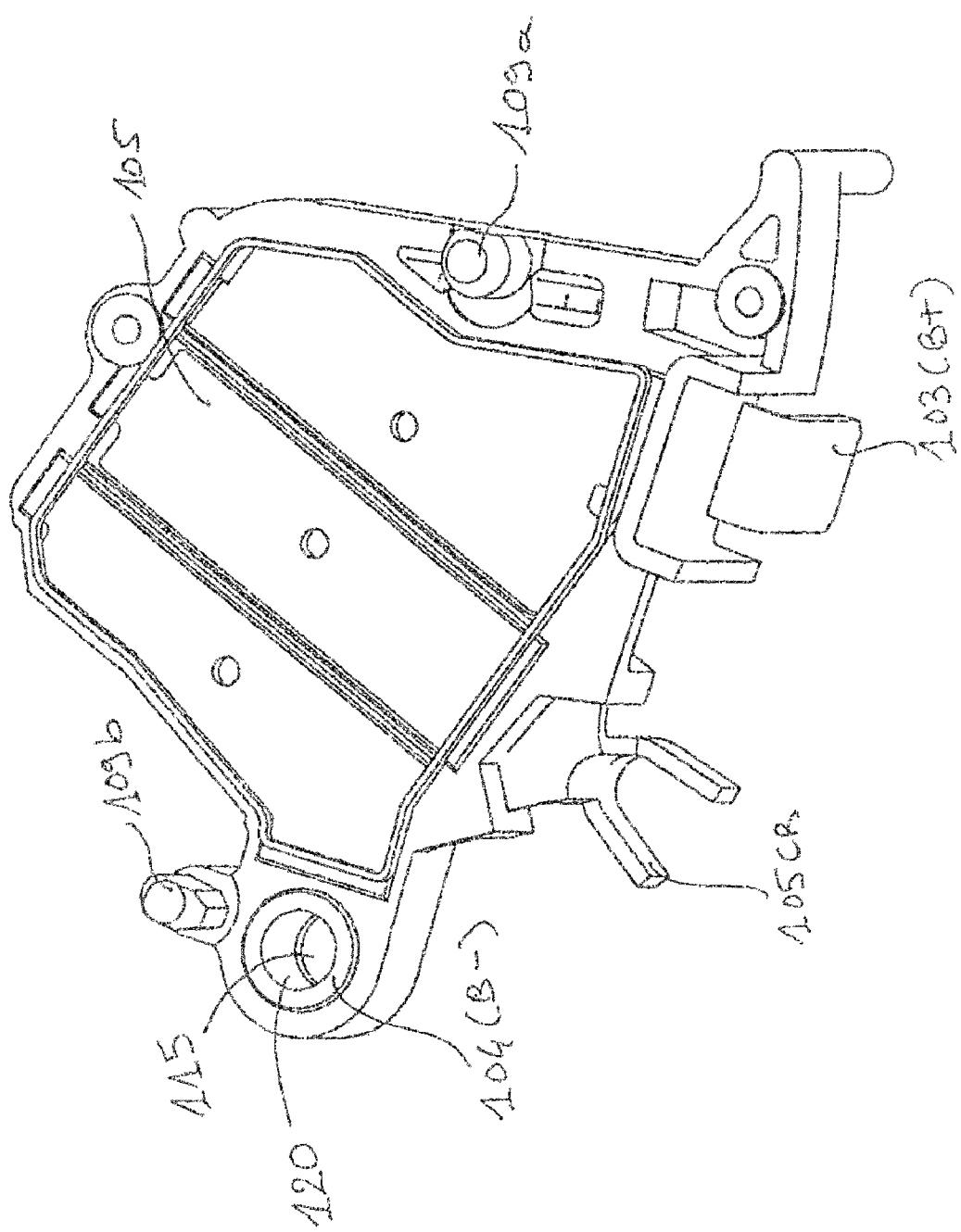
FIG. 4B is a view from below of the module of FIG. 4A.

It differs from the second embodiment in that:
- the end 105z of the phase track 105 is perpendicular to the bottom face of the module and projects beyond the housing 101 of the module and its plastic cover, and extends upwards. Thus this allows axial welding and thus prevents being interfered with by the lugs fixing the alternator starter on the engine, whatever the engine of a manufacturer; and this facilitates access to the welding tool;
- the end of the electrical conductor 103 (B+) is a folded tongue allowing radial laser welding with a power plate or axial electric welding by electrodes; it extends axially upwards with respect to the housing 101 of the module and projects beyond the housing in order to engage the electrodes, i.e. it is perpendicular to the bottom face of the module; the tongue projects beyond the dissipator. This makes it possible to connect a power interconnection piece 21 with the module from below;
- the end of the negative electrical conductor 104 (B−) is no longer a tongue but a hollow cylindrical metal insert allowing electrical connection to a dissipator 80 via the track B–and a screw 1150 corresponding to the orifice 115, the screw making it possible to compress the track on the insert and thus to compress the track plus insert on the dissipator so as to effect the earthing of the module, the dissipator being earthed as will be described in detail below;

the positioning pins or recesses 109 situated on the bottom face are positioned differently. A first positioning bin 109a is positioned as close as possible to the signal connection elements 106, and preferentially centered on the middle one, in order to reduce the positioning tolerance of the tongues with respect to any clearance that may exist between the second positioning pin 109b and the corresponding orifice 609b (described in more detail below) of the dissipator bearing. In this way the positioning errors of the tongues with respect to the dissipator are reduced. As illustrated in FIG. 4B, this first positioning pin 109a is situated at the middle of the two signal tongues 106a. It should be noted that the first positioning pin 109a serves to position the module along the axis X-Y, and the second positioning pin 109b serves to orient the module in terms of rotation and is the furthest away from the signal tongues 106a; and one of the protective pins or guides 107 is placed more towards the outside of the module so that there exists a kind of support 119 to make it possible to receive a stay of a signal plate. The pins or guides 107 prevent the signal connection elements 106 bending between the time of the manufacture of the module and its assembly on the machine, and serve as preliminary guidance for a signal interconnection piece (described below).

In addition, the electronic module 10 according to this third embodiment also comprises:

an insert 120 comprising a fixing orifice 115, the insert allowing earthing of the module, and the orifice being intended to fix the module to a dissipator by means of screws 1150 for example; and means 126 of electrical protection of the end of the electrical conductor 103 (B+) that prevent a short-circuit between the potentials B+(power track of the power interconnection piece) and B–(dissipator mass).

Figure 4C:
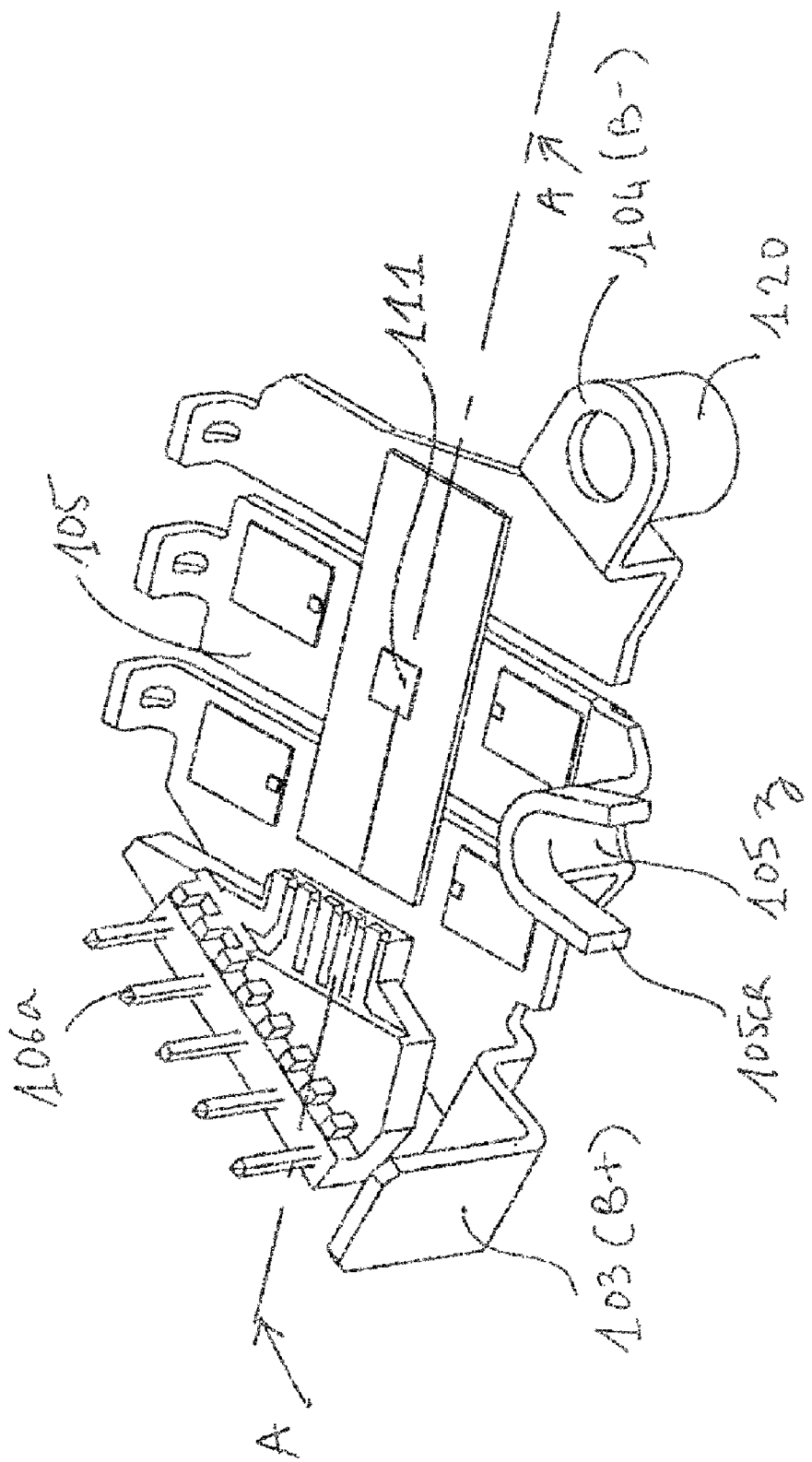
FIG. 4C is a view without overmolding of the module of FIG. 4A.

A view without overmolding of a power module 20 according to this third embodiment is shown in FIG. 4C.

Figure 4D:
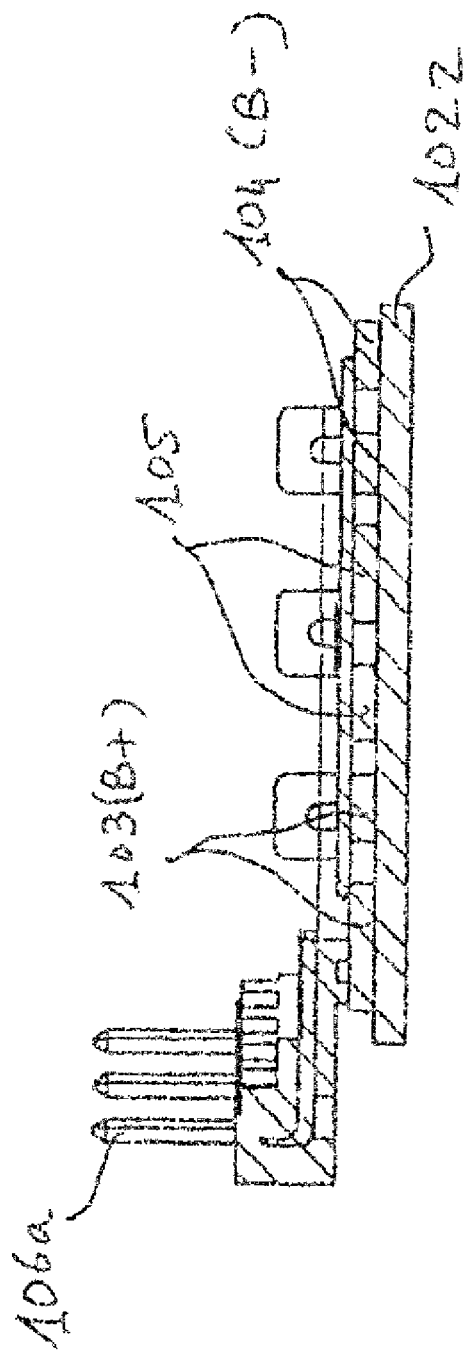
FIG. 4D is a view in section without overmolding of the module of FIG. 4A including a support plate.
Figure 4E:
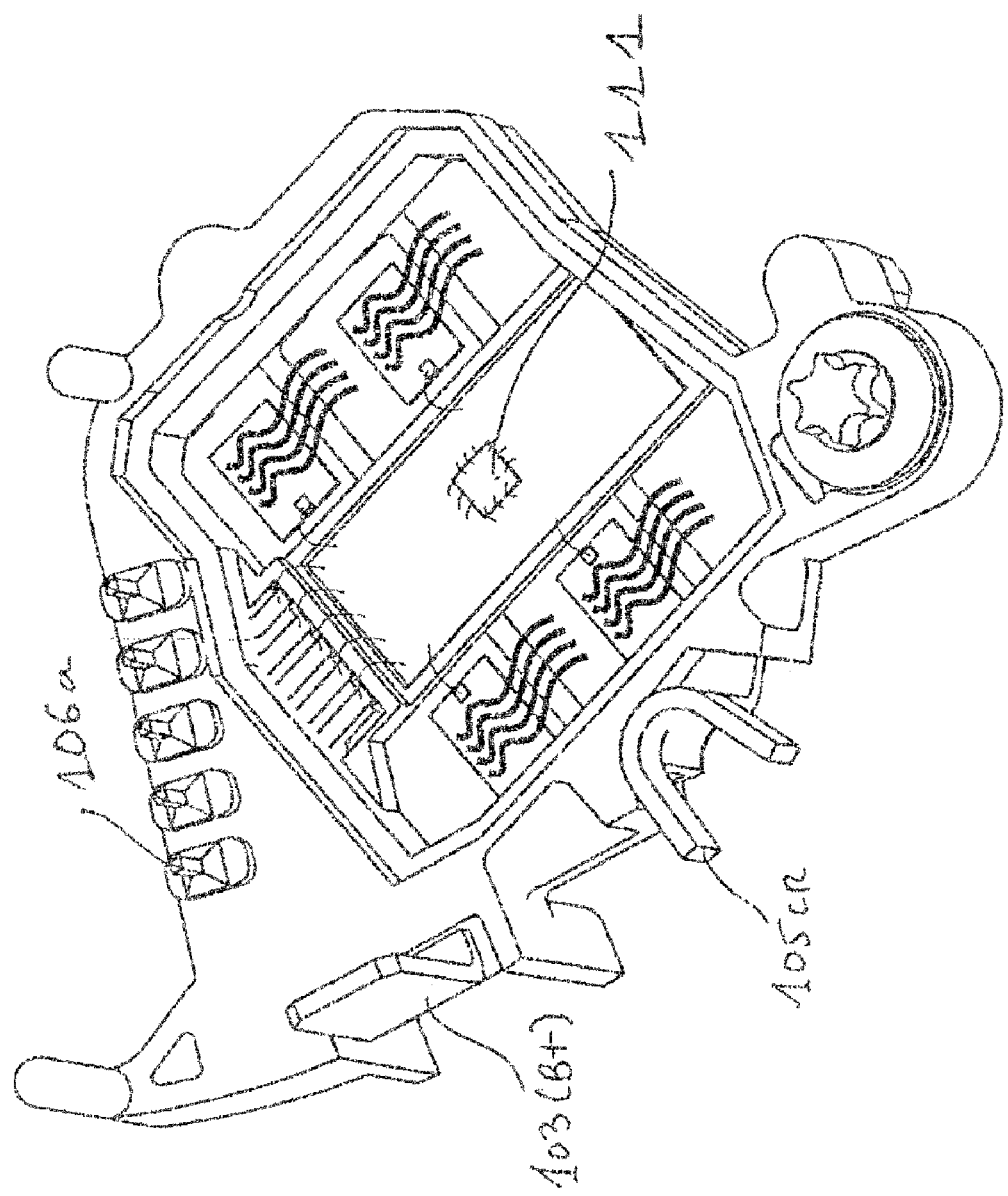
FIG. 4E is the view of FIG. 4C with hard-wired connections of the electronic components of the electronic module.

A view with the "wire bounding" hard-wired connections is shown in FIG. 4E.

Preferentially, each power module 20 comprises a plate 1022 of low resistance and low thermal conductivity, preferentially made from aluminum (the same resistance as the dissipator) or copper.

Thus there are:

the electronic components 102 welded to the metal tracks;

the metal tracks, which are visible on the bottom face of the housing of the module, are bonded to the plate 1022 by an electrically insulating and thermally conductive adhesive, for example a glass-ball adhesive, the adhesive electrically insulating the tracks from each other and the tracks with respect to the outside; and the plate 1022, which is placed on the dissipator.

The plate 1022 is illustrated in FIG. 4D (representation in cross-section along an axis A-A in FIG. 4C). It should be noted that this plate can be used in the same way on the other control or excitation modules in the context of visible tracks.

The plate thus makes it possible to test the electrical insulation of each module independently before assembly on the dissipator or dissipator bearing. Thus, if there exists a problem of short-circuit due to faulty application of the insulating adhesive, this plate 1022 avoids the scrapping of all the modules mounted on the dissipator. Only the module posing a problem will be disposed of before it is assembled on the dissipator.

Figure 5A:
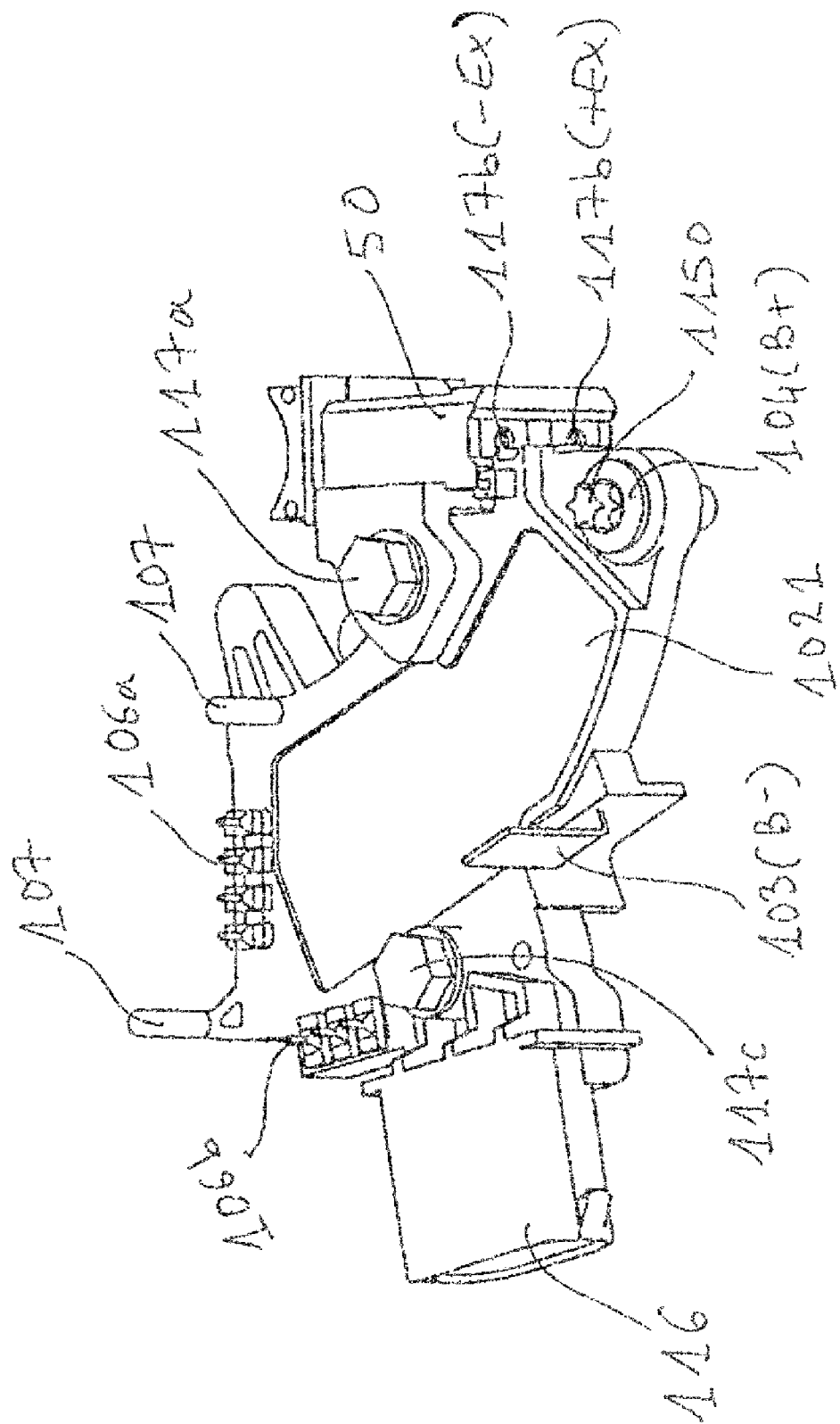
FIG. 5A is a variant of the third embodiment of FIG. 4A.

According to a variant of this third embodiment, the electronic module 10 comprises, as illustrated in FIG. 5A:

a signal connector 116;

a screw 117a affording electrical contact between two tracks 117b (+EX, –EX) of a brush holder 50 and the electronic module 10; and a screw 117c for mechanical holding on the dissipator and making it possible to withstand the mechanical forces of the signal connector 116.

More particularly it is the control module 30 or the control/excitation module that comprises the signal connector 116 and the screw 117a. It should be noted that the brush holder is here in a single piece with the control module 30. Indeed it is molded on with the module.

The presence of the signal connector 116 has the advantage of:

eliminating welds making it possible to effect electrical connections between the cover and the modules, compared with the first embodiment;

avoiding problems of welding and impermeability; and saving time in the manufacturing process.

There therefore no longer exist any external signal tongues 106c as in the first or second embodiments, which makes it possible to reduce the material of the tracks (those in the cover) as will be seen subsequently.

Figure 5B:
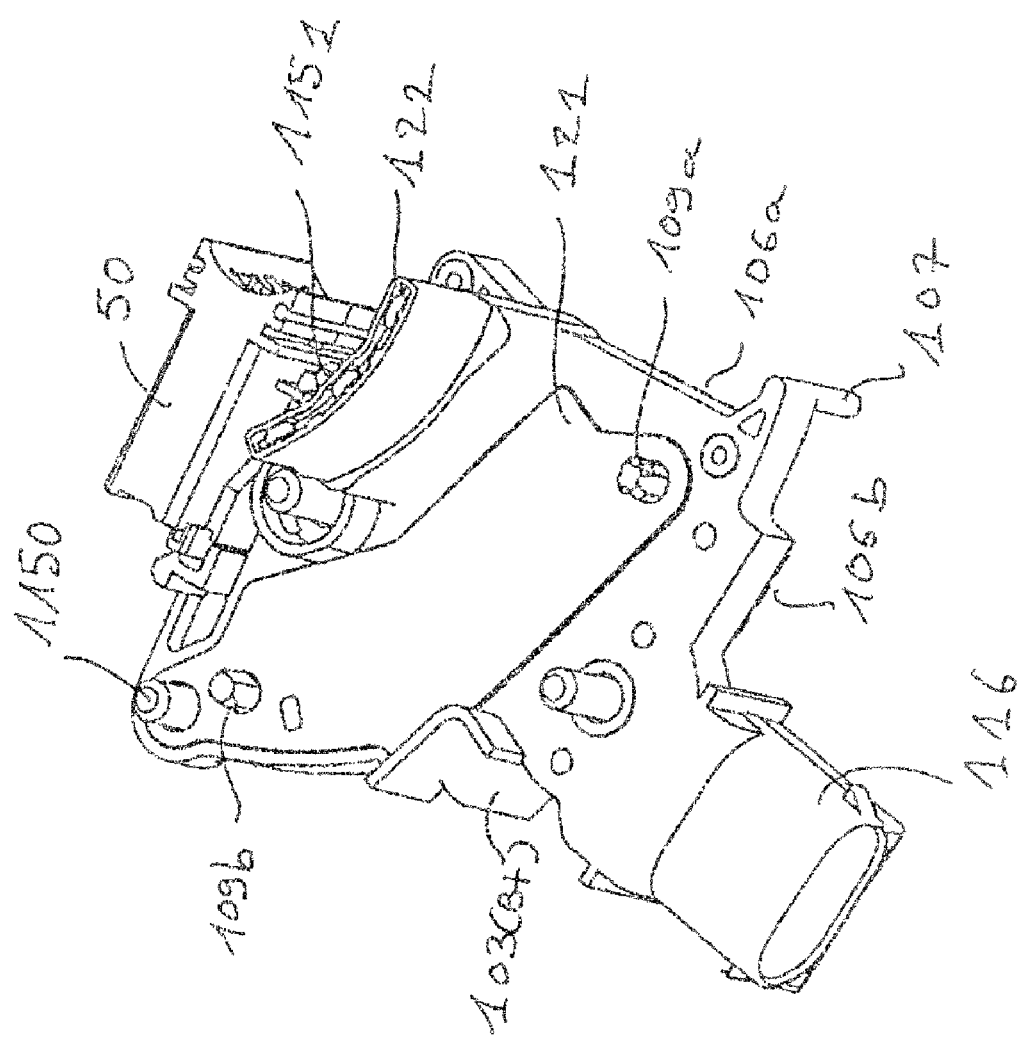
FIG. 5B is a view from below of the module of FIG. 5A.

FIG. 5B is a view from below of the control module 30 according to this third embodiment.

As can be seen, the first positioning pin 109a is as close as possible to the two series of signal tongues 106a and 106b in order to limit any errors in positioning of the tongues with respect to the dissipator.

In addition there can also be seen:

a metal plate 121 fixed by the screw 1150, the plate preferentially being made from aluminum and thus being connected to the dissipator mass via the screw 1150, the plate comprising substrates 123 of the ceramic type, on which electronic components are integrated; and position sensors 122 for giving the position of the stator of the electrical machine.

Figure 5C:
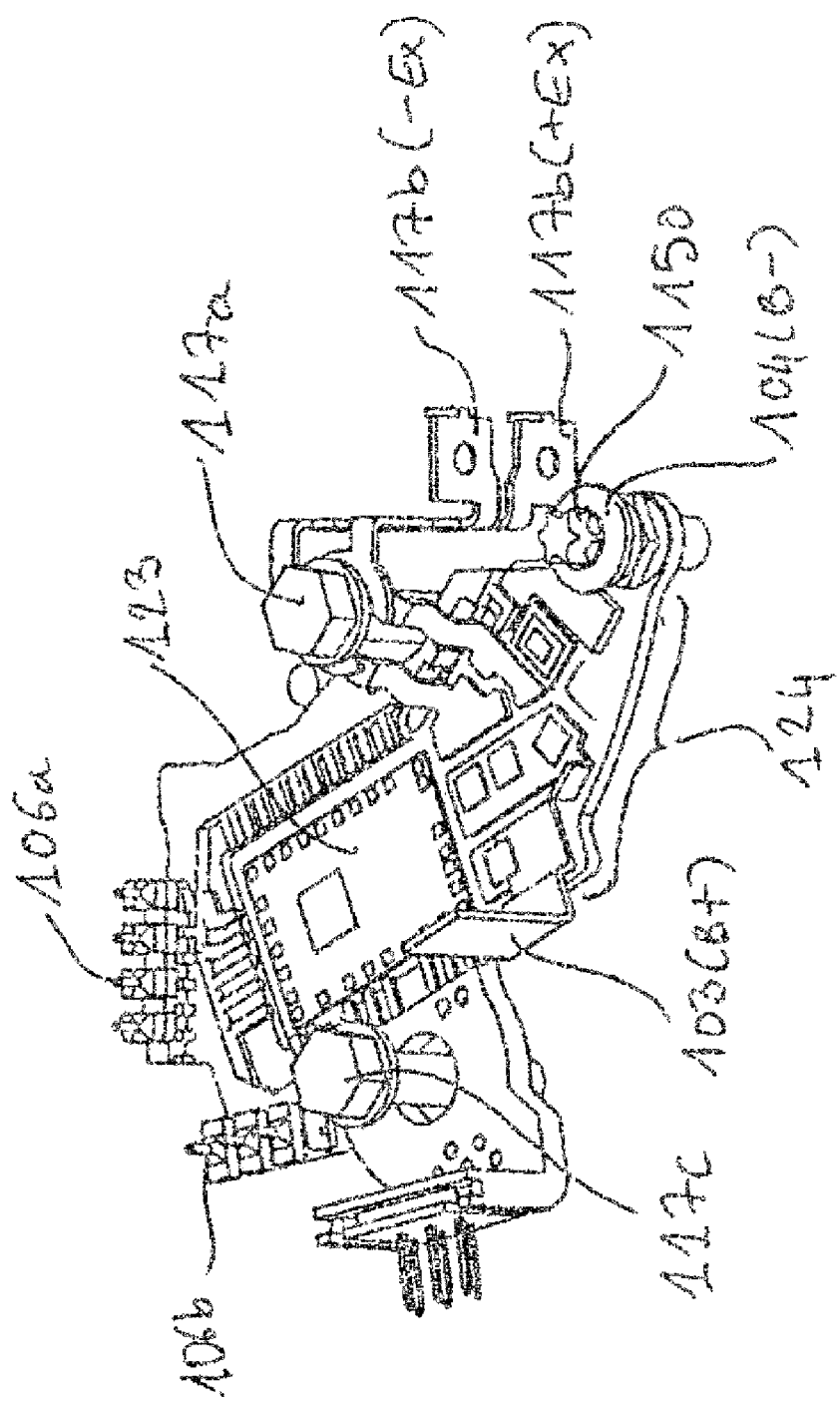
FIG. 5C is a first view from above without overmolding of the module of FIG. 5C.
Figure 5D:
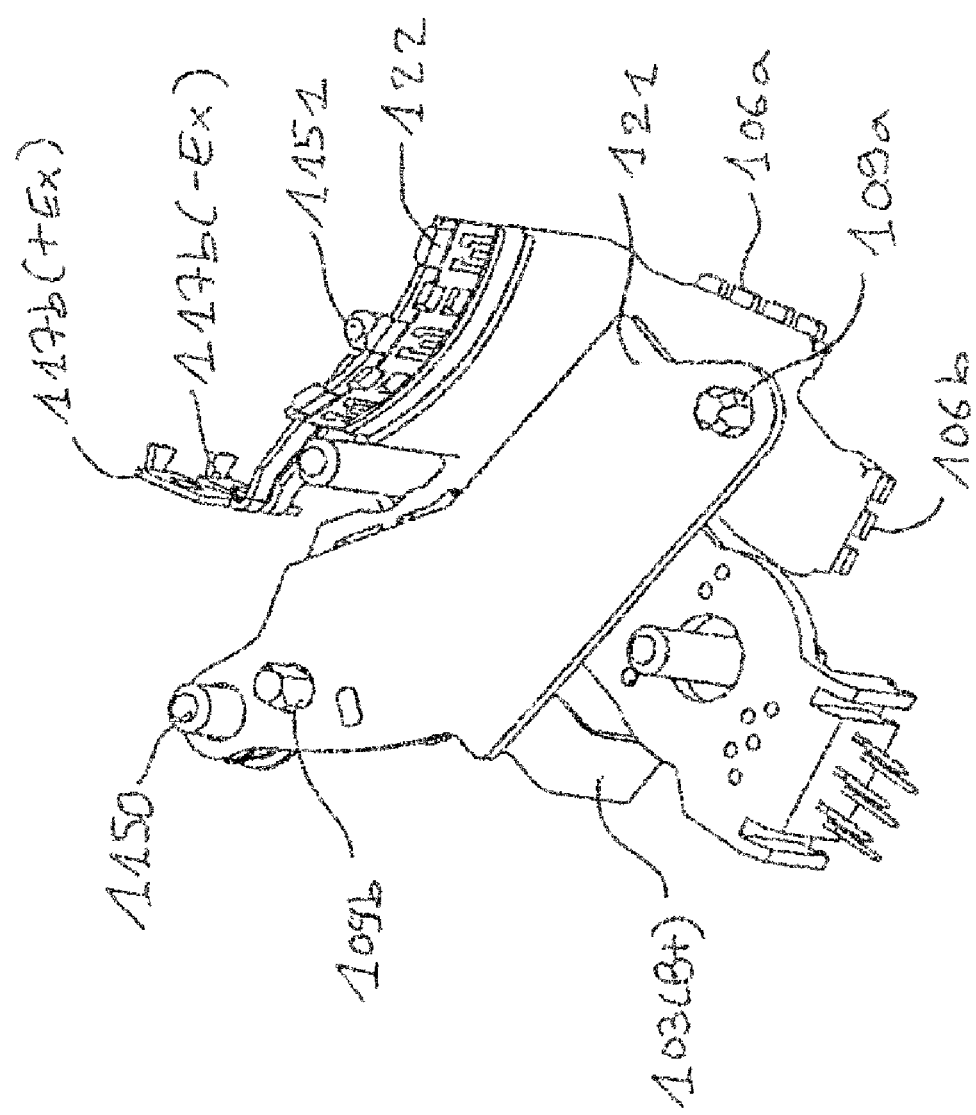
FIG. 5D is a second view from below without overmolding of the module of FIG. 5A.

FIG. 5C is a view from above of the control/excitation module without overmolding, without the signal connector 116 and without the brush holder 50. FIG. 5D shows the view from below.

Figure 5E:
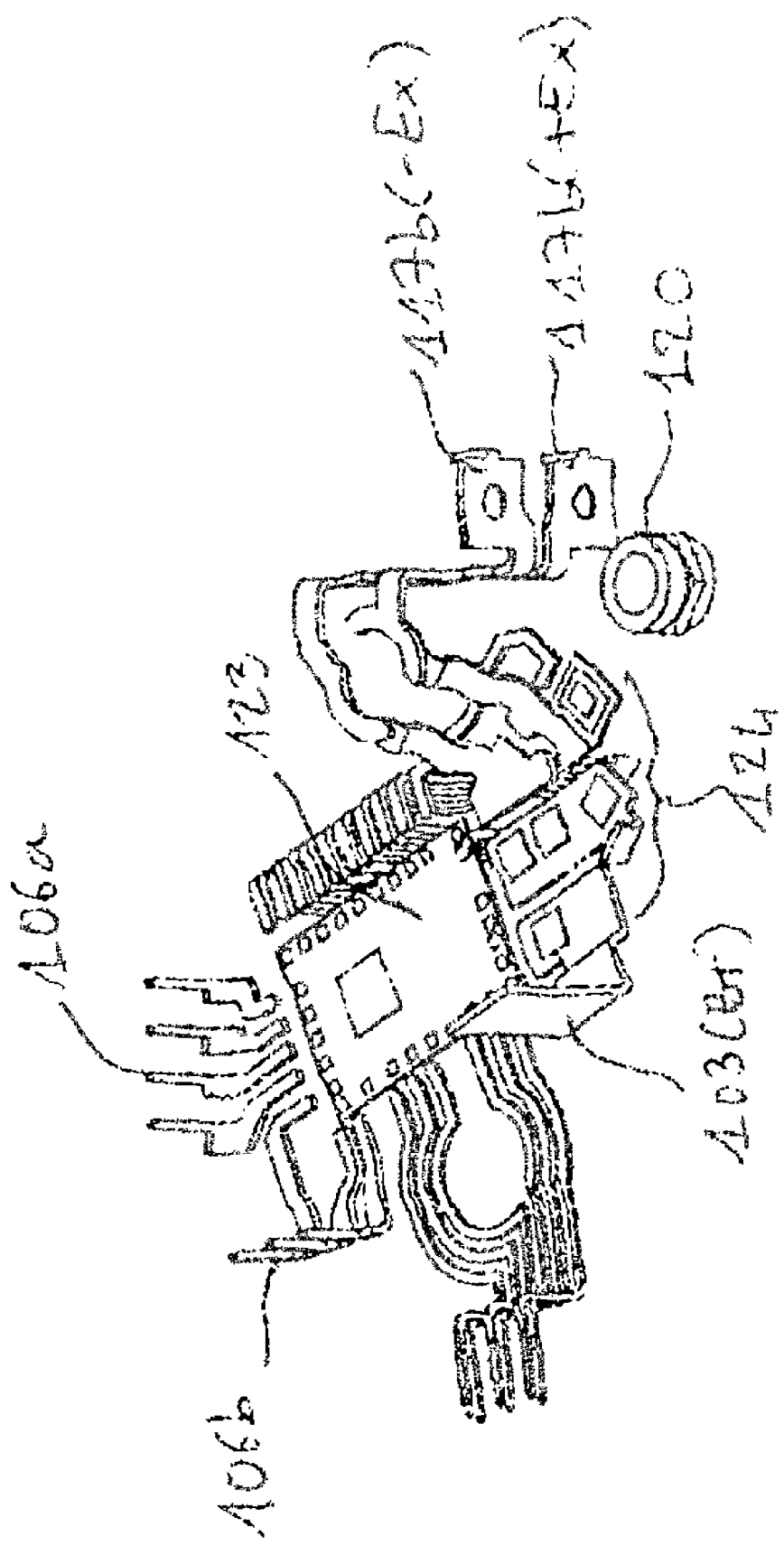
FIG. 5E is a third view from above without pre-molding and without overmolding of the module of FIG. 5A.

FIG. 5E is a first view without pre-molding and without overmolding of the tracks of the control/excitation module in which there can in particular be seen:

substrates 123 comprising the electronic components for controlling the machine; and an excitation part 124 comprising the electronic components for excitation of the machine via the brush holder 50.

The tracks of the module can also be seen in the following FIG. 5F without pre-molding and without the plastic overmoldiing in a view from below.

It should be noted that the pre-molding is an operation that takes place before the overmolding and that makes it possible to hold certain elements in position, such as the signal connection element 106 for example.

It should be noted that, in all the embodiments, the electronic components 102, in particular the MOS transistors, are mounted on the power connections, namely here the positive electrical conductor 103 and the phase track 105.

Preferentially, in all the embodiments presented above, the power tracks of the modules are visible on the bottom face of the modules. It is thus possible to isolate them electrically from the dissipator or dissipator bearing by means of adhesive in place of the plastic of the housing 101. The use of adhesive in place of the plastic of the housing 101 makes it possible to have a lesser thickness under the modules (approximately 0.2 mm in a non-limitative example) and to have a lower thermal resistance than plastic so as to have better dissipation in the dissipator bearing or dissipator.

It should be noted that, in all the embodiments presented above, it is of course possible to include or not the signal connector 116 in the control module or control/excitation module if so desired. If it is not included, it will be in the cover.

It should be noted that the electronic module according to all the embodiments presented above has the following additional advantages:
- it uses bare chips for the electronic components instead of so-called packaged standard components, so as to reduce the size;
- it includes the elements for controlling the MOS transistors, referred to as drivers;
- a module is configured in order to be perfectly integrated on the dissipator or dissipator bearing so that:
  - it does not block the axis of the bearing in which the shaft of the rotor is introduced;
  - there exists an axial cooling with the attached dissipator (not integrated);
  - all the ends of the power and signal tracks are outside the circumference of the dissipator or dissipator bearing, which facilitates the connections to be established, unlike the case where they are inside the circumference, so as to be accessible and so that there exists more space available on the outside diameter than inside for the ends;
- a module is preferentially configured for a single phase so that:
  - the hook of the module is opposite the natural exit of a stator phase;
  - there is one module per phase. Thus adaptation to the space available on the dissipator or dissipator bearing is easier compared with a single module comprising three phase tracks, and this in an optimum manner;
- the definition of the module makes it possible to have a power, control and excitation module with the same architecture; and
- in the event of failure of welding of one of the transistors, it avoids too much scrap compared with a single module for the three phases of the stator.

It should be noted that it is also possible to provide a single overmolding for all the power modules 20, the control module 30 and the excitation module 40 or control/excitation module 30/40.

At this moment there would be a single module that would comprise the power, the control and the excitation, the module then comprising three phase tracks.

An electronic module 10 cooperates with the following elements:
- a dissipator bearing 60 (dissipator integrated in the bearing, i.e. in a single piece with the bearing), or a dissipator 80 (dissipator not integrated in the bearing, i.e. attached to the bearing);
- a signal interconnection piece 22;
- a power interconnection piece 21; and
- a cover 70.

These elements are described below.

Dissipator Bearing

The function of a dissipator bearing is to discharge the heat from the electronic modules.

Figure 6:
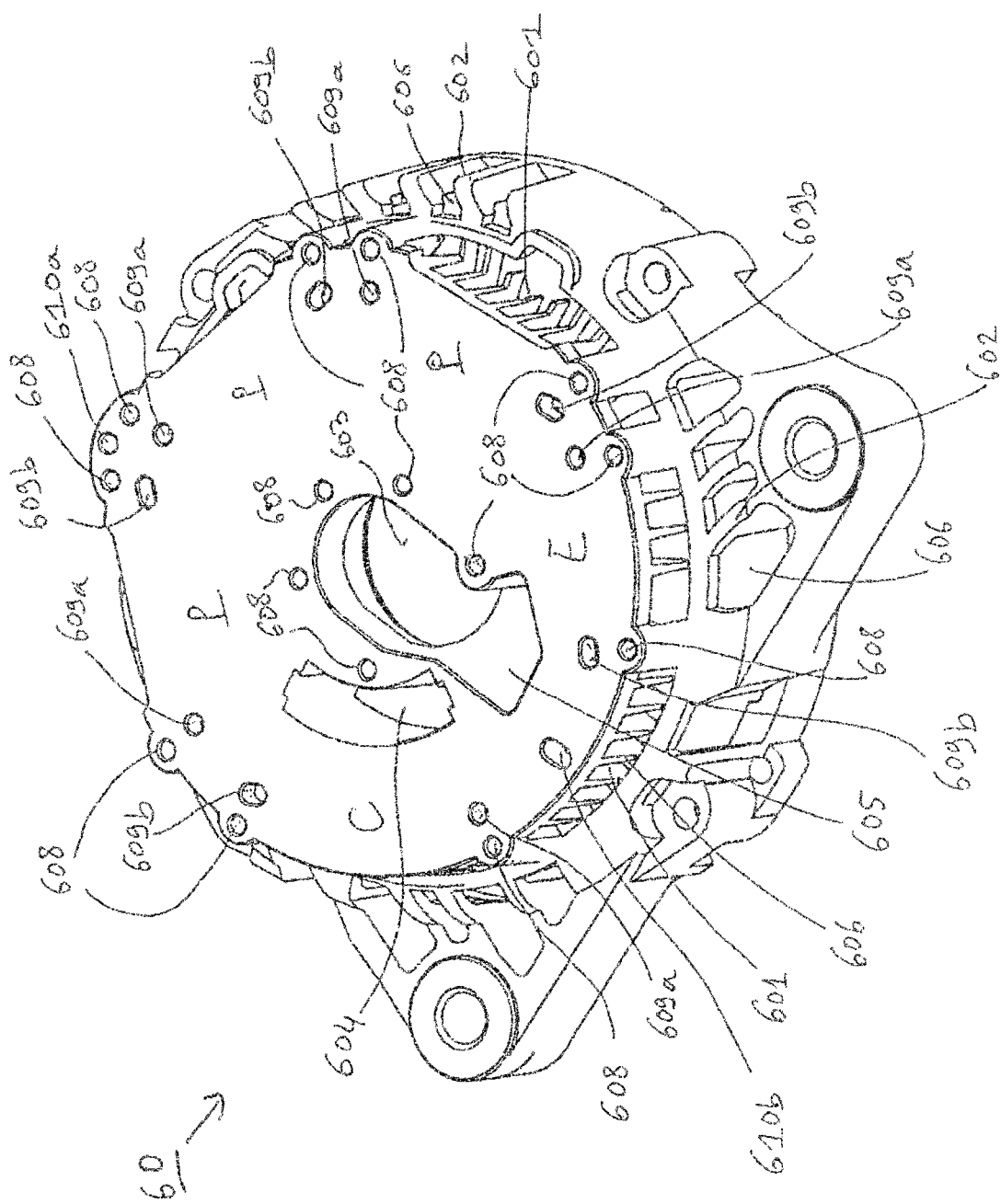
FIG. 6 depicts a first embodiment of a dissipator bearing intended to receive a module of FIGS. 1A and 2A.

The rear dissipator bearing 60, shown in FIG. 6, comprises, according to a first non-limitative embodiment:
- a plurality of positioning orifices 609, preferentially two orifices 609a, 609b per module, in order to position the modules on the bearing, the orifices being situated on the same diameter, i.e. in the example illustrated ten orifices;
- a plurality of fixing orifices 608 for receiving the three fixing studs of each module on which the power plate will be positioned, that is to say in the example illustrated fifteen orifices;
- air inlets 601 comprising fins 606;
- air outlets 602 comprising fins 606;
- various recesses referenced 603 for the rotor shaft of the rotary electrical machine, 604 for the Hall effect sensors making it possible to know the rotor position, and 605 for a brush holder 50; and
- positioning orifices 610 for positioning a signal plate, here two positioning orifices 610a and 610b that are distributed on each side of the diameter of the dissipator bearing. Preferentially one of the orifices is the reference control for the dissipator bearing, and thus an already existing orifice is used.

It should be noted that FIG. 6 shows the locations of the various modules. Thus the locations marked P, C and E receive respectively the three power modules 20, the control module 30 and finally the excitation module 40.

Figure 7:
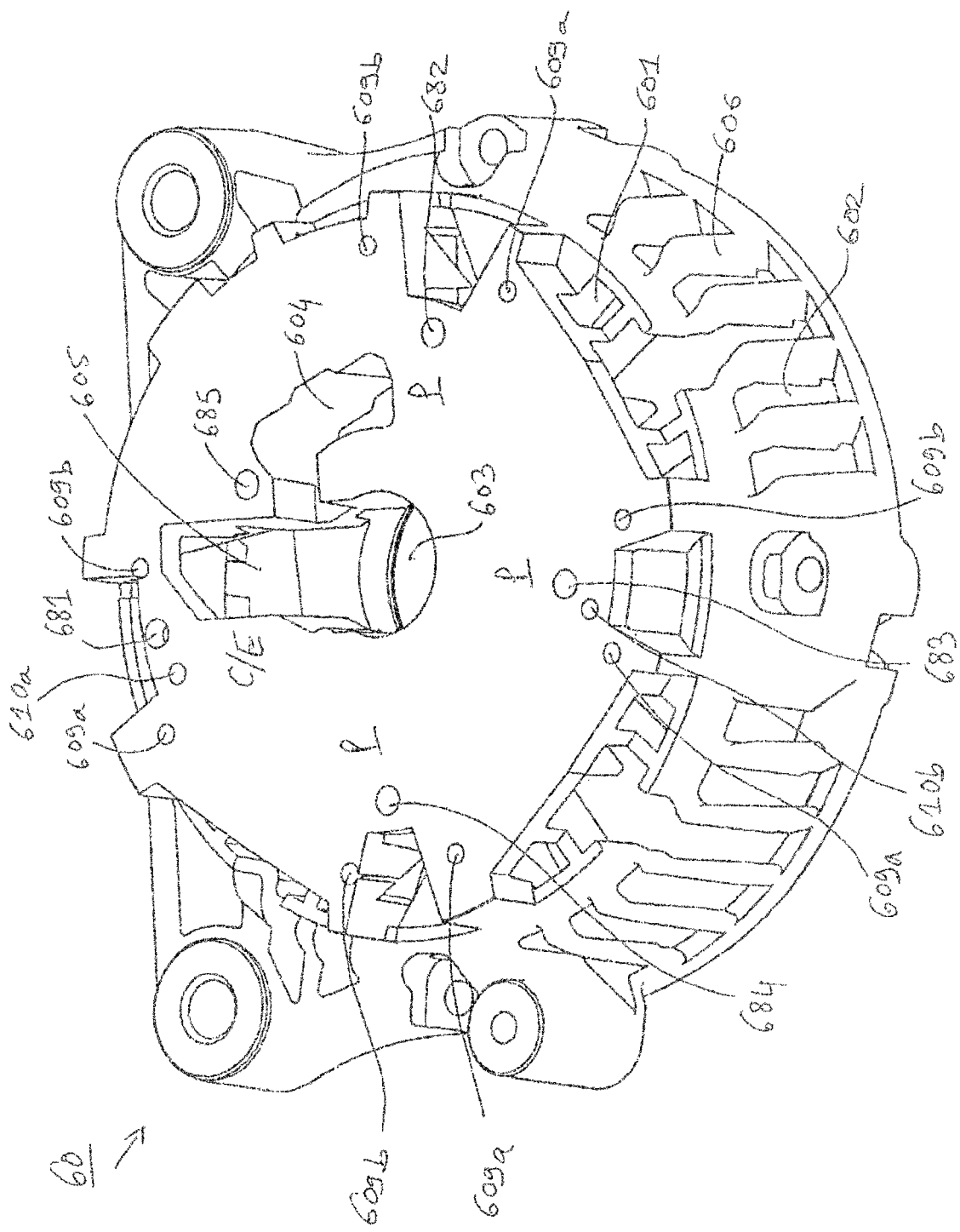
FIG. 7 depicts a second embodiment of a dissipator bearing intended to receive a module of FIG. 3A.

According to a second non-limitative preferential embodiment illustrated in FIG. 7, the dissipator bearing 60 comprises:
- a plurality of fixing orifices, here four, 681, 682, 683 and 684 for receiving four studs holding the signal plate;
- a fixing orifice 685 for receiving a fixing screw of a brush holder 50, there is no stud, which avoids reducing the cross-section of the track B+ of a power plate;
- the following same elements as the first embodiment:
  - air inlets 601 comprising fins 66;
  - air outlets 602 comprising fins 606;
  - various recesses 603, 604 and 605; and
  - the positioning orifices 610a and 610b for the signal plate.

It will be noted that the control and excitation functions have been combined in a single control/excitation module. Moreover, the location C/E and P respectively of the control/excitation module and the power module 20 in FIG. 7 will be noted.

The function of the dissipator 80 is to discharge the heat from the electronic modules.

Figure 8A:
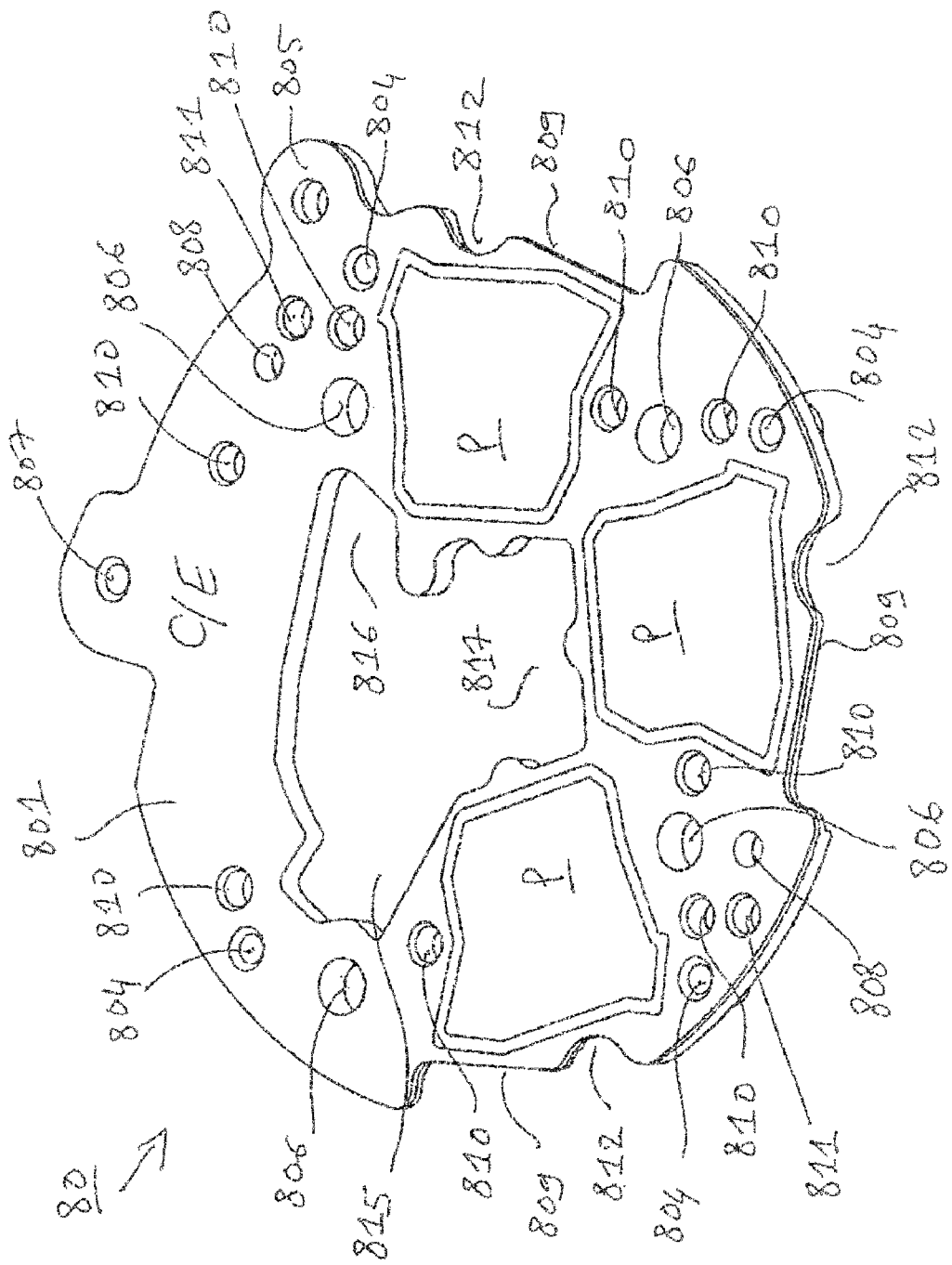
FIG. 8A depicts a first embodiment of a dissipator intended to receive a module of FIGS. 4A and 5A.

The dissipator 80 as illustrated in plan view in FIG. 8A is independent of the rear bearing of the rotary machine.

The dissipator 80 as illustrated in plan view in FIG. 8a is independent of the rear bearing of the rotary machine.

It comprises, according to a non-limitative preferential embodiment:
- a base plate 801 preferentially made from cast aluminum; and
- fixing orifices 806 on the rear bearing of the machine, here four, in order to receive fixing studs of a signal plate;
- an electrical connection orifice 805 for connecting the dissipator to earth via the power interconnection plate by means of a nut;
- fixing orifices 804 for fixing the modules, here four, and connecting them to the dissipator earth via an insert;
- a fixing orifice 807 for fixing a signal connector of the control/excitation module via an insert;

mechanical positioning orifices 808 for positioning a power interconnection piece 21, here two distributed on each side of the diameter of the dissipator;

recesses 809 on the circumference for receiving electrical protection means, here three, for the positive track (B+) of the power interconnection piece;

positioning orifices 810 for the modules, here two per module, that is to say eight orifices;

mechanical positioning orifices 811 for positioning a signal interconnection piece 22, here two distributed on each side of the diameter of the dissipator; and recesses 812 for inserting phase housings of a power plate as will be seen in detail below. There therefore exist three of them here, recesses 815, 816, 817 for receiving respectively a brush holder, position sensors and the rotor shaft.

The locations C/E and P respectively of the control/excitation module and the power modules 20 will be noted.

Figure 8B:
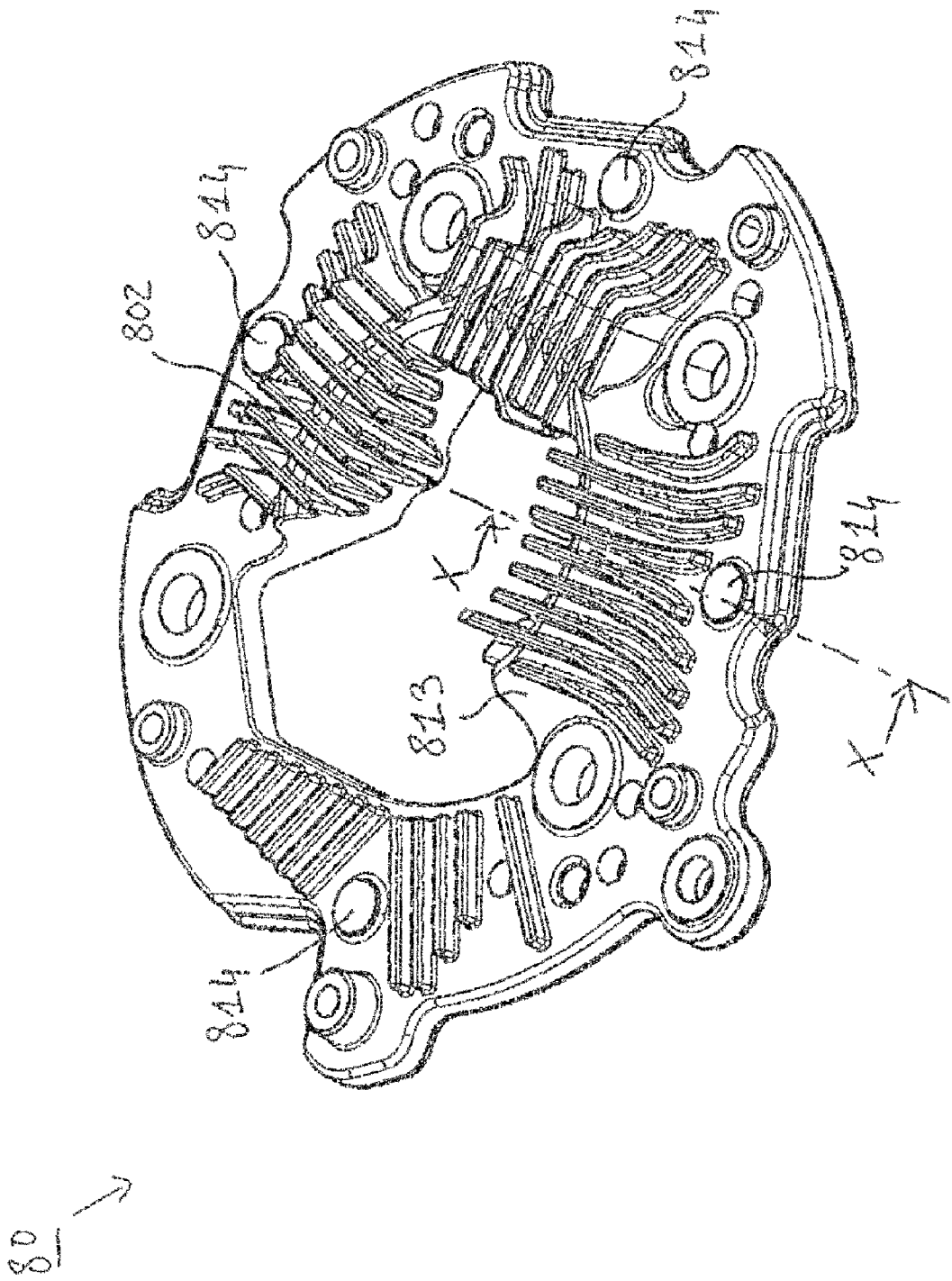
FIG. 8B is a view from below of the dissipator of FIG. 8A.

FIG. 8B shows a plan view of the dissipator.

Figure 8C:
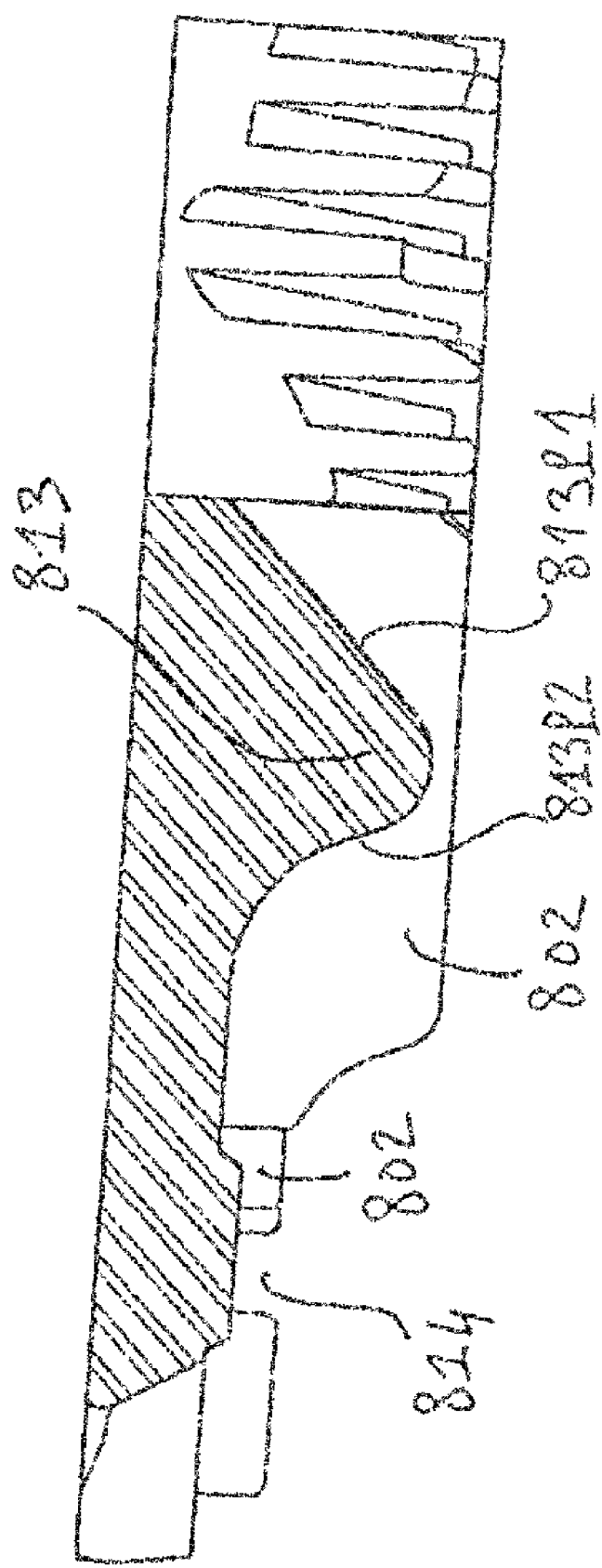
FIG. 8C is a view in section of FIG. 8B.

It can be seen that the dissipator also comprises:

blocks of cooling fins 802 intended to substantially increase the heat dissipation of the power modules 20, the blocks being situated on the bottom face in the position of use of the base plate 801;

support zones 814 for receiving force stays for the power interconnection piece that make it possible to withstand the engine vibrations; and a protrusion 813 that guides the air from the radial inlet of the machine towards the inside of the machine and thus prevents the air stagnating at the dissipator. This is also the case for the axial air. It is guided towards the inside of the machine. It should be noted that the fins at this level pass through the protrusion 813. A section X-X of the protrusion can be seen in FIG. 8C.

In addition, it should be noted that the base plate 801 is configured firstly so as to be able to be assembled in a sandwich between a power interconnection plate and the modules, and a signal interconnection plate, and secondly to leave at the center a sufficiently large passage for the cooling air of the electrical machine.

Figure 8D:
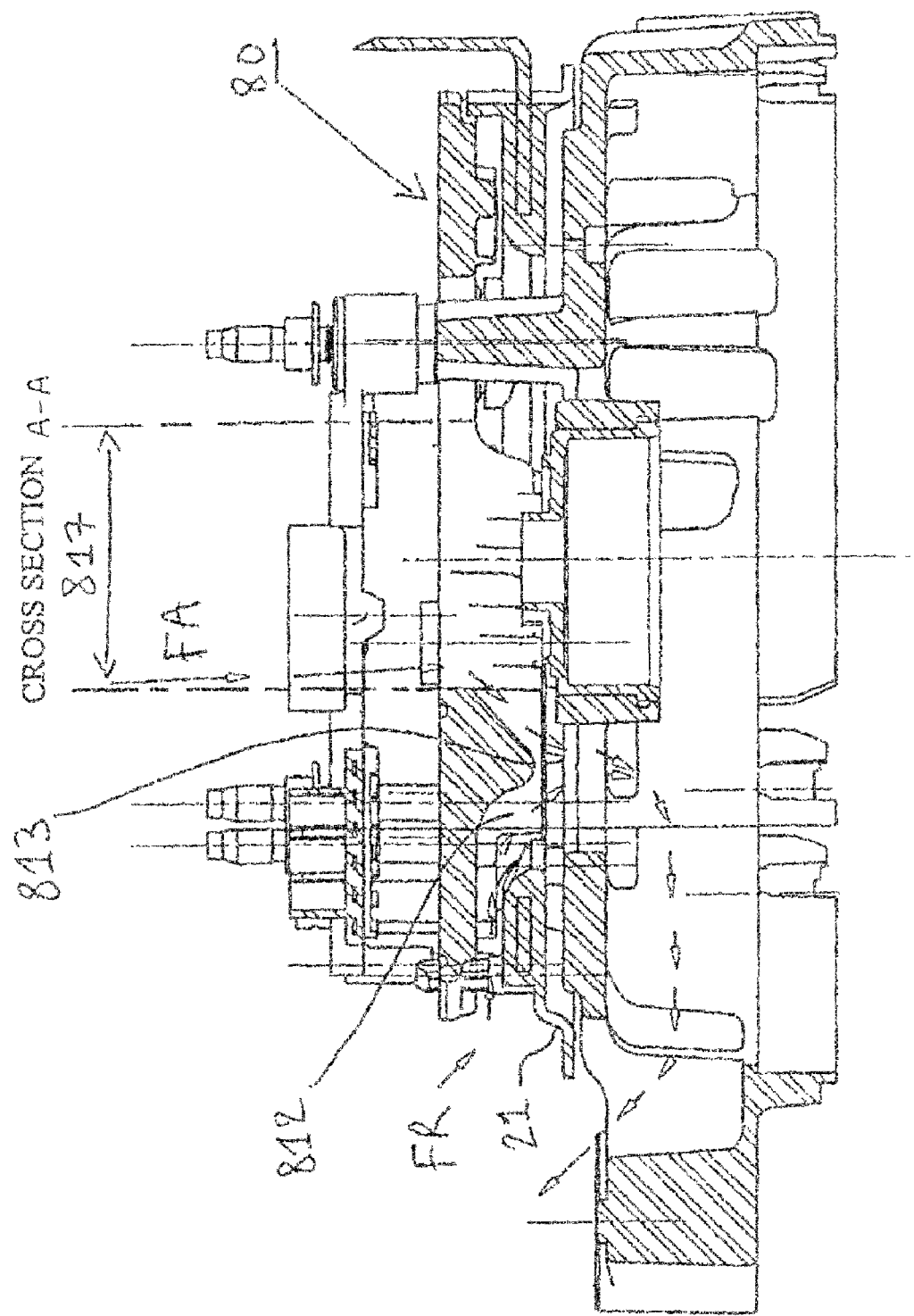
FIG. 8D shows an axial air flow and a radial air flow in the dissipator of FIG. 8B.

As indicated in FIG. 8D, a first flow of the air will enter the machine in this way axially FA. This has the advantage of increasing the speed of the air and thus reducing the pressure drops compared with a radial flow (the case of the first and second embodiments of the dissipator bearing described previously).

In this way, a looping of air heated by the machine between an output and an input of the dissipator bearing is avoided (for the air incoming axially) and thus re-injecting hot air into the machine is avoided.

More particularly, it is the recess 817 that is configured so as to allow air to pass around the rotor shaft and is therefore wider than the diameter of the rotor shaft or, to be more precise, of the shaft collector protector.

In this way the standard cooling applied to a conventional alternator is approached.

Moreover, the axial air flow is guided by the first slope 813P1 of the protrusion 813 of the dissipator so that there is no stagnant air on the bottom face of the dissipator level with the fins.

In addition, by virtue of the positioning of the dissipator 80 described, there is also a second air flow that is radial between the dissipator 80 and the power interconnection piece 21. This can also be seen in FIG. 8D. This radial air FR enters through the dissipator and leaves again through the fins 606 in the bearing. This radial air flow increases the output of air and therefore improves the cooling of the machine, the latter thus being more efficient than if there were only an axial air flow.

In addition, by virtue of the protrusion 813 situated level with the fins, this radial air flow does not stagnate since it is guided by the second slope 813P2 of the protrusion 813 towards the inside of the machine.

It should be noted that these radial FR and axial FA air flows are accelerated by the fan of the machine, which gives rise to a better cooling of the machine plus the electronics because in particular of the arrangement of the dissipator as described above.

Signal Interconnection Plate

The signal interconnection piece 22 is intended to convey various signals necessary for the functioning of the modules and, thereby, for the correct functioning of the rotary electrical machine. Such signals are for example:

a signal for the operating mode of the electrical machine, for example motor or generator;

a signal indicating the temperature of the modules;

a signal sending back a fault detected on the modules;

a control signal for the switches of the MOSs etc.

These signals are conveyed between the power modules 20 and the control module 30.

Figure 9A:
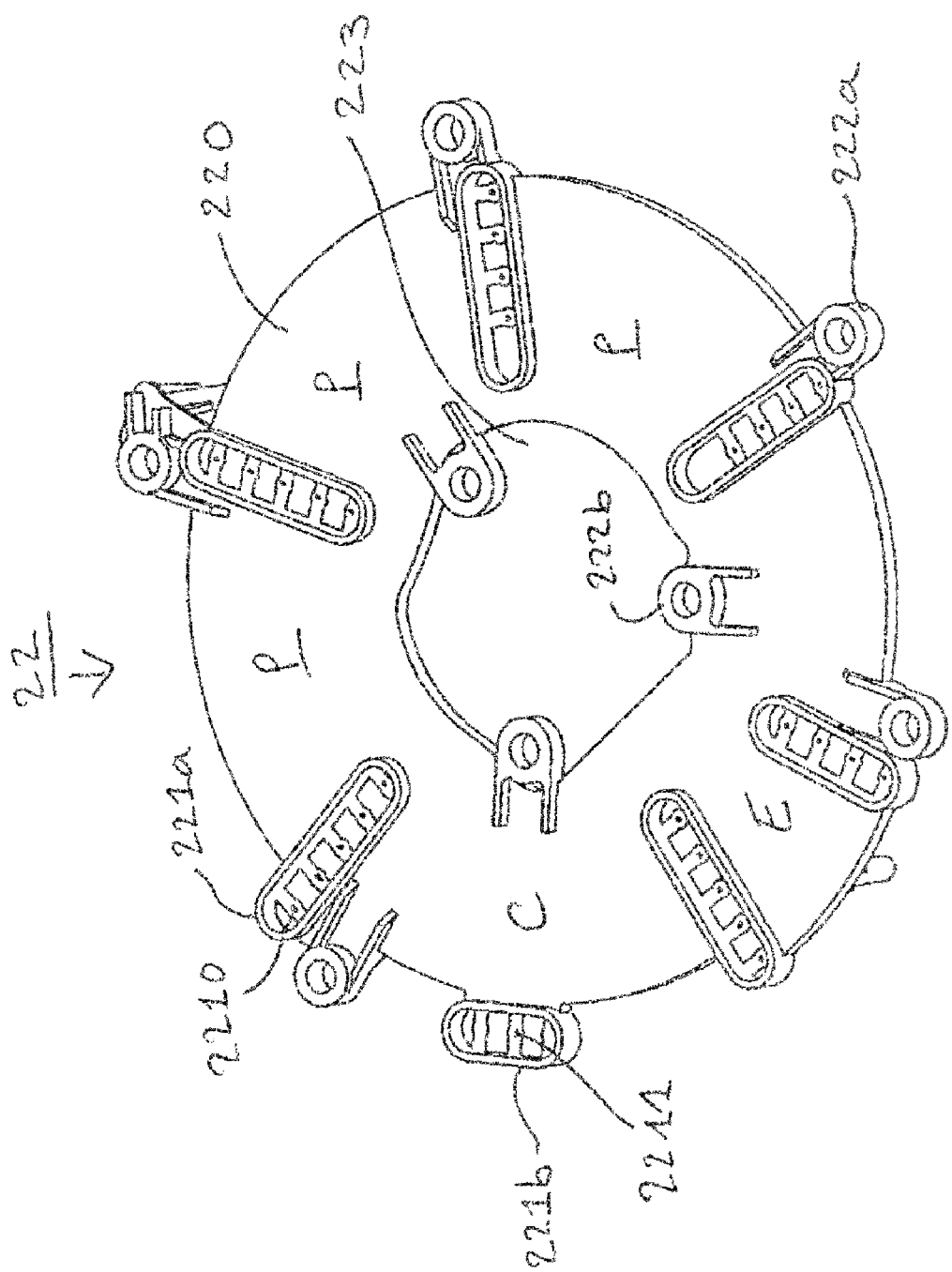
FIG. 9A depicts a first embodiment of a signal interconnection piece intended to be placed on a module of FIGS. 1A and 2A.
Figure 9B:
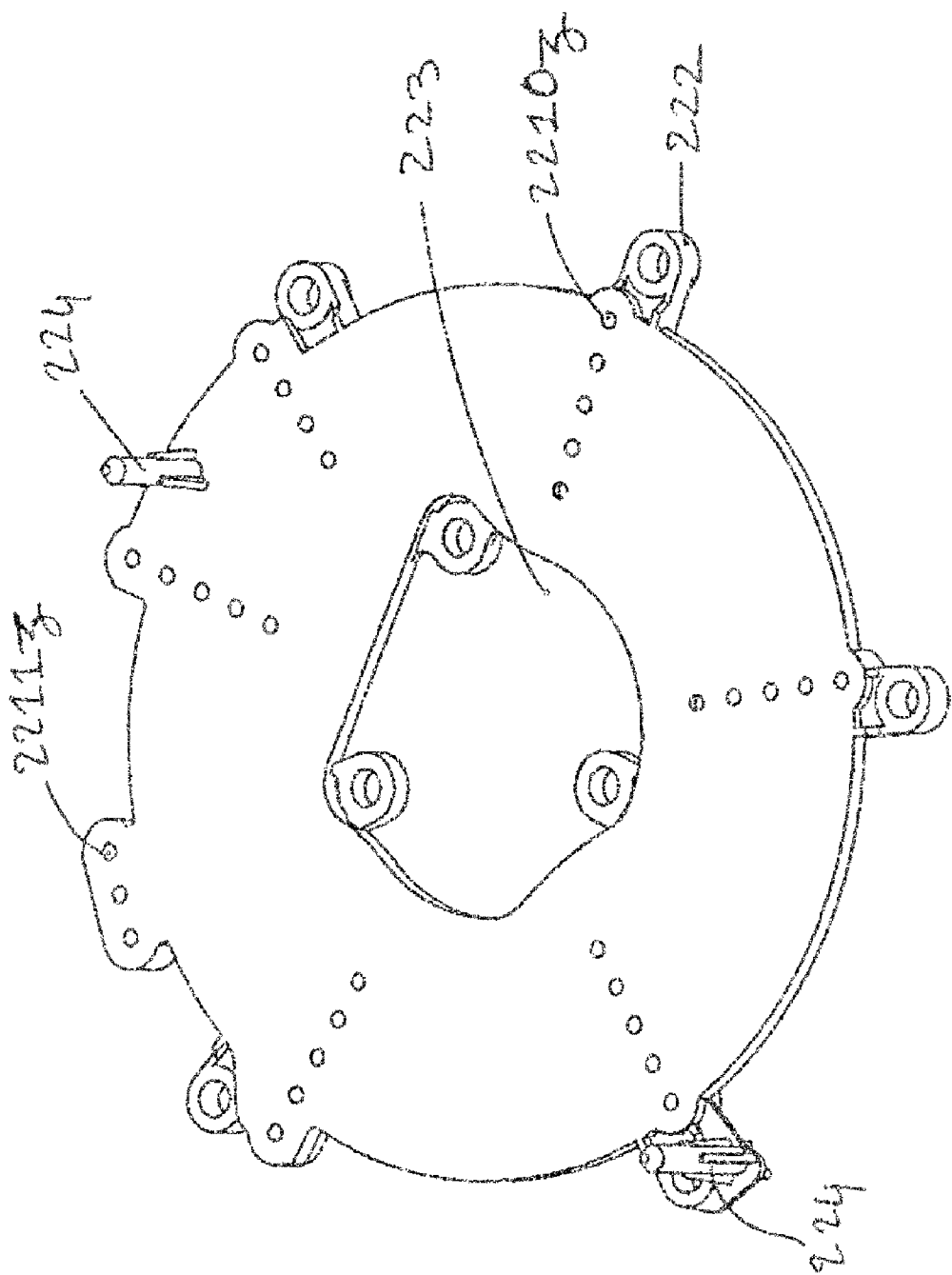
FIG. 9B is a view from below of the piece of FIG. 9A.

FIGS. 9A to 9C show a first non-limitative embodiment of the signal interconnection piece 22.

It comprises:

a base plate 220 made from insulating material, preferentially made from plastic, and preferentially substantially cylindrical, which moulds on metal signal tracks TS;

a central recess 223 for lightening the plate in terms of material;

recesses 221a for leaving visible metal tracks TS, the tracks comprising interconnection orifices 2210, here five orifices, the axes of which are disposed in a plane P2 (shown in FIG. 9C) perpendicular to the surface of the plate and passing substantially through the rotor rotation axis AX, the orifices being intended to receive the signal connection element 106 of an electronic module with a view to being connected electrically;

a connection recess 221b for leaving visible metal tracks TS, the tracks comprising interconnection orifices 2211, disposed at the external periphery of the signal interconnection piece 22, the orifices being intended to receive the signal connection element 106 of a control module, here three orifices; and fixing lugs 222 intended to be inserted in one of the three holding studs 113 of an electronic module, and intended to receive a fixing nut, the fixing lugs holding the signal interconnection piece 22 on the modules, by means of the studs, first lugs 222a being disposed on the outside diameter of the plate and projecting beyond the plate, and second lugs 222b being disposed on the internal diameter of the plate and also attenuating vibrations of the plate.

It should be noted that the recesses 221a and 221b can be protected subsequently against the external environment by a resin for example.

It should also be noted that the base plate 220 comprises orifices 2210z, 2211z opposite the orifices of the metal tracks TS, as illustrated in FIG. 9B.

The signal interconnection piece 22 also comprises:

positioning pins or studs 224 for assembly on a dissipator bearing 60, here two as illustrated on the view from below in FIG. 9B; and metal signal tracks TS configured to adapt to the shape of the plate and to the position of the signal connection element 106 of the modules, and comprising interconnection orifices 2210, 2211 as illustrated in FIG. 9C. The tracks are preferentially in the same plane. Moreover, they are preferentially configured in the form of arcs of a circle essentially concentric with respect to the rotor rotation axis.

Figure 10A:
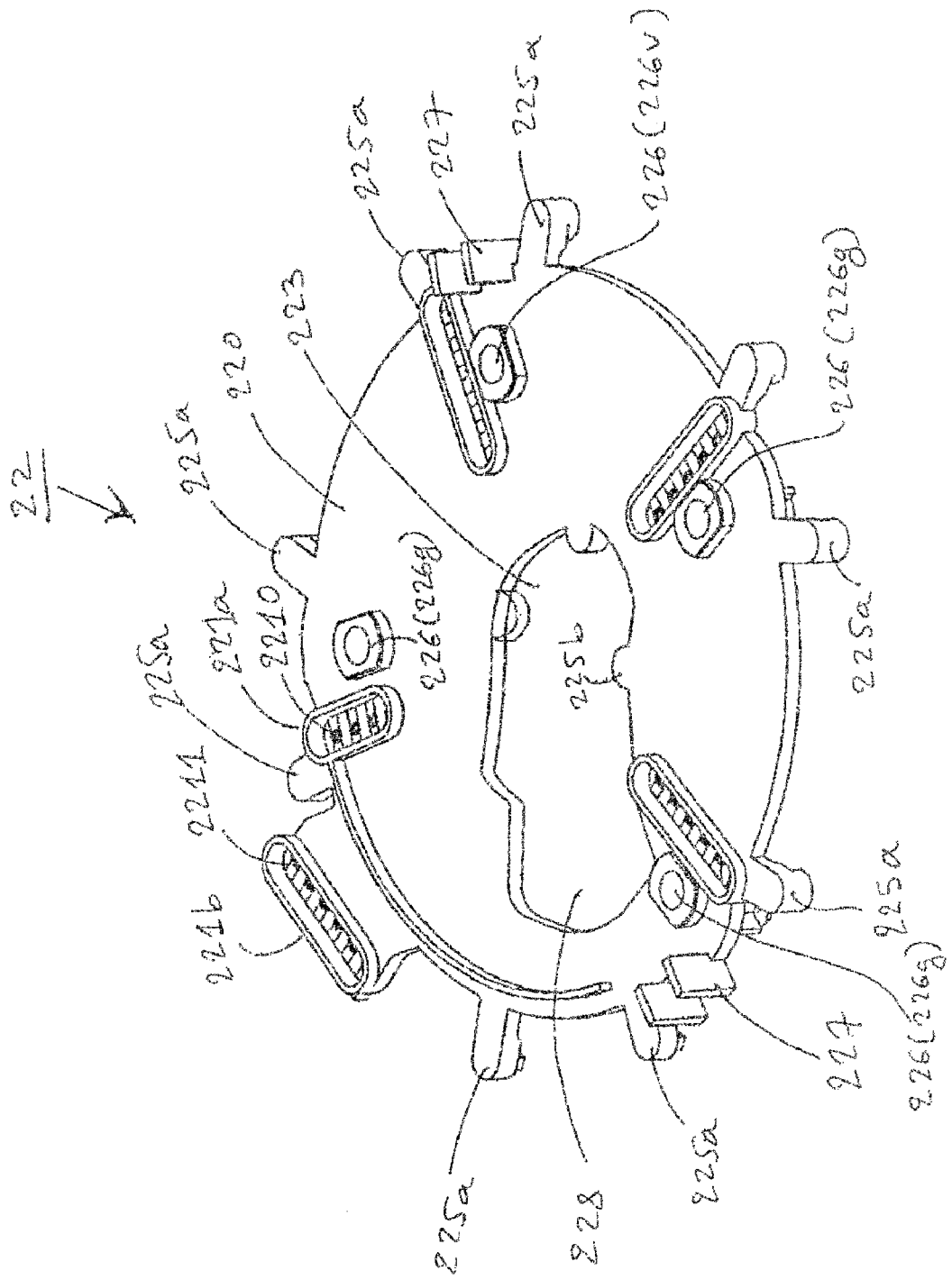
FIG. 10A depicts a second embodiment of a signal interconnection piece intended to be placed on a module of FIG. 3A.
Figure 108:
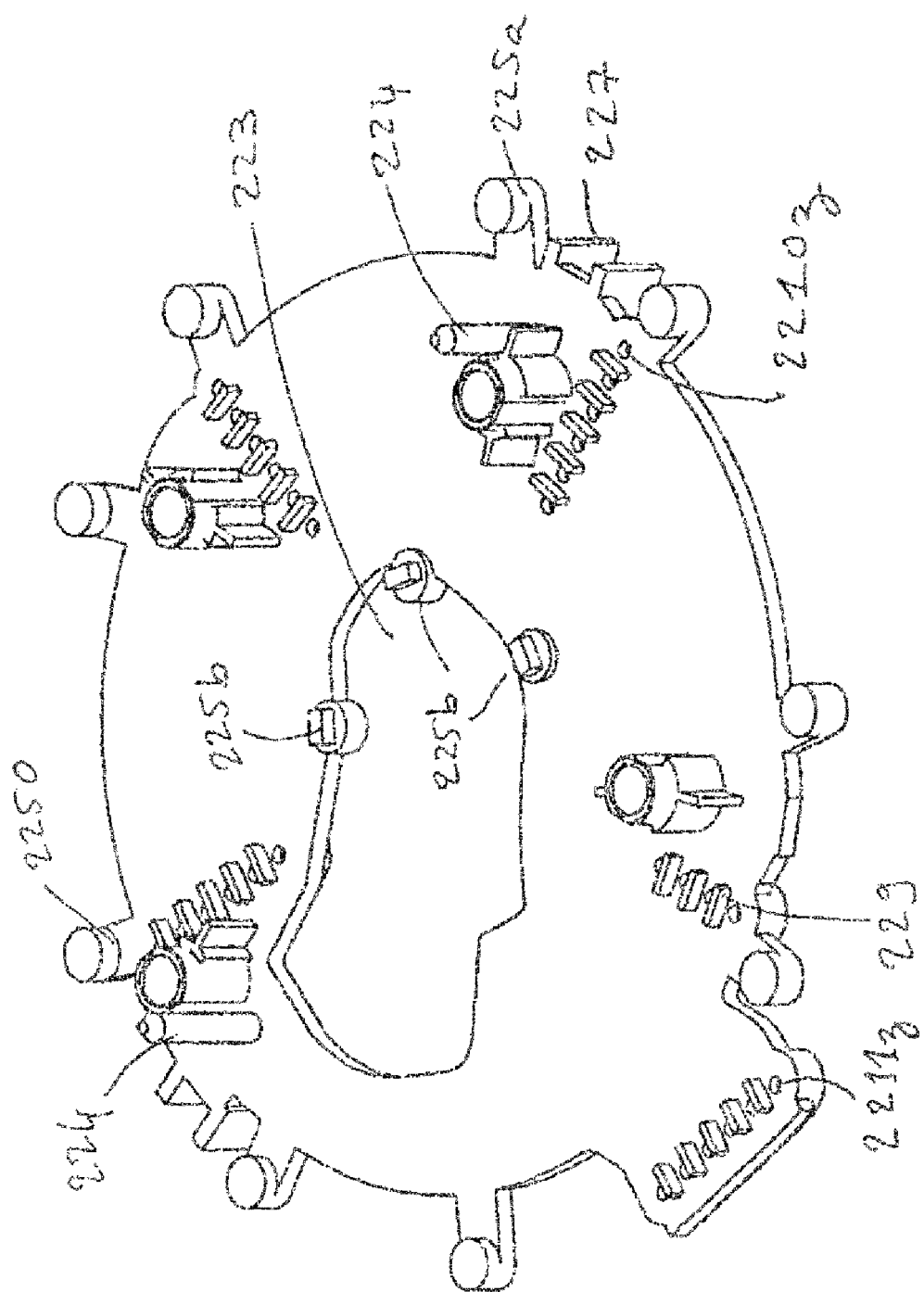

FIGS. 10A to 10C depict a second preferential embodiment of the signal interconnection piece 22.

This signal interconnection piece 22 comprises:
in place of the fixing lugs of the first mode, stays 225 for pressing the modules against a dissipator bearing, first stays 225*a* and second stays 225*b* being positioned respectively on the external or internal periphery of the plate, here nine in total; there are thus three support points on each module;
in place of the three recesses per module, only three support inserts 226 intended to receive three studs 226*g*, for fixing to the dissipator bearing 60; and
a metal insert 226 for receiving a screw 226*v* for fixing the plate to the dissipator bearing. This screw avoids reducing the cross-section of the positive power tracks (B+) of the power interconnection piece 21 (described below).

These four inserts also prevent flow of the overmolding plastic. It will therefore also be possible to use them for the first embodiment.

The signal interconnection piece 22 also comprises:
at least one fixing housing or holding clip 227 for fixing the power interconnection piece 21 and receiving a fixing clip or lug (218), here two housings; and
an additional central recess 228 for receiving a brush holder.

In a first variant embodiment of this mode, the plate also comprises separators 229 for signal connection element 106 so as to prevent short-circuits between the tongues, short-circuits due in particular to salt spray. In this way the length of the electrical path between the tongues is increased.

In another variant, the plate does not have any separators. At this moment, in order to isolate the tongues from each other, seals are provides that surround the signal connection element 106 on the modules themselves. Subsequently the signal interconnection piece 22 will compress these seals.

It should be noted that these two variants apply to the two embodiments of the electronic module described above and to the third embodiment, which will be described later.

In FIG. 10C, it is possible to see the concentric metal tracks of the signal interconnection piece 22. The metal tracks are configured to adapt to the position of the signal connection element 106 of the modules, and preferentially to the shape of the plate, and in addition to pass round the four inserts 226. They are preferentially configured in the form of arcs of a circle essentially concentric with respect to the rotor rotation axis.

It should be noted that the stays 225 are, non-limitatively, cylindrical in shape. This shape has a sharp edge 2250.

In addition, it should be noted that the signal interconnection piece 22 according to this second embodiment has the following same elements as the plate according to the first mode:
the base plate 220;
the recesses 221*a* and 221*b*;
the central recess 223 intended to receive here a rotor shaft;
the positioning pins 224; and
the metal tracks TS with the orifices 2210 and 2211.

It should be noted that, for the first and second embodiments described above, the signal tracks are preferentially configured inside the diameter on which the power terminals (described in detail below) are produced. This enables the power interconnection pieces 21 (described below) to fit on top of the signal interconnection piece 22. Thus assembly is facilitated and the signal tracks do not interfere with the power tracks.

FIGS. 11A to 11D depict a third non-limitative embodiment of the signal interconnection piece 22.

It differs from the second embodiment in that:
it no longer has any holding clips 227 for positioning the power interconnection piece 21 since in this embodiment the power interconnection piece 21 is situated below the signal interconnection piece 22, as will be seen in detail below; and
the stays 225*a* and 225*b* have a different shape. They have a shape that no longer comprises any sharp edge, which prevents the stresses undergone by the plastic being concentrated on the sharp edges. In this way the risk of breaking the stays is reduced.

The signal plate 32 also comprises:
hollowed-out protuberances 230 for pre-positioning the plate on the modules. Here there exist two protuberances. They serve in particular for pre-guidance during the process assembly. This thus makes it possible to subsequently fix the positioning pins 224 of the signal interconnection piece 22 in the dissipator 80. It will thus be possible to position the signal interconnection piece 22 before the assembly of the signal connection element 106; and
housings 231 for housing therein filtering capacitors. These capacitors will be connected to the electronic modules. The housings afford good mechanical strength for the capacitors. Resin will be deposited in the housings.

Moreover, it should be noted that the signal interconnection piece 22 according to this third embodiment has the following same elements as the plate according to the second embodiment:
the base plate 220;
the recesses 221*a* and 221*b*;
the central recess 223;
the additional central recess 228 for the brush holder;
the four inserts 226;
the positioning pins 224; and
the metal tracks TS with the orifices 2210 and 2211.

Figure 11A:
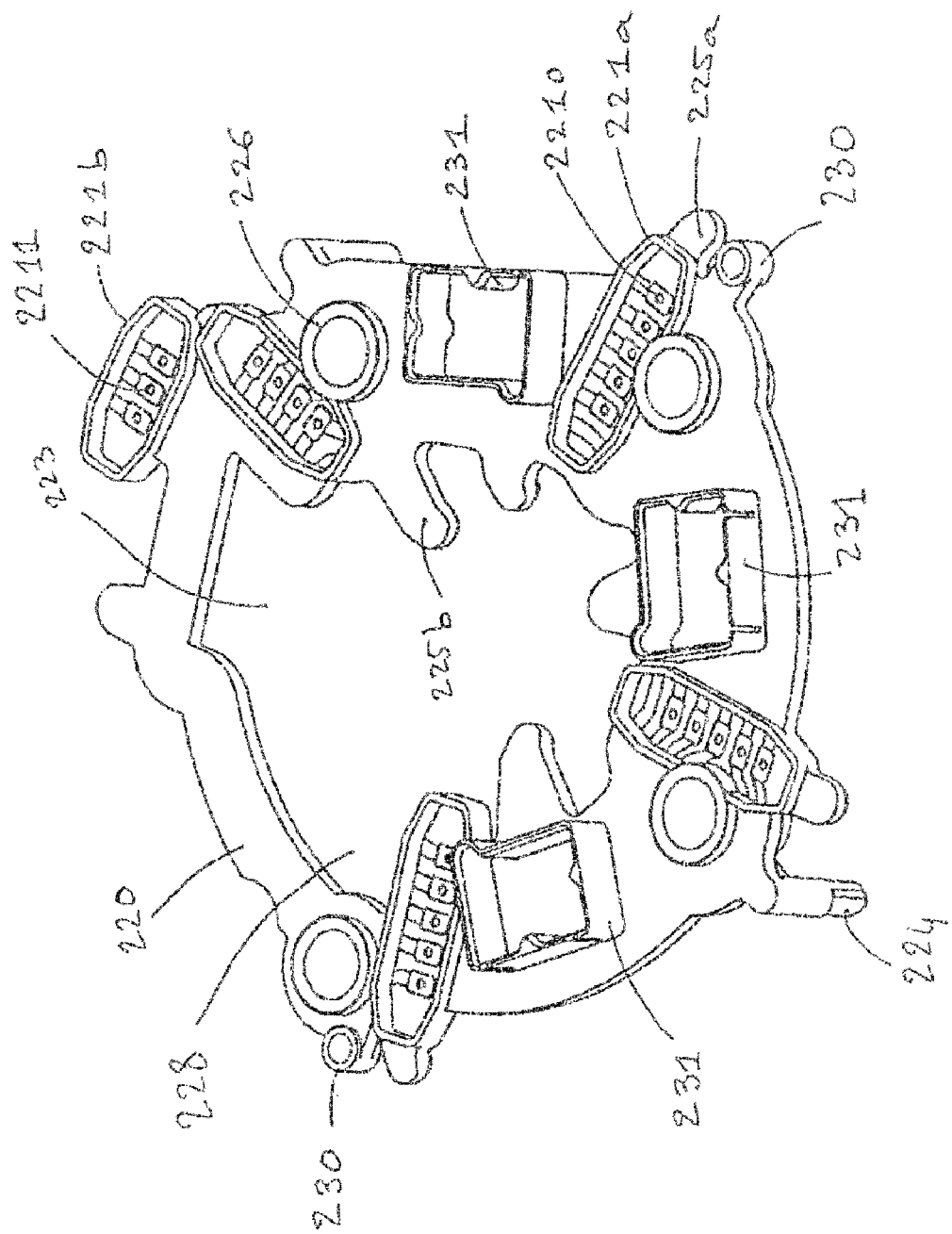
FIG. 11A depicts a third embodiment of a signal interconnection piece intended to be placed on a module of FIGS. 4A and 5A.
Figure 11B:
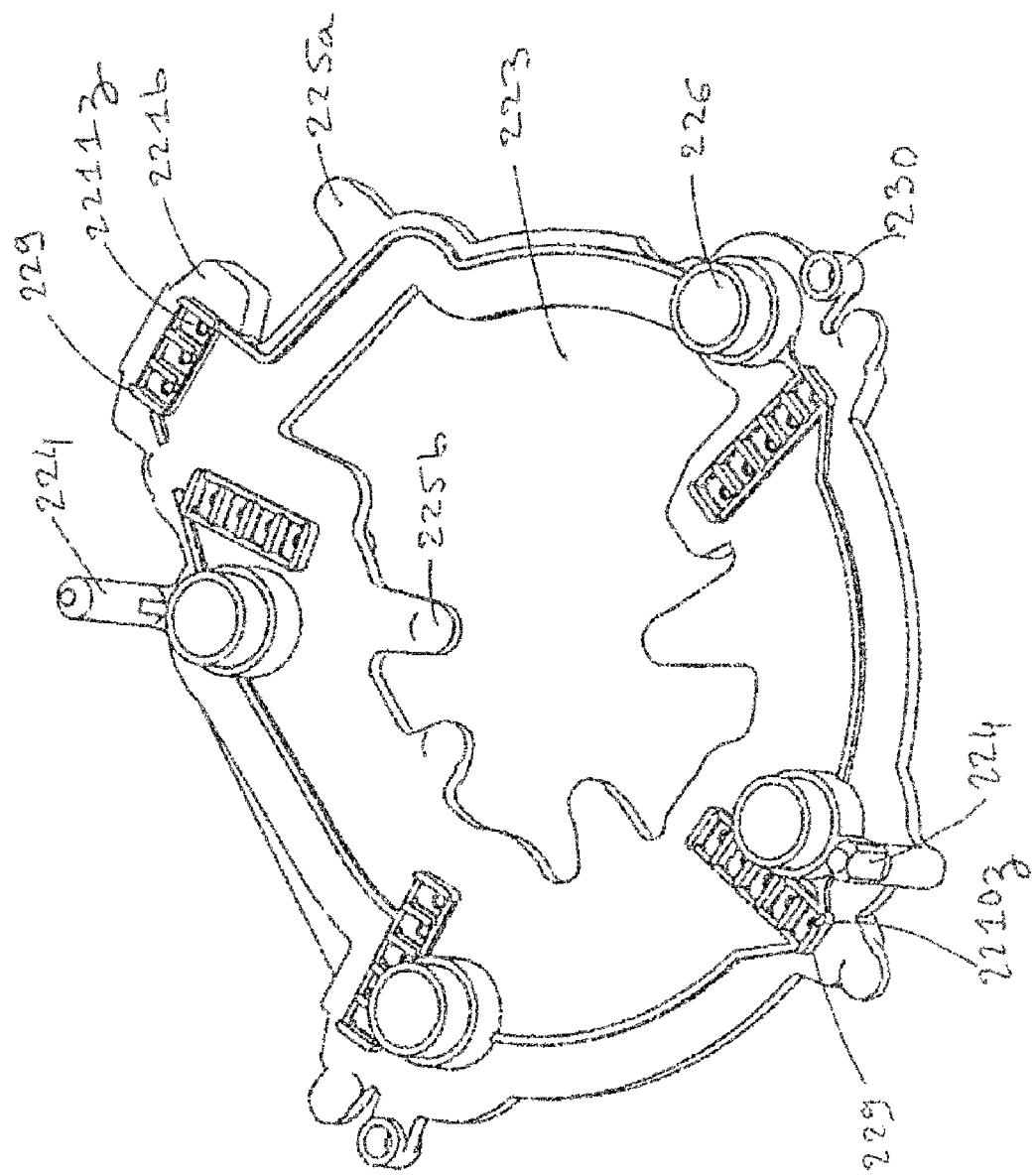
FIG. 11B is a view from below of the signal interconnection piece of FIG. 11A.

According to a first variant of this embodiment, the orifices 2210 and 2211 are configured so as to effect a tin weld between the orifices and the corresponding signal connection element 106. These are therefore holes with a bevel as illustrated in FIG. 11A and in FIG. 11B in view from below.

Figure 11C:
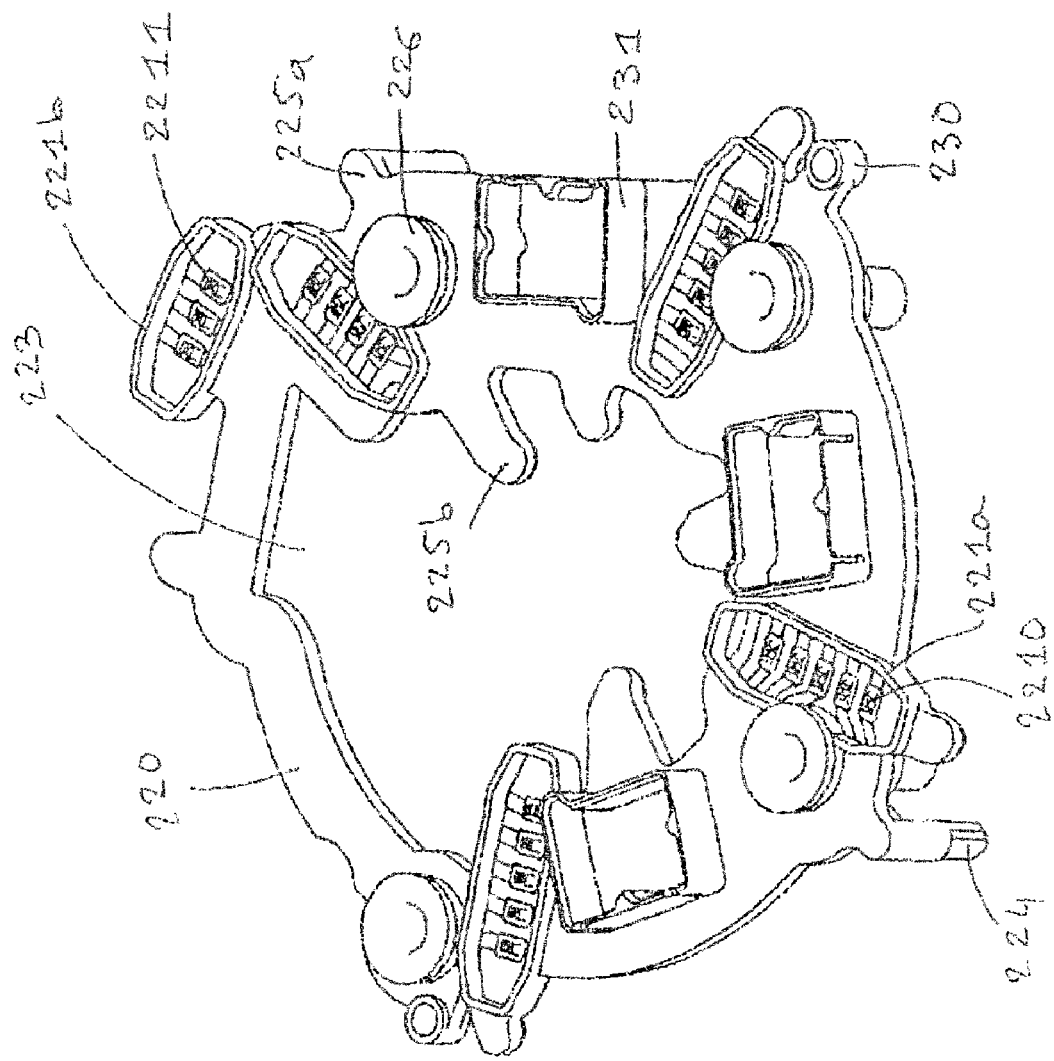
FIG. 11C is another view from above of the signal interconnection piece of FIG. 11A.

According to a second variant of this embodiment, the orifices 2210 and 2211 are configured so as to effect a laser weld between the orifices and the corresponding signal connection element 106. These are therefore folded micro-tongues as illustrated in FIG. 11C.

In FIG. 11D, the metal tracks of the signal interconnection piece 22 can be seen. The metal tracks are configured so as to adapt to the position of the signal connection element 106 of the modules, and preferentially to the shape of the plate, and in addition to pass round the four inserts 226. They are preferentially configured in the form of arcs of a circle essentially concentric with respect to the rotor rotation axis.

Thus, unlike an electronic card for fulfilling the signal function, such a signal plate has the advantages of:
withstanding high temperatures, for example 260° C., unlike a conventional PCB electronic card, such a PCB card being composed of copper tracks with a polymer insulator, the copper tracks not withstanding high temperatures;

being able to be centered above the electronic modules 10; comprising metal tracks not necessarily made from copper. This is because, having regard to the relatively low power conveyed by these tracks, a material with a low electrical resistance is not necessarily required. Thus the tracks can for example, non-limitatively, be made from steel;

be as close as possible to the modules, which avoids having signal tongues for the excessively long modules and thus avoiding problems of plugging in; and by virtue of the metal tracks, which do not overlap, a track cutting is achieved in one go, a fine thickness of the plate is obtained, and therefore a saving in axial size of the whole of the machine, and a facilitated manufacture of the signal interconnection plate.

It should be noted that, naturally, in all the embodiments presented above, it is also possible to provide, instead of the interconnection orifices 2210, 2211, other interconnection means such as folded tongues for example.

Power Interconnection Plate

The power interconnection piece 21 makes it possible to distribute the power between the modules 20, 30, 40 from outside (in particular the vehicle battery).

This piece is independent of the electronic modules, which makes it possible to supply each module with current independently and thus avoid the heating of the modules relating to the passage of the current intended for one module in all the modules. Thus, according to the configuration of this piece and the associated modules, there is no flow of current between the three power modules.

The power interconnection piece 21 is, in the most simple case, in the form of a plate produced from an electrically insulating material, preferably plastic.

Figure 12A:
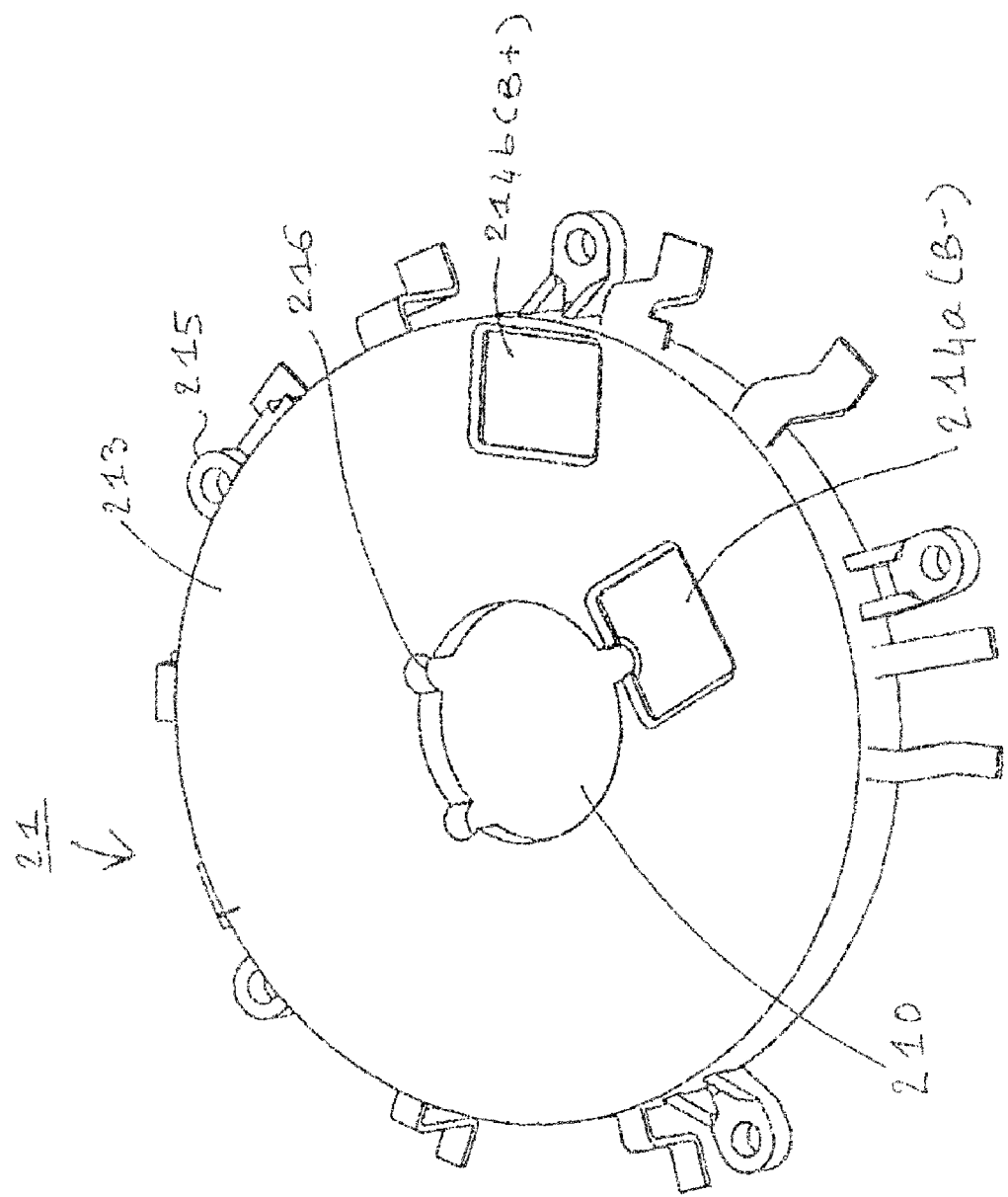
FIG. 12A shows a first embodiment of a power interconnection piece intended to be in contact with a module of FIGS. 1A and 2A and to be situated above the signal interconnection piece of FIG. 9A.
Figure 12B:
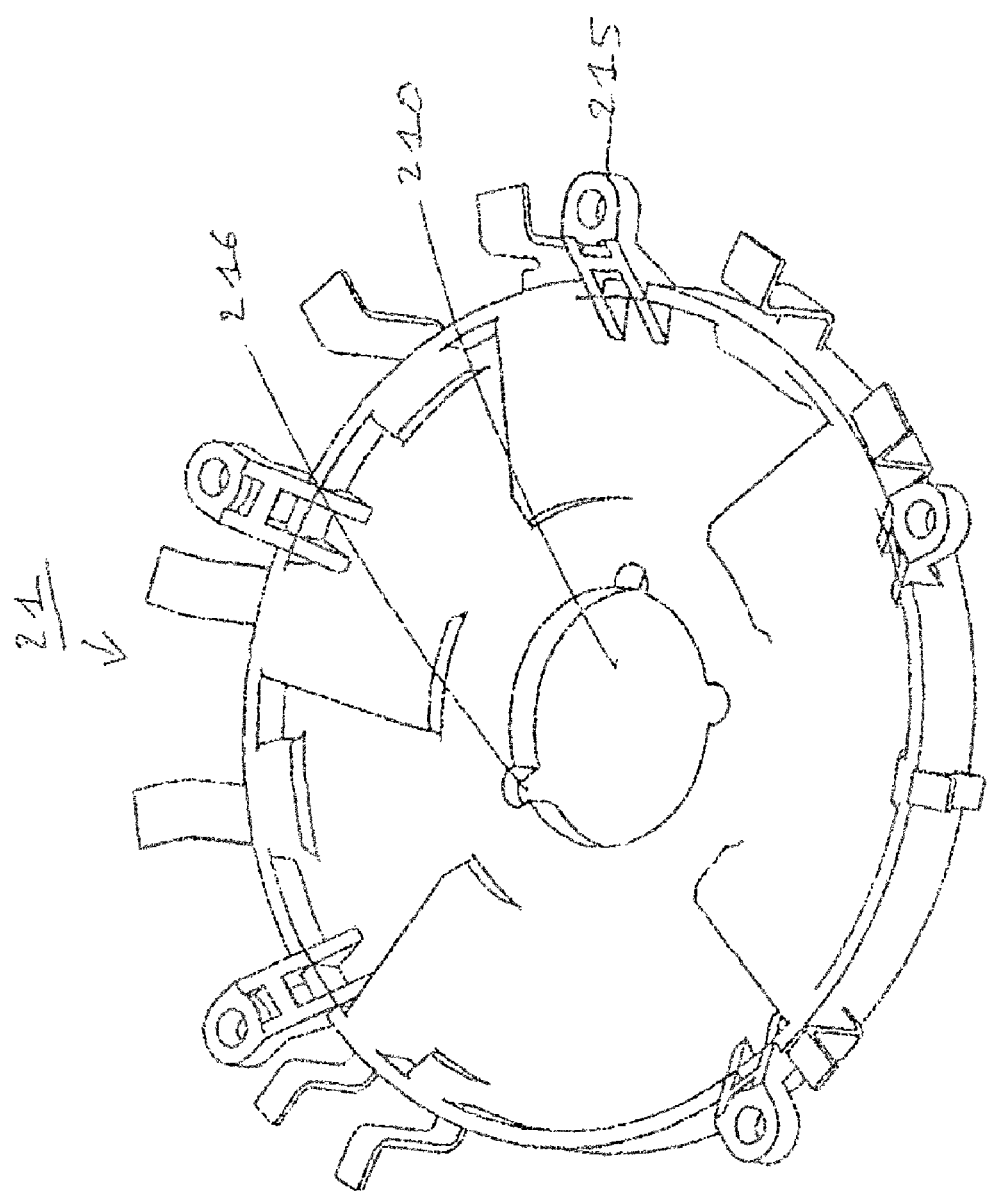
FIG. 12B is a view from below of the piece of FIG. 12A.
Figure 12C:
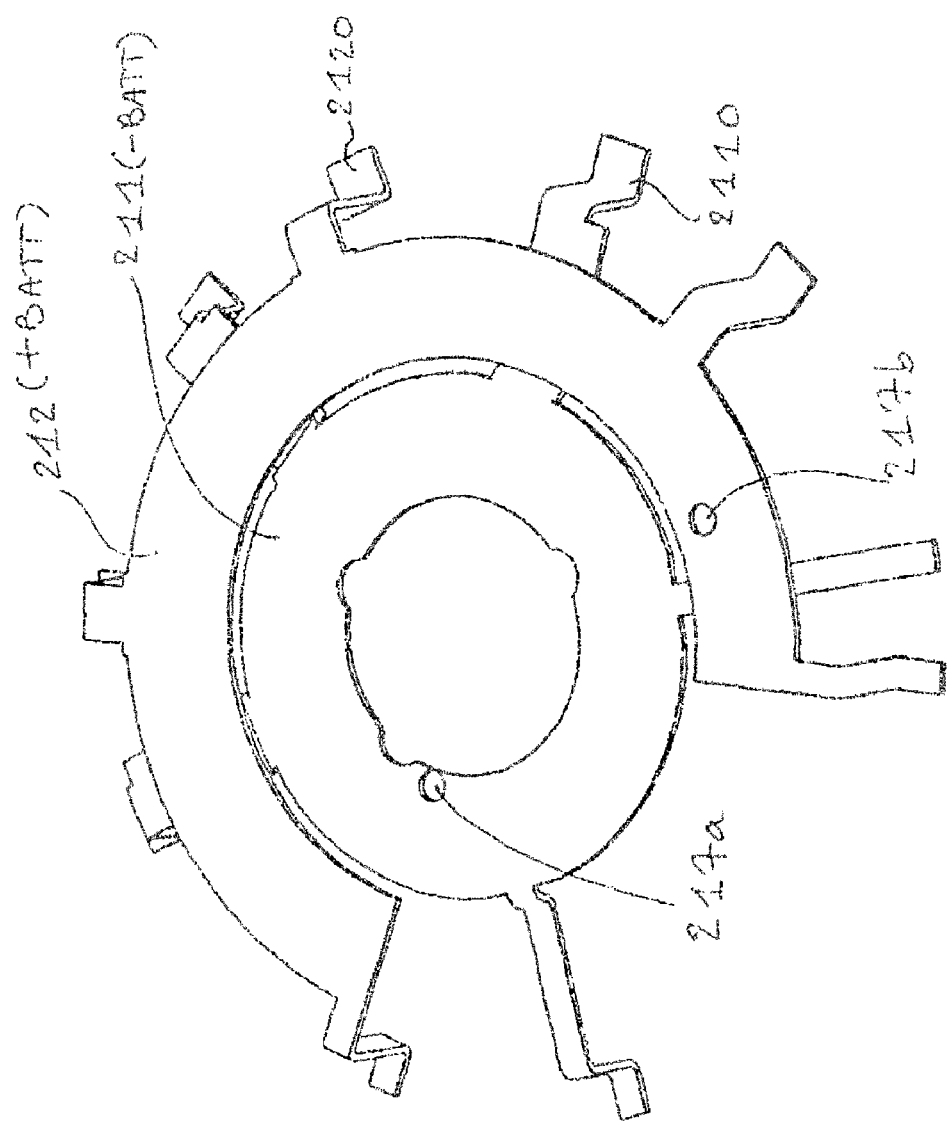
FIG. 12C is a view without overmolding of the piece of FIG. 12A.

In a first non-limitative embodiment, illustrated in FIGS. 12A to 12C, it comprises:
  a central recess 210 for lightening the plate in terms of material;
  power interconnection tracks 211 (–BATT), 212 (+BATT);
  negative 2110 and positive 2120 power terminals issuing from the respective power interconnection tracks 211, 212;
  a plastic overmolding 213 on the power interconnection tracks 211 and 212;
  a first recess 214a;
  a second recess 214b; and
  fixing lugs 215.

The elements of the power interconnection plate are described in detail below.

The power interconnection tracks 211, 212 are disposed at least on one face of the plate. These are tracks made from a metal with low resistance, preferably copper, which are overmolded in the plastics material of the power interconnection piece 21.

They can be produced in the form of a flat strips clipped, riveted, adhesively bonded or fixed in any other suitable manner to the plastic plate.

According to a preferential embodiment, the power interconnection tracks 211, 212 are interleaved (the power interconnection track 211 is surrounded by the power interconnection track 212) and concentric and on the same plane. In this case, the negative power terminals 2110 are folded so as not to interfere with the positive power interconnection track 212 (+BATT). In this way, it is possible to optimize the location of the recesses 214a, 214b in order to orient a cover according to the requirements of a customer connector making the connection of the machine with the outside. The power interconnection tracks 211 and 212 are not superimposed so as to allow electrical connection with the tracks of such a cover, the zone comprising the recesses 214a and 214b.

According to a second embodiment, the power interconnection tracks 211, 212 can be superimposed on one another. This is beneficial to the radial size.

Finally, it should be noted that each of the power interconnection tracks 211, 212 comprises a hole 217a, 217b making it possible to position the track in terms of x, y in a mould, the latter making it possible to carry out the plastic overmolding 213.

The power interconnection tracks 211, 212 have respectively negative power terminals 2110 (–BATT) in an L shape, and positive terminals 2120 (+BATT). The terminals extend radially towards the external periphery of the power interconnection piece 21. These terminals have curved free ends. The precise dimensions and position of the terminals 2110, 2120 are determined so as to enable them to be positioned above the ends of the electrical conductors 104, 103 of each of the modules in order to be able to be connected to the tracks by means of welding, brazing or weld-brazing for example. This configuration of the power terminals (in an L shape and having ends curved by bending) on the outside diameter thus facilitates the assembly with the modules. These terminals thus make it possible to obtain an electrical connection with the corresponding electrical conductors 103, 104 of the electronic modules 10 so that the electrical power is distributed in each of the modules. It will be noted that the positive power interconnection track 212 overlaps the negative power terminals 2110.

The overmolding 213 comprises a first recess 214a for an electrical connection of the power interconnection track 211, preferably by laser welding, with a cover to the battery, and a second recess 214b in the overmolding for an electrical connection of the power interconnection track 212, preferably by laser welding, with a cover to the battery.

Moreover, the overmolding 213 comprises assembly recesses 216 enabling an assembly tool to pass through the plate and assemble the rear dissipator bearing with a front bearing.

It should be noted that the ends of the power terminals 2110 and 2120 are not overmolded so that the ends can bear on the ends of the electrical conductors 104, 103 of the modules. Preferentially, the whole of the power terminal piece is not overmolded so that assembly on the ends of the tracks is facilitated. This is because this affords more bending in such an assembly.

The lugs 215 extend substantially radially over the external periphery of the interconnection plate. Each of the lugs 215 is provided with an orifice making it possible to pass therein, when the various modules and the other elements of the arrangement are assembled, fixing means such as threaded rods or bolts or studs or any other suitable fixing element.

Figure 13A:
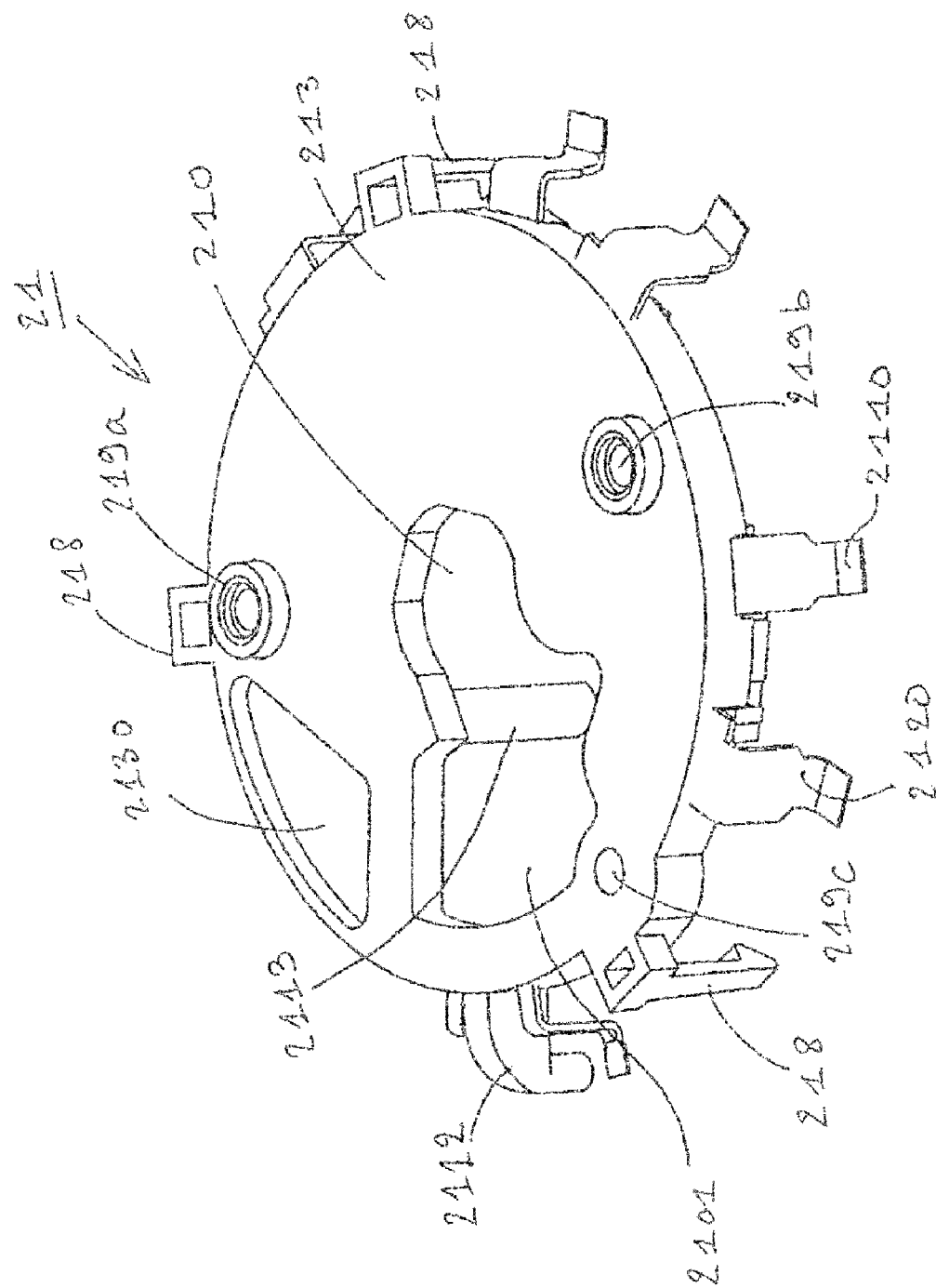
FIG. 13A depicts a second embodiment of a power interconnection piece intended to be in contact with a module of FIG. 3A and to be situated above the signal interconnection piece of FIG. 10A.
Figure 13B:
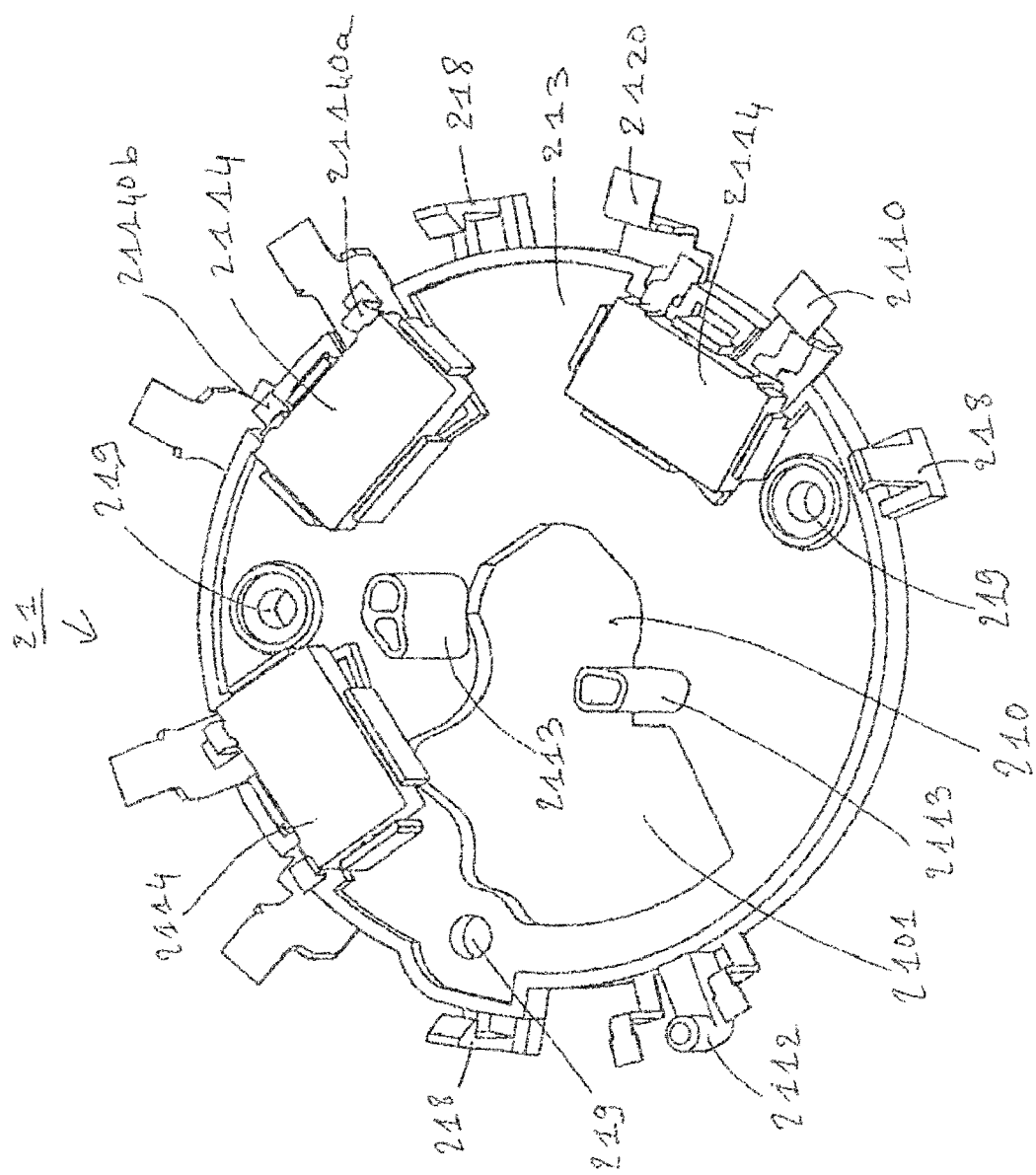
FIG. 13B is a view from below of the piece of FIG. 13A.
Figure 13C:
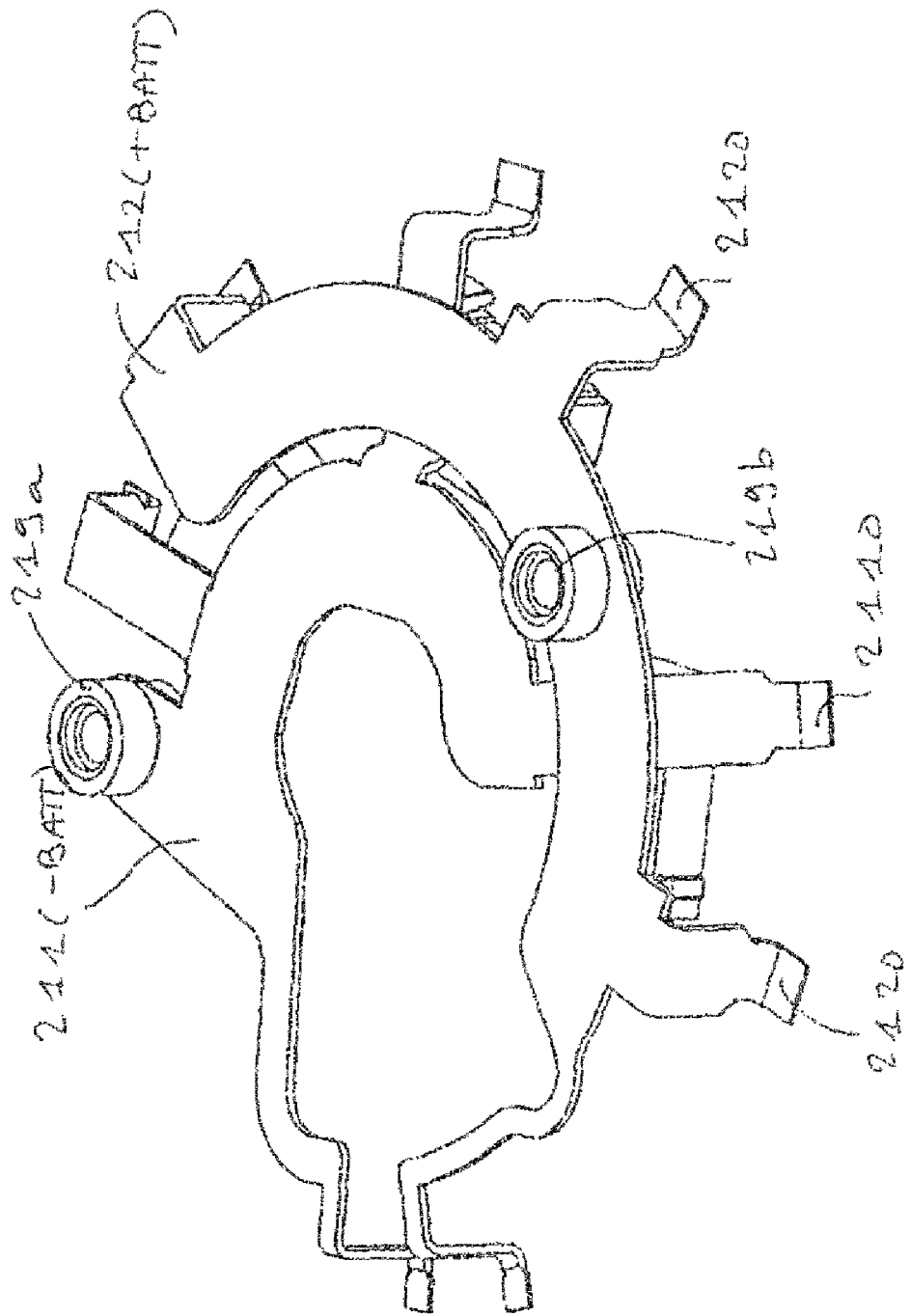
FIG. 13C is a view without overmolding of the piece of FIG. 13A.

In a second non-limitative embodiment, illustrated in FIGS. 13A to 13C, the power interconnection piece 21 comprises:
  a supplementary central recess 2101;
  at least one fixing clip or lug 218;
  inserts 219a, 219b for receiving holding studs;
  a mechanical stop 2112;
  at least one support pin 2113; and
  an orifice 219c.

The elements of the power interconnection plate are described in detail below.

The supplementary central recess 2101 allows the insertion of the brush holder with its protector. In this case, the brush cage protector is an independent piece assembled on the brush holder, and the brush holder may be removable with respect to the control/excitation module, which facilitates maintenance of the machine in particular in a replacement context, that is to say when the brushes (and therefore the brush holder) are changed when they are worn. Thus, instead of changing all the electronics (the modules and the two plates), only the brush holder will be changed (if the electronics are not faulty).

The fixing clips or lugs 218 enable the power interconnection piece 21 to be held mechanically on the signal interconnection piece 22, here three.

The inserts 219a and 219b for receiving the holding studs, here two in total, and for connecting the power interconnection tracks 211, 212 to a cover 70. The two inserts 219a, 219b make it possible to gain access to the power tracks so that an overmolding 213 can be effected on the tracks as illustrated in FIG. 13A. These two inserts thus allow mechanical holding of the plate 1 and an electrical connection.

The last orifice 219c permits solely mechanical holding of the power interconnection piece 21 by means of a stud.

The mechanical stop 2112 makes it possible to stop the power interconnection piece 21 in translation when it is assembled. It bears, for example, on the control/excitation module. In addition this stop has a shorter length than the power terminals 2110 and 2120 of the power tracks so that the terminals bear on the tracks of the corresponding modules before the stop bears on the control module. The stop is disposed on the outside diameter of the plate and projects beyond this plate.

The at least one support pin 2113, here two, enable the power interconnection piece 21 to bear on the dissipator bearing during assembly.

The power interconnection piece 21 comprises, as described in the first embodiment:
the central recess 210;
the power interconnection tracks 211, 212;
the negative 2110 and positive 2120 power terminals; and
the overmolding 213.

It should be noted that the overmolding 213 comprises here a recess 2130 for lightening the plastics material, the recess being possible since no facing power tracks exist. In the same way as in the first embodiment, the power terminals 2110 and 2120 are not overmolded.

The power interconnection tracks 211 and 212 are shown in FIG. 13C.

In addition, according to the first and second embodiments:
the power interconnection piece 21 can also integrate passive filtering components 2114 shown in FIG. 13B, for example capacitors connected between the power interconnection tracks 211 (−BATT), 212 (+BATT) via micro-tongues 21140a and 21140b. This makes it possible for example to filter the voltage of the on-board system of the motor vehicle and to filter in particular the oscillations due to the electrical conversion components, MOSs, diodes, etc.;
preferentially, the ends of the power tracks are flat and flush on the surface of the module. Thus the advantage of this configuration is being able to weld tracks on a power plate (described in detail below) to the ends of the tracks of a module by flat-on-flat transparency;
the power interconnection piece 21 can also integrate a brush cage protector (not shown) that makes the brush holder impervious. This gives one part less to assemble. The brush holder allows the supply of the excitation current issuing from the excitation module to the rotor via brushes. The protector then comprises positioning guides that will make it possible to position the protector opposite the brush holder;
preferentially, the positive terminals 2120 are rigid lugs defining a reference support plane for the power piece on the corresponding tracks of the modules; and
preferentially, the negative power terminals 2110 are flexible lugs for taking into account the assembly tolerances. Thus, when the modules and the plate are assembled, this will make it possible to deform the tracks of the power plate before welding by transparency. This thus facilitates putting the power interconnection tracks in contact with the corresponding tracks of the modules. It will be possible to use this flexibility also for the first embodiment, also for the third embodiment described below (although this is not necessary).

FIGS. 14A to 14E show a third non-limitative embodiment of the power interconnection piece 21.

The power interconnection piece 21 comprises:
inserts 210d for establishing a mechanical connection with the rear bearing of the machine;
stator phase protection means 211d;
means 212d of positioning on the rear bearing of the machine;
force stays 213d;
means 214d of positioning the plate in the dissipator 80;
a fixing terminal 215d for fixing the plate to the dissipator 80;
an electrical insert 216d;
a power connector 219d;
positive 221d (B+) and negative 222d (B−) tracks molded on in plastic;
positive power terminals 217d issuing from the positive track B+;
means 218d of protecting the positive power terminals 217d;
a terminal 220d for mechanical connection to a client power connector (not shown) connected to the battery; and
a mechanical connection orifice 220e connected to the connection terminal 220d.

The elements of the power interconnection plate are described in detail below.

The inserts 210d for establishing a mechanical connection with the rear bearing of the machine, by means of screws for example, here four in total:
the stator phase protection means 211d are situated on the outside diameter of the plate and project beyond the plane of the plate, the means preventing contact between a stator phase and the dissipator mass or bearing mass in particular;
the means 212d of positioning on the rear bearing of the machine, the means being here a positioning pin, extend on the bottom face of the plate, the pin advantageously being positioned in an oblong hole that is the machining reference orifice of the bearing;
the force stays 213d allow downward axial deformation of the power plate in order to avoid vibration problems, the stays preferentially having a greater height than the inserts 210d in order to be sure of deforming the plate, the stays extending over the top face of the plate;
the means 214d of positioning the plate in the dissipator 80, here two, extend over the top face of the plate;
the fixing terminal 215d makes it possible to fix the plate to the dissipator 80 by means of a nut, and is connected to the negative power track B−, which effects an earthing of the dissipator;

the electrical insert 216d is intended to be assembled with the terminal 215d on the track 222d, the track thus being sandwiched by the insert and the terminal, which thus avoids difficult welding to be performed between the dissipator, which is preferentially made from cast aluminum, and the copper power track;

the power connector 219d comprises a negative track B+ and a positive track B+;

the power terminals 217d issuing from a positive track B+ are here in an L shape and have an axial tongue, i.e. perpendicular to the plane of the power interconnection piece 21 and projecting beyond the plane upwards; the terminals are not overmolded to allow connection with the end of the positive electrical conductor 103 (B+) of an electronic module, the terminals extending towards the external periphery of the signal interconnection piece 22;

the means 218d of protecting the positive power terminals 217d protect against short-circuits and salt spray in particular;

the positive 221d (B+) and negative 222d (B−) tracks are molded on in plastic 213 for example, tracks that can be seen in FIG. 14C. The tracks are visible on the power connector 219d, which allows the fitting of the client power connector to make the electrical connections between the connector and the tracks;

the terminal 220d connecting to the client connector connected to the battery, the terminal making it possible to effect a pressing between the tracks 221d and 222d and the tracks of the client power connector so that the current can be established correctly between the battery and the machine; and a mechanical connection orifice 220e for a screw, thus avoiding the transmission of the mechanical stresses on overmolding when the client power connector is fixed to the connecting terminal 220d.

Figure 14A:
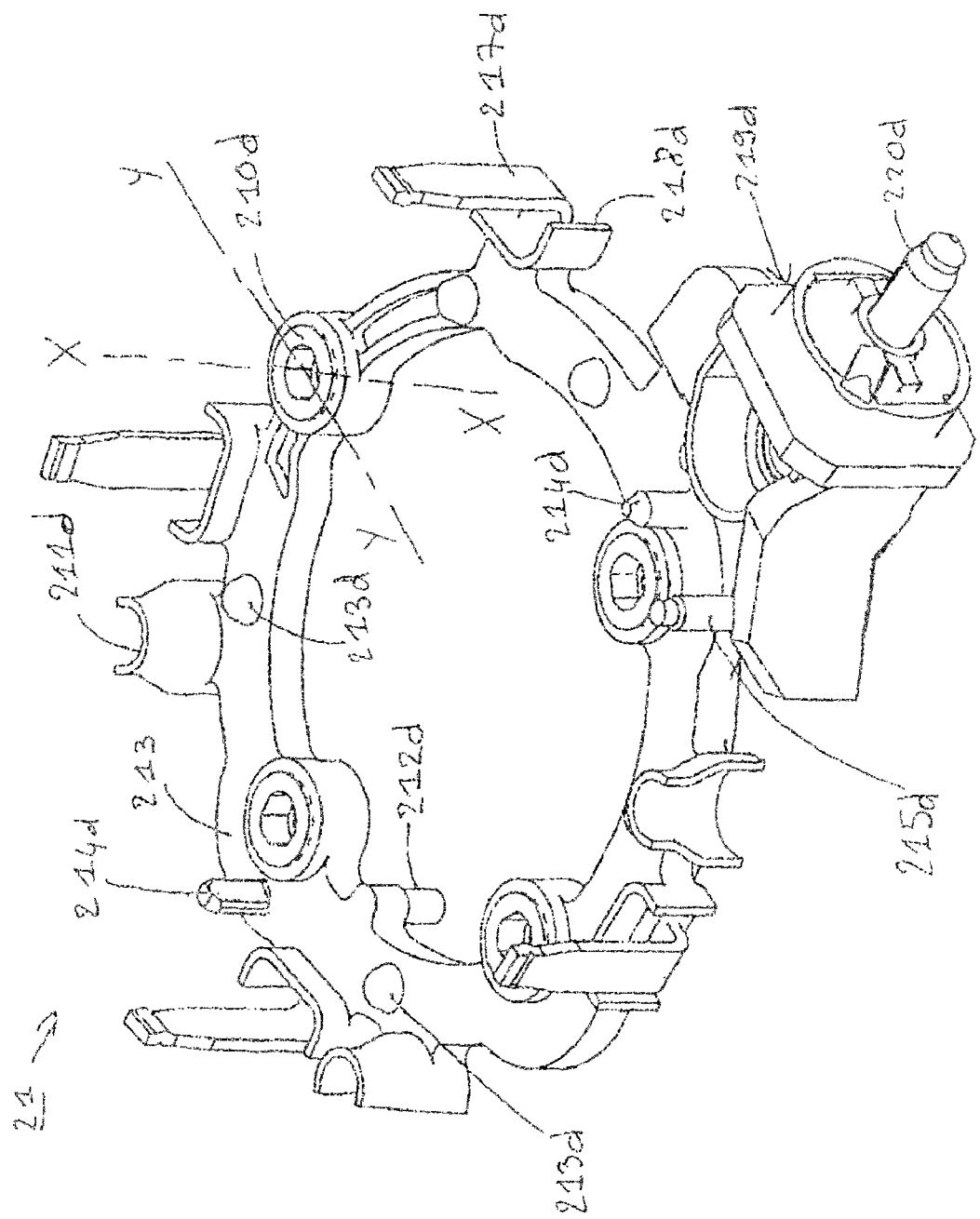
FIG. 14A shows a third embodiment of a power interconnection piece intended to receive a dissipator of FIG. 8A.
Figure 14B:
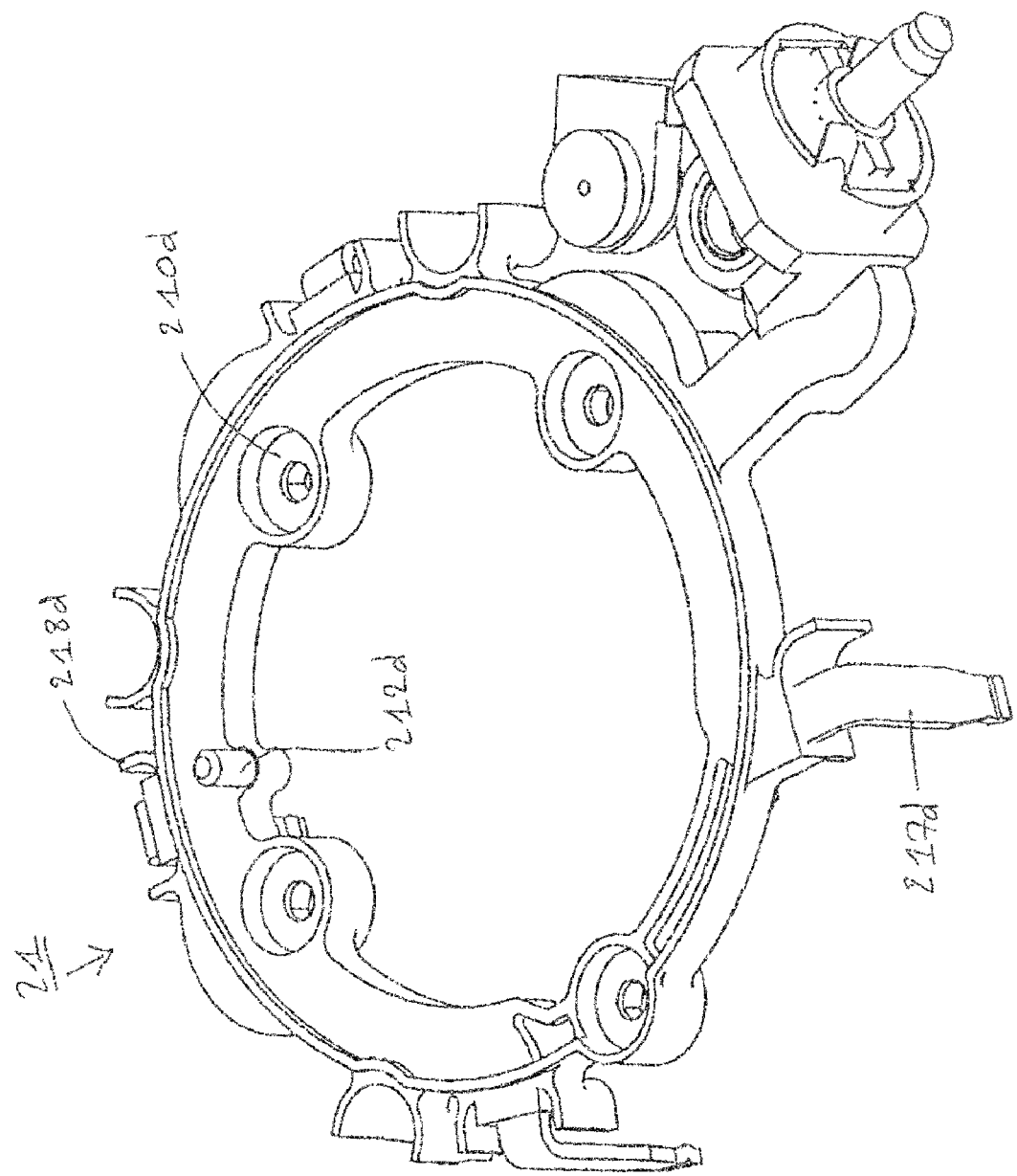
FIG. 14B is a view from below of the piece of FIG. 14A.
Figure 14D:
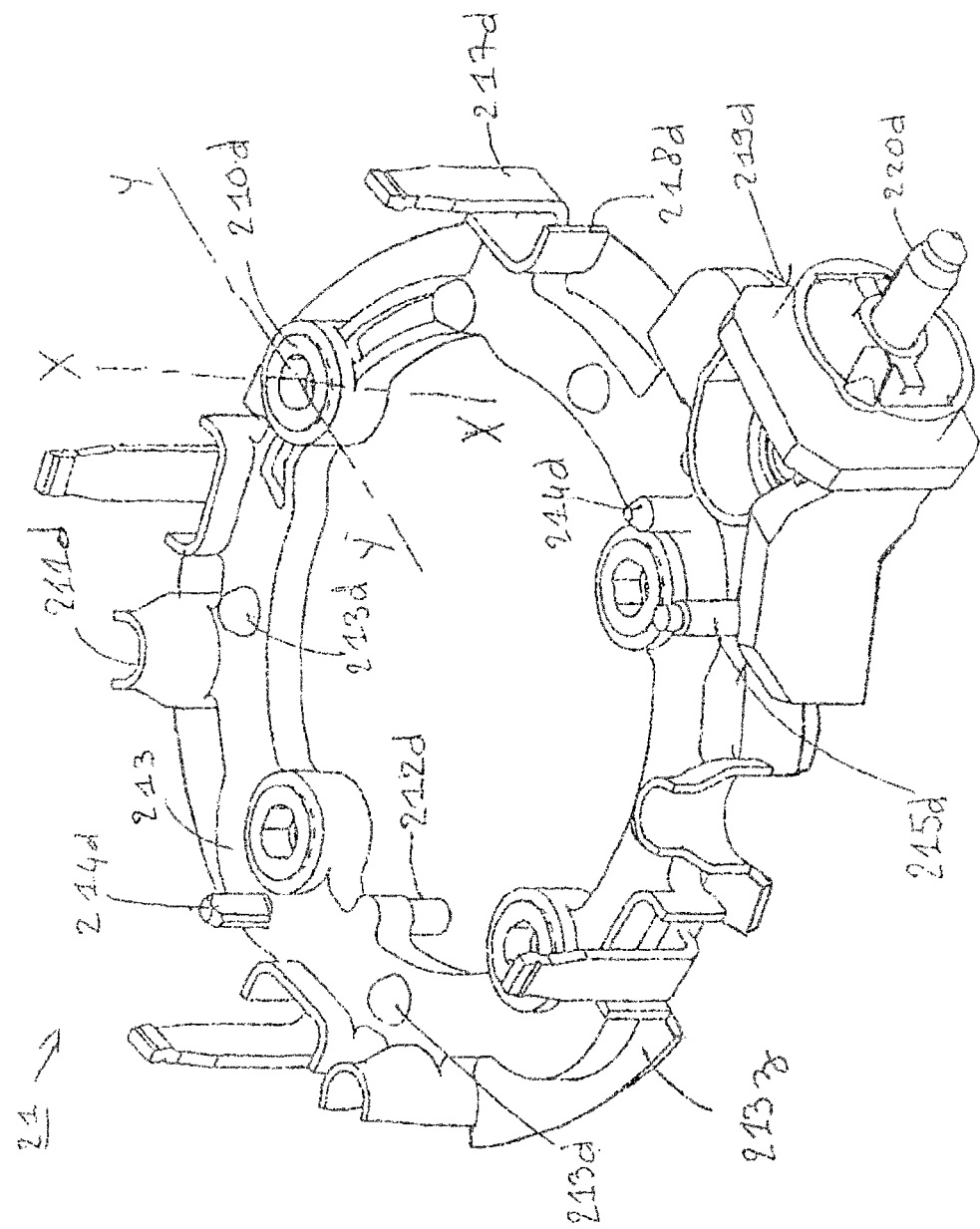
FIG. 14D is a view of the piece of FIG. 14A including a collar.
Figure 14E:
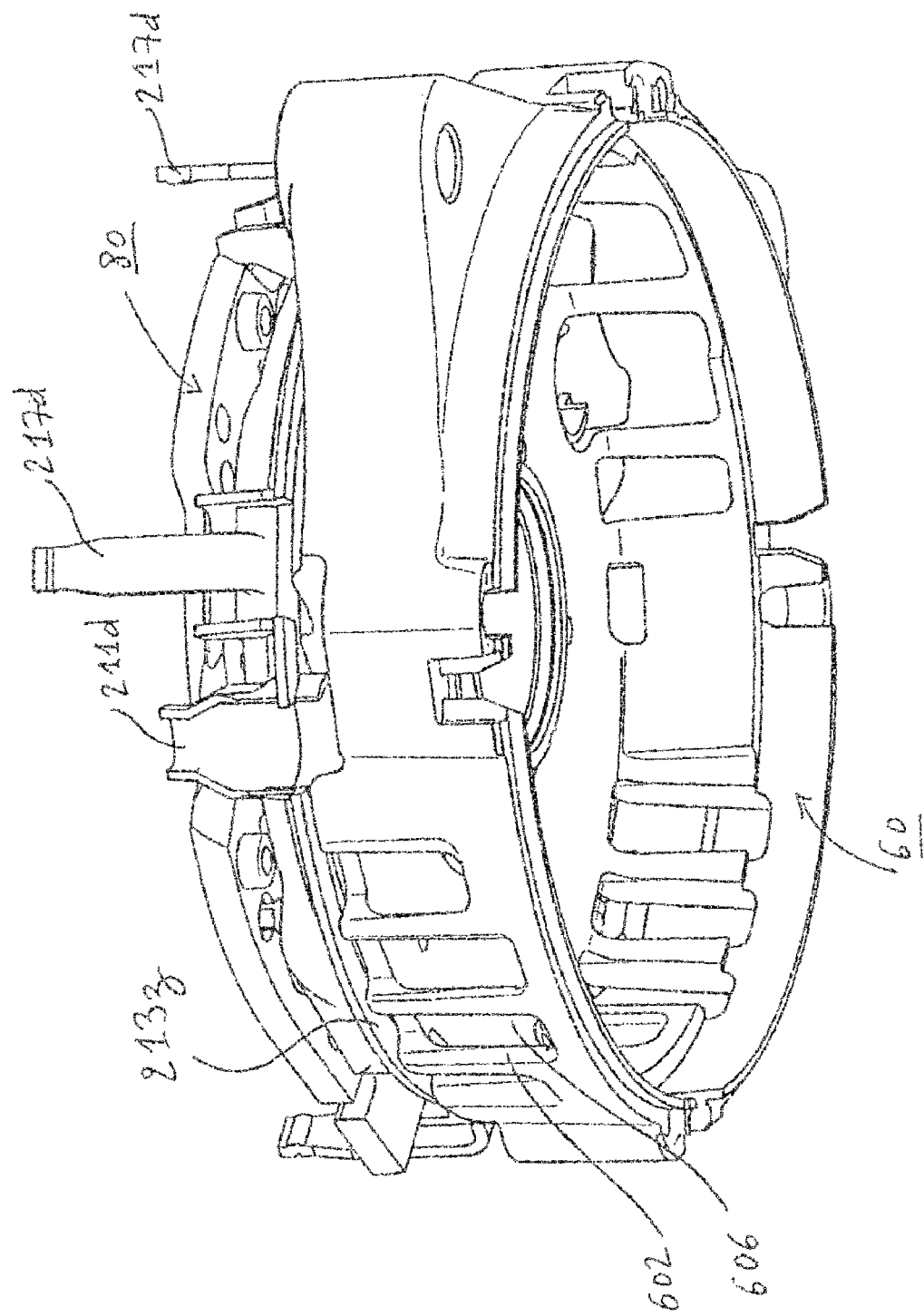
FIG. 14E is a view of the piece of FIG. 14D on a dissipator bearing.

Preferentially, in a variant embodiment, as depicted in FIG. 14E, the overmolding 213 of the power interconnection piece 21 covers the air outlet openings of the bearing (as far as the outside diameter of the bearing) so as to guide the discharged air in order to reduce a radial looping back of the air towards the inside of the machine. Thus the said overmolding comprises a covering collar 213z shown in FIG. 14E.

Thus the power plate has the advantages of:

having a single track without overlap, the track making it possible to effect easier molding and positioning;

being fixed under the dissipator 80 and therefore being separated by a mass from the signal interconnection piece 22, so that the power signal B+ does not interfere with the signals from the signal interconnection piece 22;

a saving in axial size since the power interconnection piece 21 is positioned in the space necessary for the fins of the dissipator; and enabling the dissipator to be an isolated mass (with respect to that of the bearing) or not, and therefore a different mass from that of the bearing, thus avoiding interference of the on-board system during starting in particular.

It will be noted that, by virtue of the presence of the power interconnection piece 21, there is a large cross-section of copper for conveying the power necessary to the functioning of the machine (150A in alternator mode, 600A on starting) unlike a solution in which the power tracks are integrated in a band also comprising the electronic power modules.

Figure 15A:
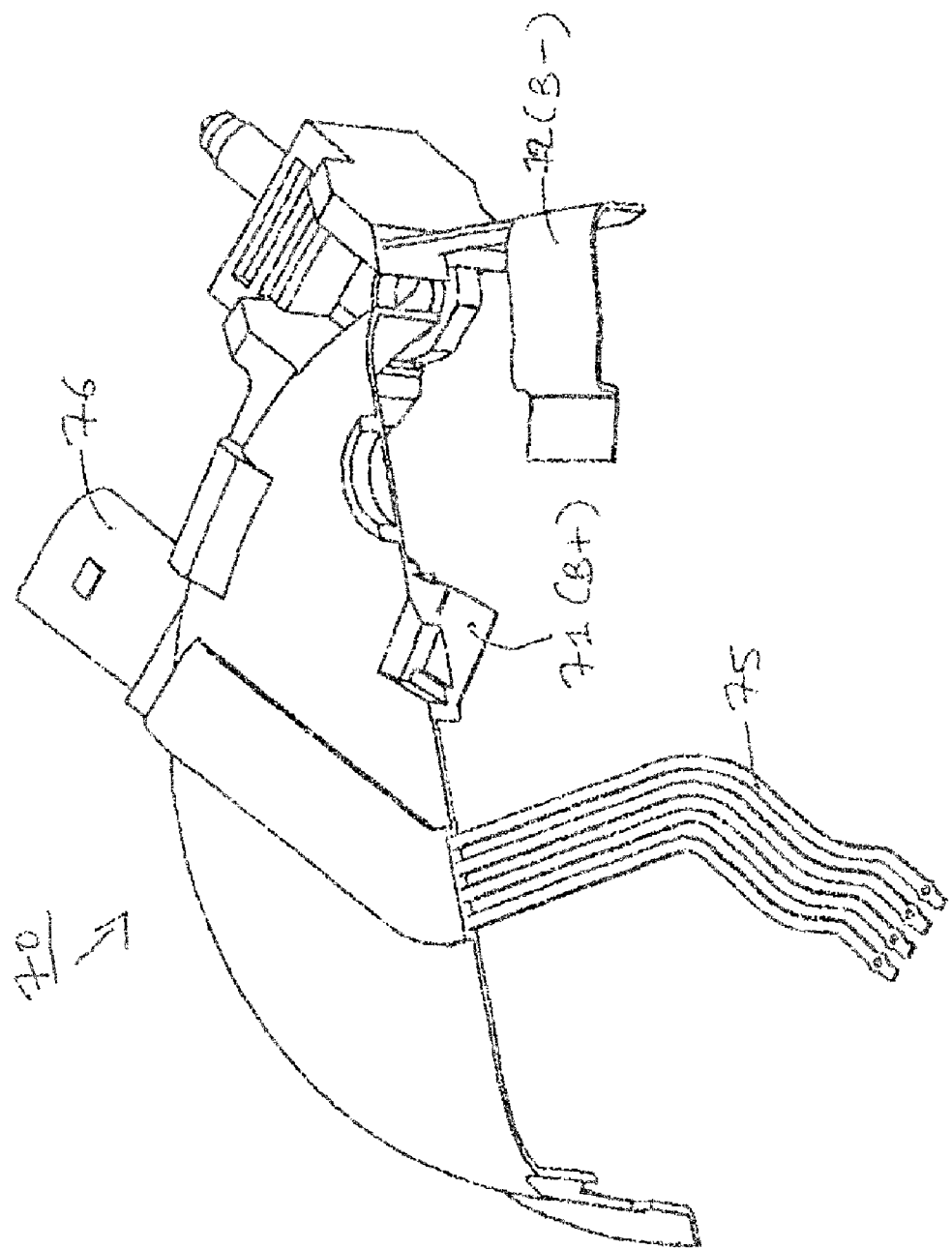
FIG. 15A is a first embodiment of a cover intended to be situated on top of the power piece of FIG. 12A.
Figure 15C:
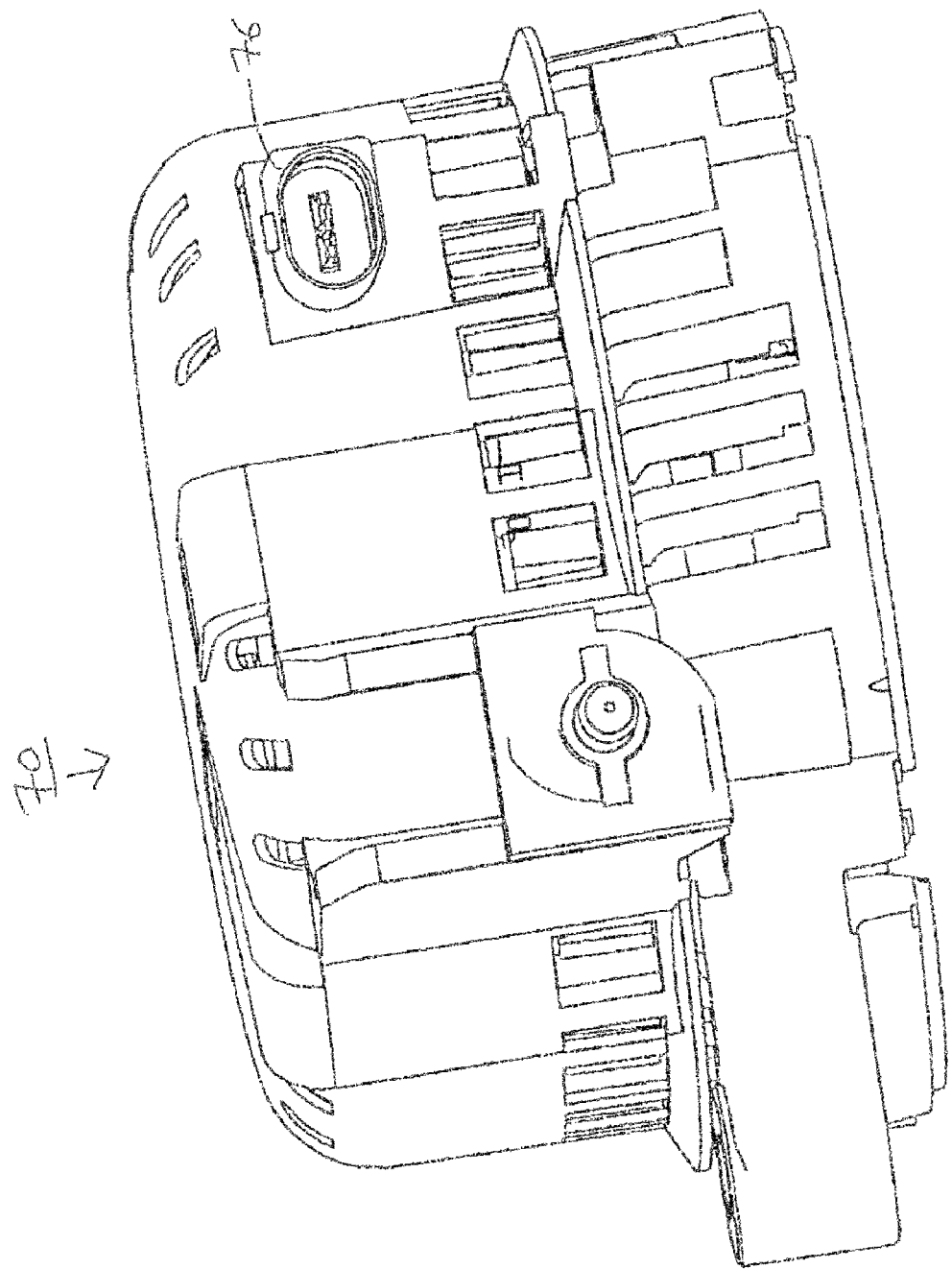
FIG. 15C is a side view of the cover of FIG. 15A.

According to a first non-limitative embodiment, the cover 70 as illustrated in FIGS. 15A to 15C comprises:

positive 71 (B+) and negative 72 (B−) power tracks;

two openings 74 for effecting welding of the power tracks 71, 72 with the corresponding tracks of the power interconnection piece 21;

signal tracks 75 affording a connection between the modules and signal connections 76;

signal connections 76;

grooves or orifices 77 for positive location; and fixing orifices for fixing screws or nuts 78 for example.

The elements of the cover are described in detail below.

The power tracks 71, 72 are intended to electrically connect the power interconnection tracks 212, 211 of the power interconnection piece 21 providing the connection between the client power connector of the motor vehicle. The power tracks 71, 72 are molded on in the cover 70 and laser welded to the two power interconnection tracks 212, 211 of the power interconnection piece 21. The electrical connections are made between these two elements, for example through the opening 74 provided for this purpose. The electrical connections can be made by welding, in particular by laser welding or weldbrazing, as well as by brazing or by mechanical contact. In the latter case, the mechanical contact is obtained for example by fixing screws for the cover 70 exerting a pressure on the tracks.

The signal connections 76 afford a dialogue with the other electronic boxes of the vehicle. These connections comprise signal tracks 75 integrated in the cover 70 and connected on the one hand to the control module 30 and at the other end to the client signal connector (not shown). The client signal connector comprises a cable for connection to a control means such as for example a computer controlling various functions of the vehicles such as for example the management of the rotary electrical machine according to its generator or motor functions.

The grooves or orifices for positive location 77 make it possible to position the cover 70 correctly on the guides 107 of the control module 30. The grooves or orifices thus engage with guides 107 of the control module 30.

According to a second non-limitative preferential embodiment, illustrated in FIG. 16, the cover comprises:

openings 79 intended to receive fixing means such as studs in place of screws.

It also comprises the following elements described in the first embodiment:

the power tracks 71, 72;

the element 73 for connection to the on-board system;

the two openings 74;

the signal track 75;

the signal connections 76; and the grooves or orifices 77 for positive location.

It should be noted that the cover 70 as described in the two embodiments is intended to be a part specific to each client because of the specific location and the type of client connector or connectors used.

Figure 17A:
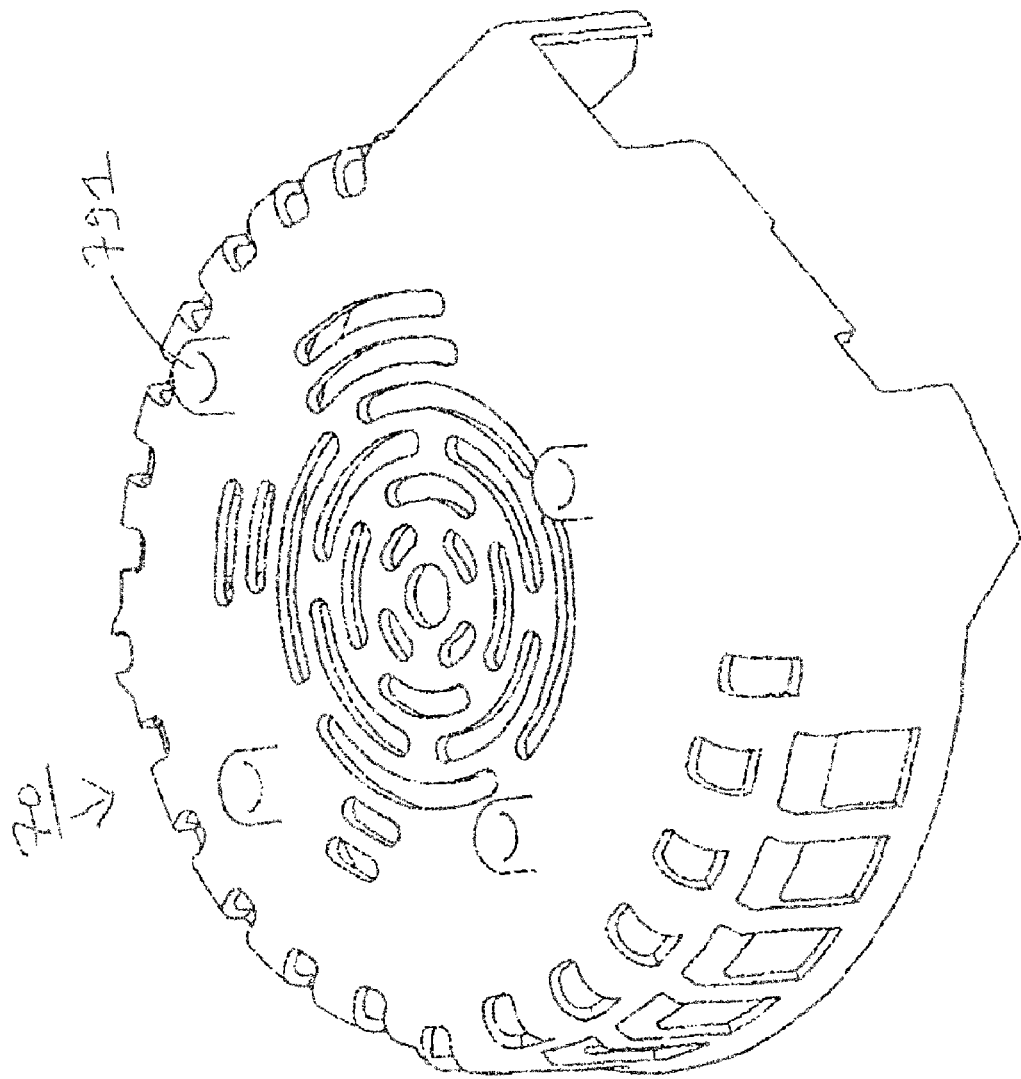
FIG. 17A is a third embodiment of a cover intended to be situated on top of the signal interconnection piece of FIG. 11A.
Figure 17B:
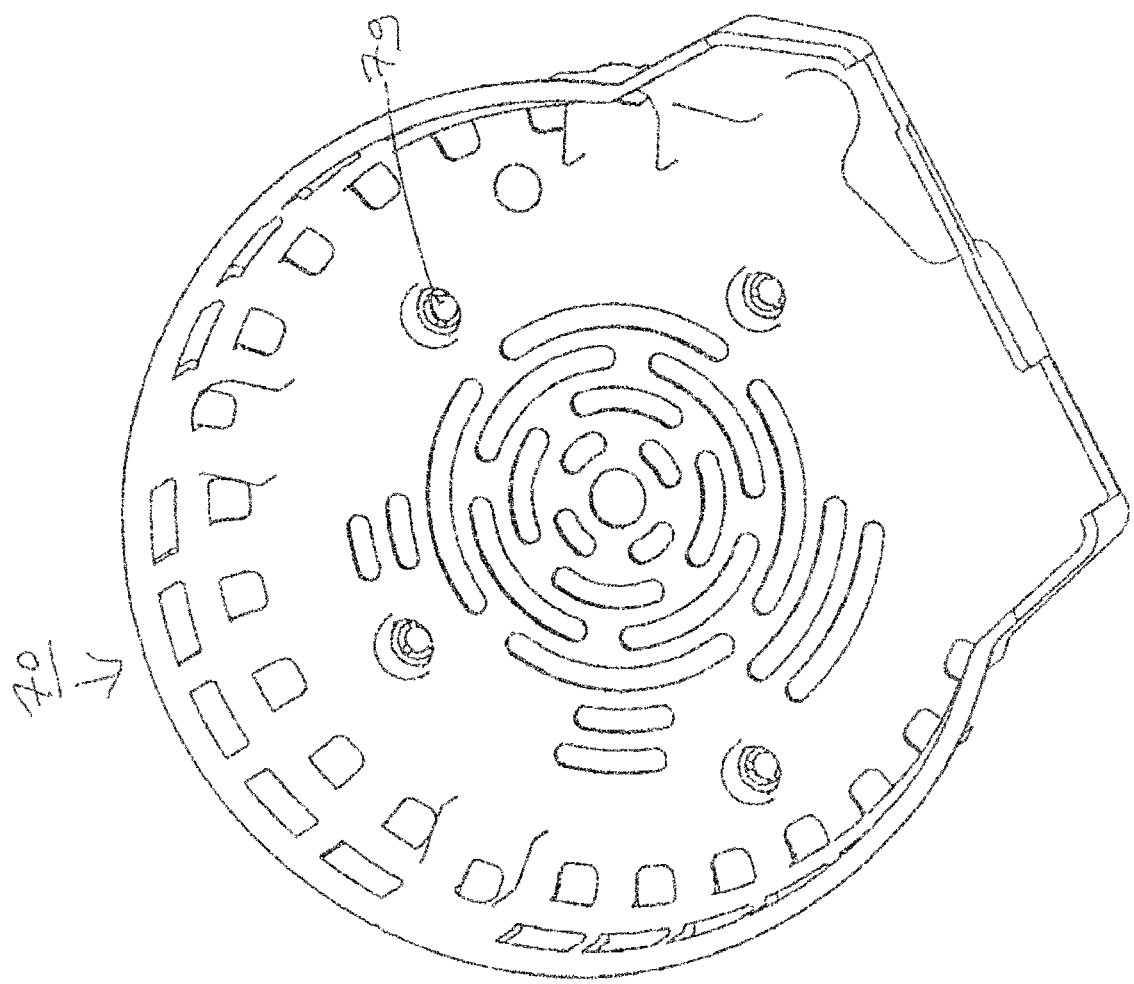
FIG. 17B is a view from above of the cover of FIG. 17A.

According to a third non-limitative preferential embodiment, illustrated in FIGS. 17A and 17B, the cover is a simple cover that comprises solely fixing clips 791 for the cover fitting on studs 226g of the signal interconnection piece 22 fixing the assembly. It no longer comprises any track or connector. There is only plastics material.

After having seen all the elements that cooperate with the electronic modules, we describe below their assembly.

As will be seen in detail below, the electronic modules are fixed to the rear bearing of the machine in several ways:

either on the bearing directly (dissipator bearing with fins or water integrating or not heat pipes); or on a non-integrated dissipator (with fins or water integrating or not heat pipes).

According to a first method of assembling the modules, an electronic module interfaces with the following elements:

a dissipator bearing 60;

a signal interconnection piece 22 according to the first or second embodiments;

a power interconnection piece 21 according to the first or second embodiments; and a cover 70 according to the first or second embodiments.

Thus the 1$^{st}$ method of assembling all the parts described above is effected in the following manner.

In a first step 1), the electronic module or modules are mounted on the dissipator bearing 60.

The positioning of each module on the dissipator bearing 60 is facilitated by the two positioning pins 109a, 109b, which will be situated opposite each orifice 609a, 609b of the corresponding dissipator bearing 60.

The modules are fixed to the dissipator bearing 60 on the one hand by means of an adhesive, for example with glass balls, and on the other hand mechanically in two different ways.

Figure 18:
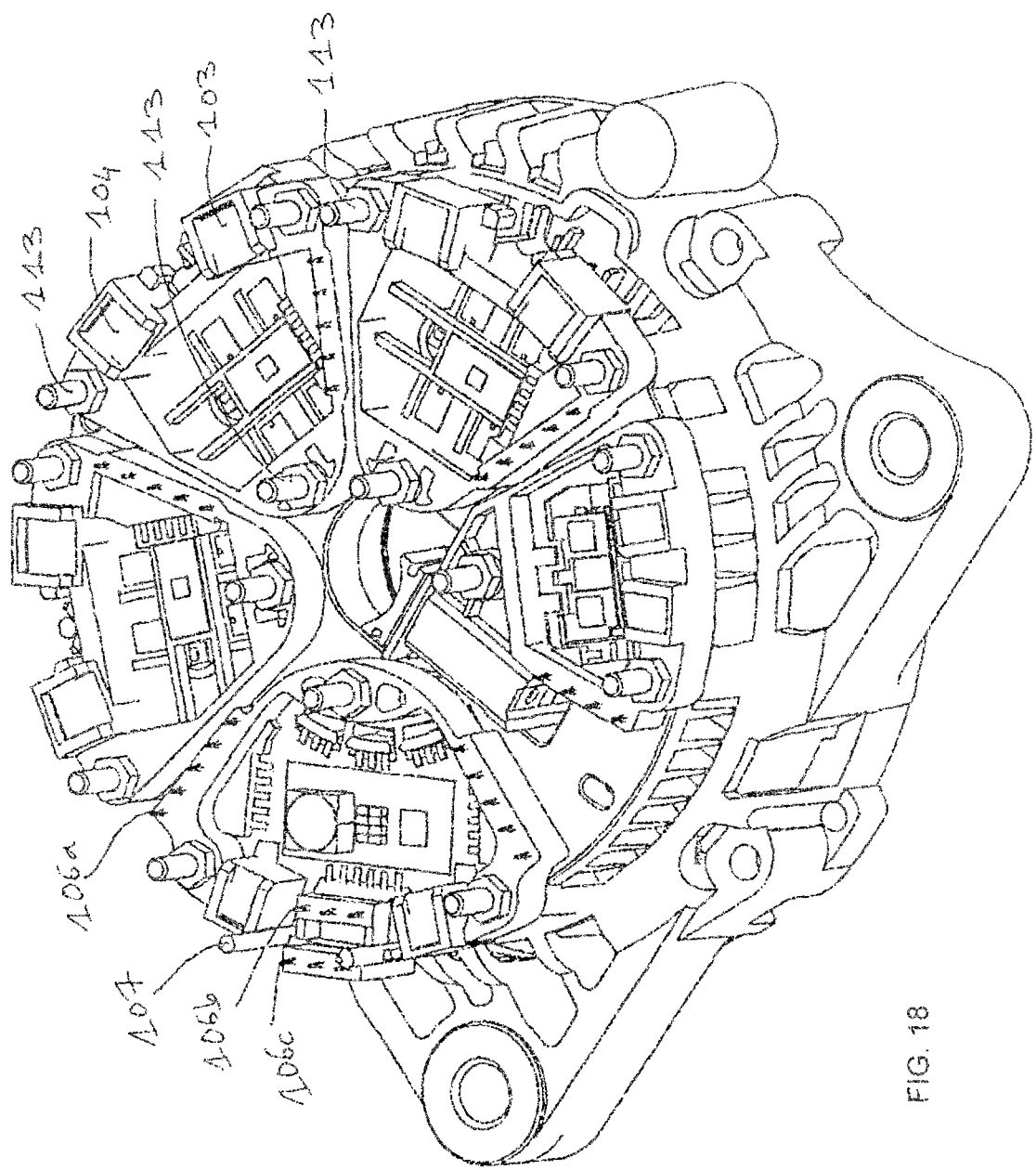
FIG. 18 depicts a mounting of an electronic module of FIGS. 1A and 2A on a dissipator bearing.

According to a first non-limitative way, illustrated in FIG. 18, each of the modules is fixed by three studs 113. The three studs are inserted in the corresponding orifices 608 in the bearing. FIG. 18 shows the assembly of five modules, three power modules 20, a control module 30 and an excitation module 40.

Figure 24:
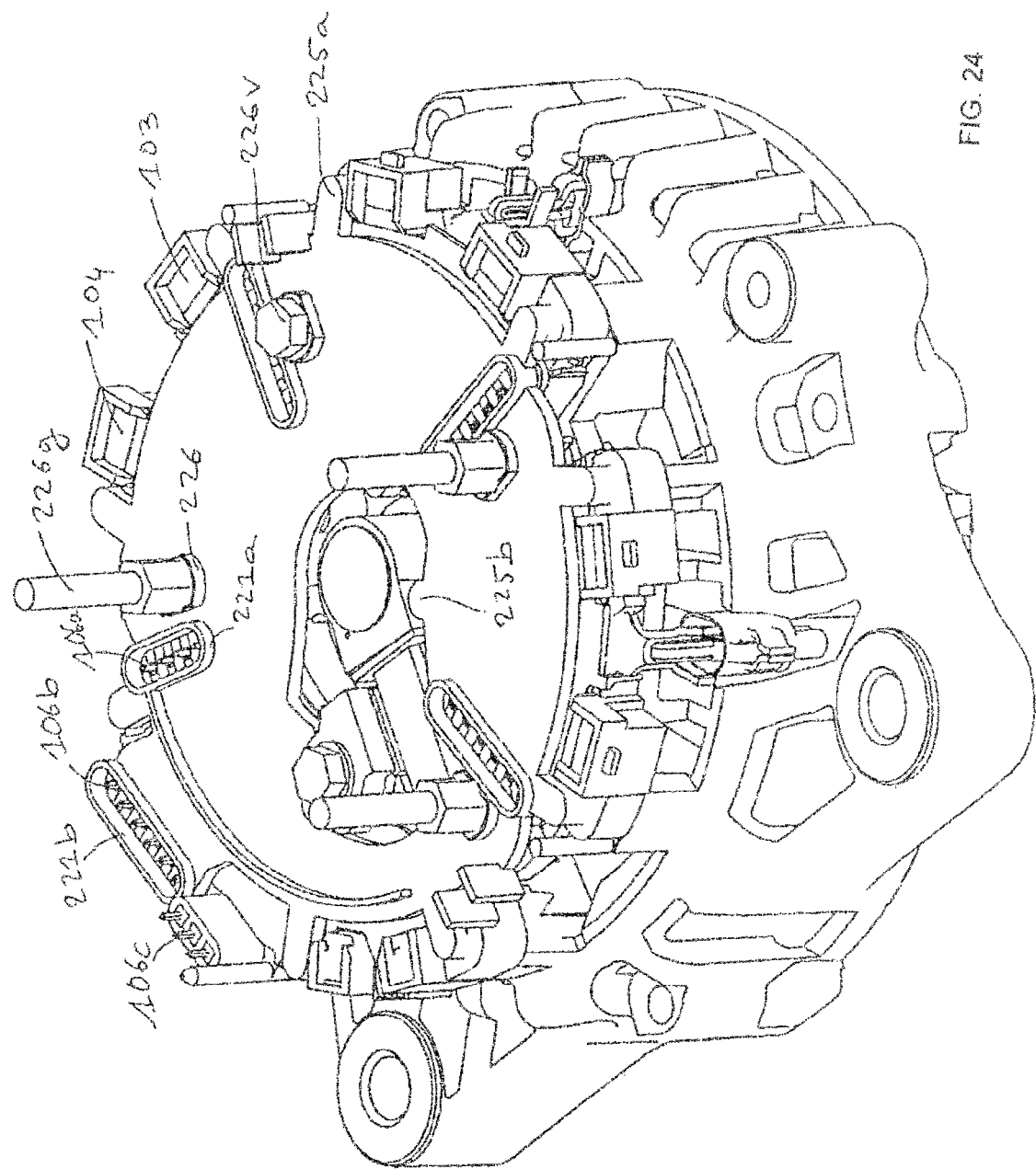
FIG. 24 depicts a mounting of the signal interconnection part of FIG. 10A on the dissipator bearing/modules assembly of FIG. 23.

According to a second non-limitative preferential way, illustrated in FIG. 24, the fixing is effected by means of:

three studs 226g that are put in place after the installation of the signal interconnection piece 22 and that are inserted in the corresponding orifices 681, 682, 683 in the dissipator bearing 60, and a screw 226v that is inserted in the associated orifice 684 in the bearing.

Figure 23:
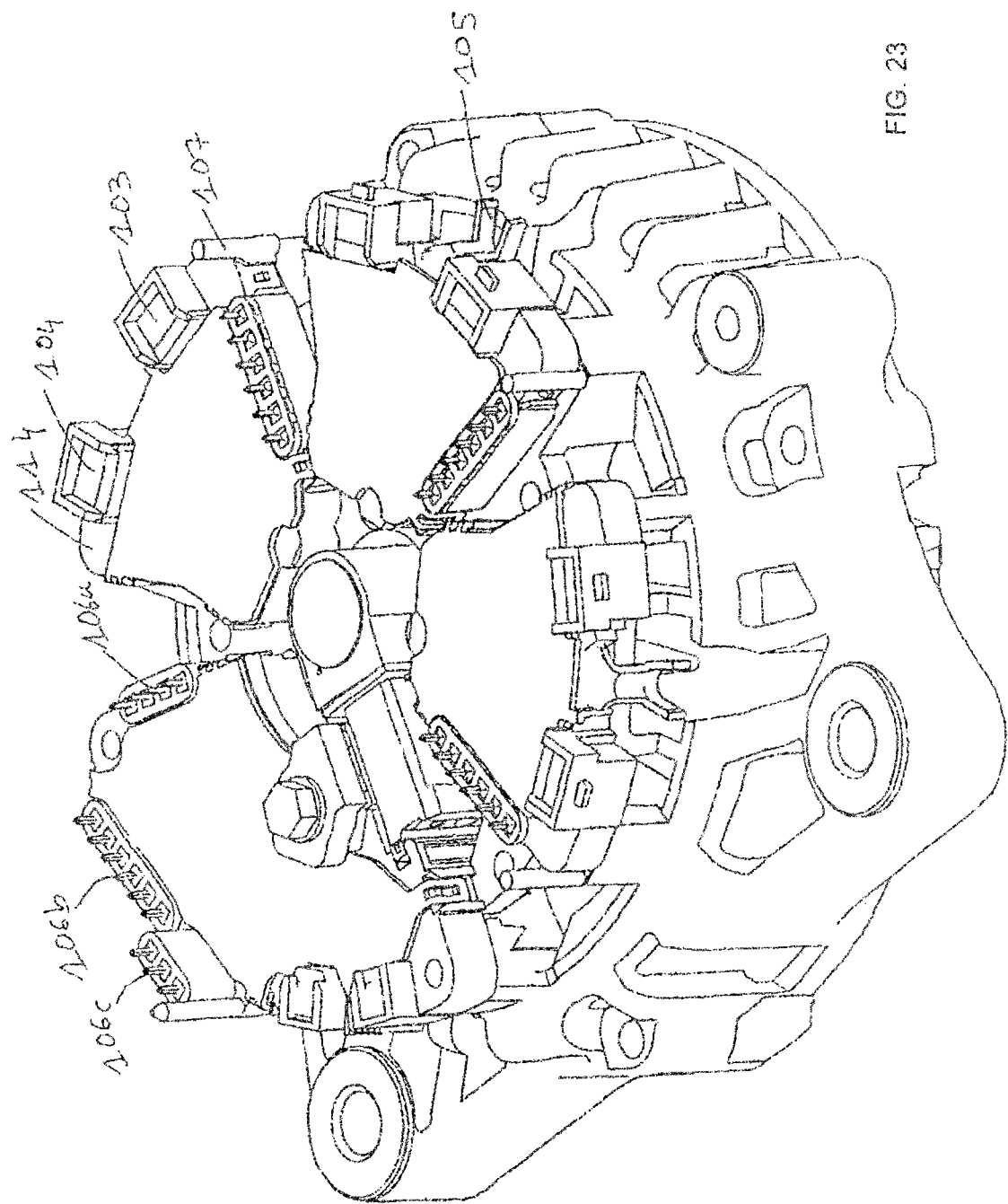
FIG. 23 depicts a mounting of an electronic module of FIG. 3A on a dissipator bearing.

FIG. 23 shows the assembly of four modules, three electronic modules 10, one control/excitation module.

For the two ways, all the modules are preferentially arranged in the same plane perpendicular to the rotation axis of the rotor of the electrical machine, just like the power tracks and the signal connections, in order to facilitate their assembly.

However, in a variant of what is presented in the previous figures, the modules can be disposed on different planes.

In a second step 2), the signal interconnection piece 22 is mounted on the electronic modules. Because of this, the plate is as close as possible to the modules in order to reduce the length of the signal connections as far as possible and to prevent plugging problems. In this way, the signal connection element 106 of the modules are short; thus their deformation is better controlled (they are less deformable), the connections preferably being flexible.

The signal interconnection piece 22 is fixed to the module/bearing assembly in two different ways corresponding to the two ways of fixing the modules to the bearing as described previously.

Figure 19:
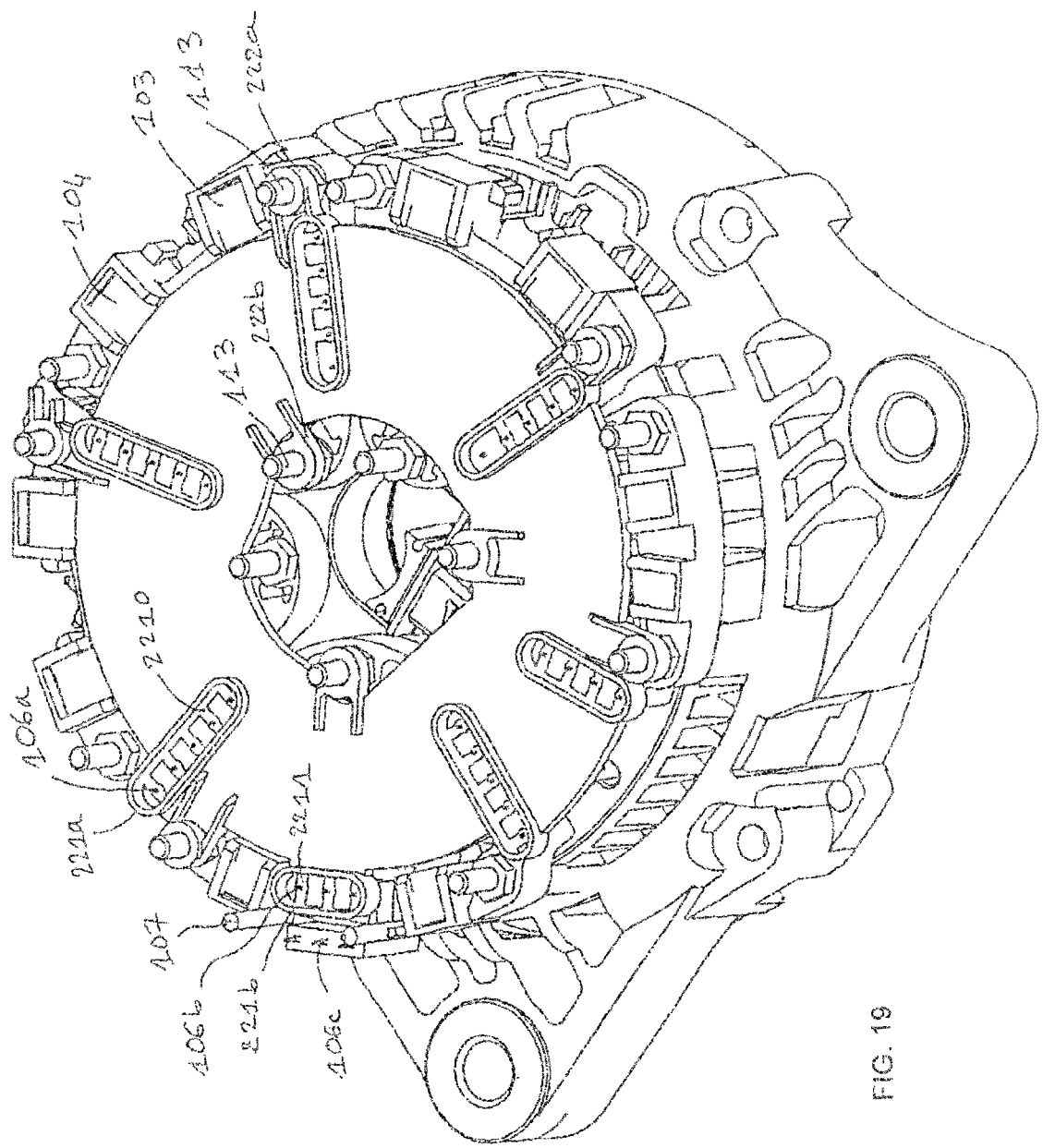
FIG. 19 depicts a mounting of a signal interconnection piece of FIG. 9 on the dissipator bearing/modules assembly of FIG. 18.

According to a first non-limitative way, illustrated in FIG. 19, the signal interconnection piece 22 is positioned by means of the positioning studs 224, which are positioned opposite the positioning orifices 601a and 601b of the bearing. Thus, by virtue of this positioning:

the connection recesses 221a are placed opposite the signal tongues 106a of the modules;

the connection recesses 221b are placed opposite the signal tongues 106b of the modules; and the fixing lugs 222 are placed opposite the studs 113 of the electronic module 10.

Next, after pressing, the signal tongues 106a are inserted in the interconnection orifices 2210 of the metal signal tracks TS, the signal tongues 106b are inserted in the interconnection orifices 2211 of the metal signal tracks TS, and the lugs 222 are fixed to the studs 113.

According to a second non-limitative preferential way, illustrated in FIG. 24, the signal interconnection piece 22 is positioned on the modules by means of the positioning pins 224, which are positioned opposite the positioning orifices 610a and 610b of the bearing. Thus, by virtue of this positioning:

the connection recesses 221a are placed opposite the signal tongues 106a of the modules;

the connection recesses 221b are placed opposite the signal tongues 106b of the modules;

the stays 225a and 225b are placed opposite the support zones 114 of the modules; and the inserts 226 are placed opposite the corresponding orifices 681 to 684 in the bearing.

Next, after pressing, the signal connection elements 106 are inserted in the corresponding recesses 221, the stays 225 bearing on the support zones 114 of the modules.

The studs 226g, which are inserted in the recesses 221 in the signal interconnection piece 22 and orifices 681, 682, 683 of the dissipator bearing 60, are then fixed. The studs bear on the plate and consequently on the plate/modules/bearing assembly so as to afford better mechanical strength. In the same way, the screw 226v is screwed into the respective corresponding insert 226 and 684 in the signal interconnection piece 22 and dissioator bearing 60.

Thus the signal interconnection piece 22 is produced so as to exert a pressure on the power module 20 and the other modules 30, 40 in order to guarantee their holding throughout the life of the rotary electrical machine.

In a non-limitative embodiment, the material of the plate is PPS (phenylene polysulphide) plastic containing glass fibers.

Thus, according to these two ways, the signal plate is deformed in order to exert a pressure on the modules, the deformation preferably being approximately 0.3 mm. In this way, the detachment of the modules is prevented and stresses on the welds of the tongues are avoided.

In a third step 3), the power interconnection piece 21 is mounted on the bearing/modules/signal plate assembly. The power interconnection piece 21 is fixed above the signal interconnection piece 22.

The power interconnection piece 21 is fixed in two different ways.

Figure 20:
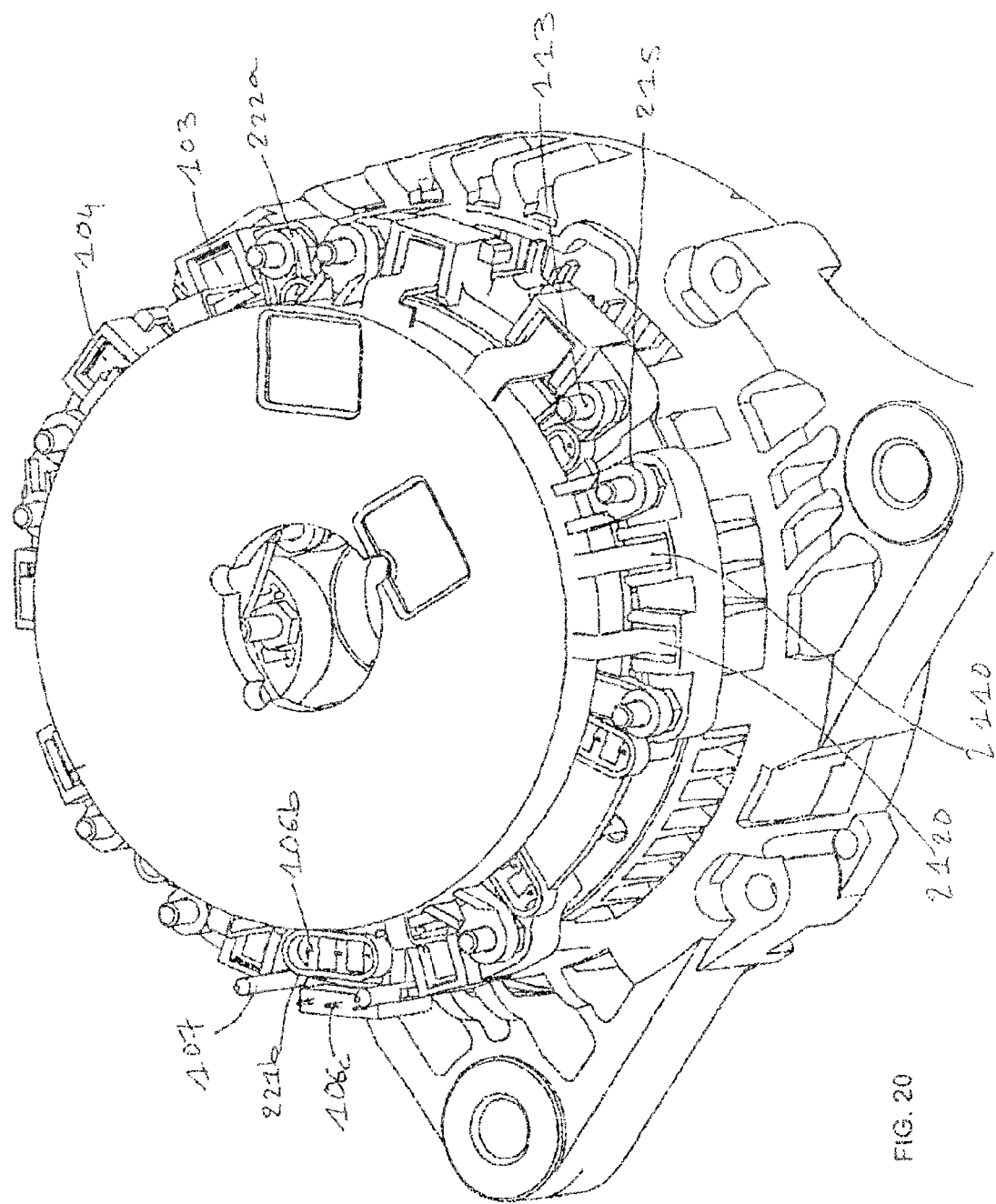
FIG. 20 depicts a mounting of the power interconnection part of FIG. 12A on the dissipator bearing/module/signal interconnection piece assembly of FIG. 19.

According to a first non-limitative way, illustrated in FIG. 20, the power interconnection piece 21 is placed on the signal interconnection piece 22 so that:

the fixing lugs 215 are placed opposite the studs 113 of the signal interconnection piece 22, the studs making it possible to position the power interconnection piece 21; and the power terminals 2120, 2110 are placed opposite the corresponding tracks of the electrical conductors 103, 104.

In the case of a brush holder, it is positioned so that it is inserted in the recess 605 and the brush cage protector in the recess 603 of the bearing.

Next, after pressing, the fixing lugs 215 are fixed on the studs 113, the power terminals 2120, 2110 bear respectively on the ends of the electrical conductors 103, 104 of the modules.

Figure 25:
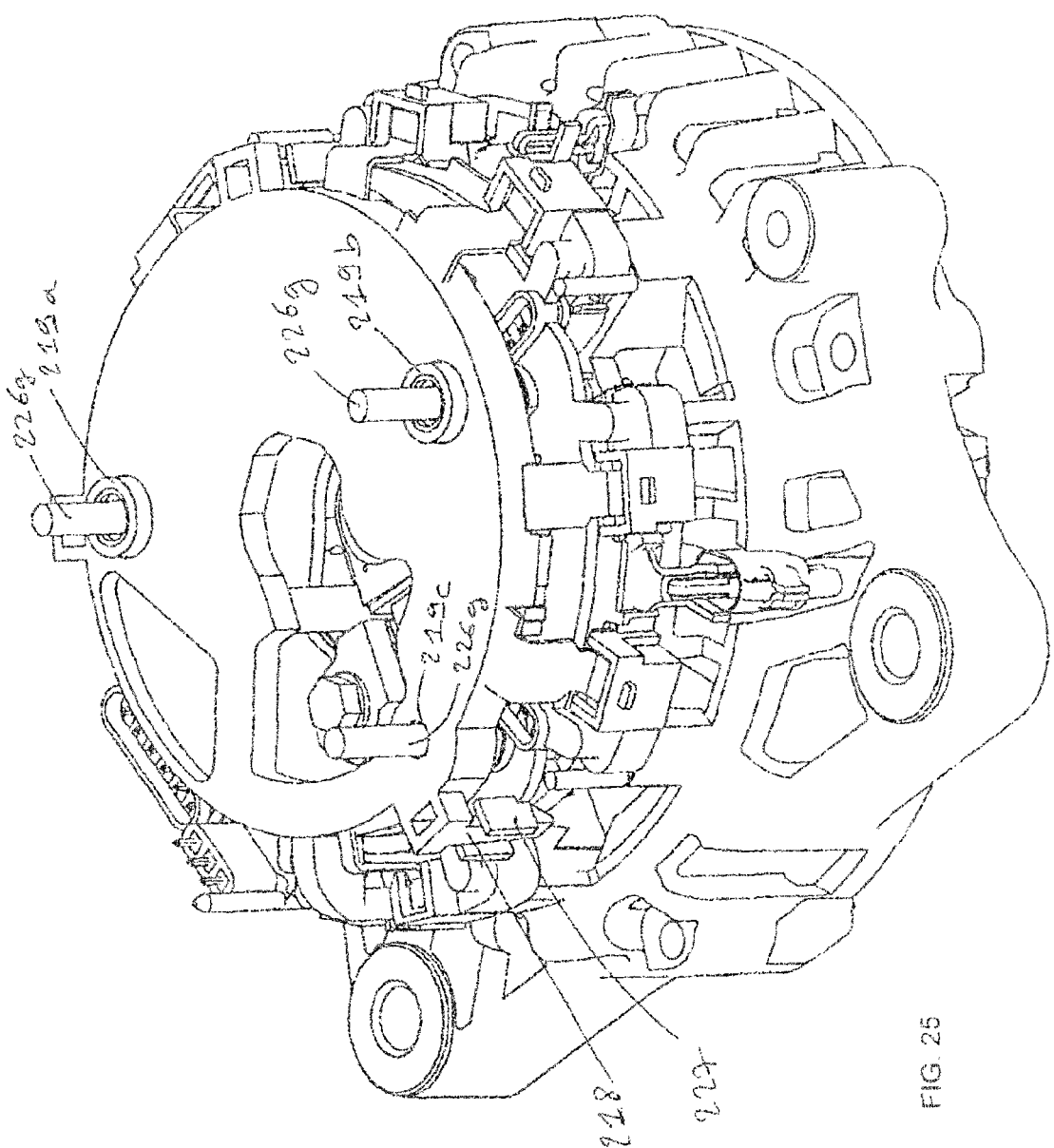
FIG. 25 depicts a mounting of the power interconnection part of FIG. 12A on the dissipator bearing/module/signal interconnection piece assembly of FIG. 24.

According to a second non-limitative preferential way, illustrated in FIG. 25, the power interconnection piece 21 is placed on the signal interconnection piece 22 so that:

the inserts 219 are placed opposite the studs 226g, the orifices and studs serving as a positive location device; and the lug 218 is placed opposite the holding clip 227 of the signal interconnection piece 22.

Next, after pressing, the inserts 219 are inserted on the studs 226g and the lug 218 snaps in the holding clip 227, and the orifice 219c is placed opposite a third stud 226g.

In a last step, the cover 70 is mounted on the assembly. In this way, the cover 70 forms a shroud for the rear bearing of the machine.

The cover 70 is fixed in two different ways.

Figure 21:
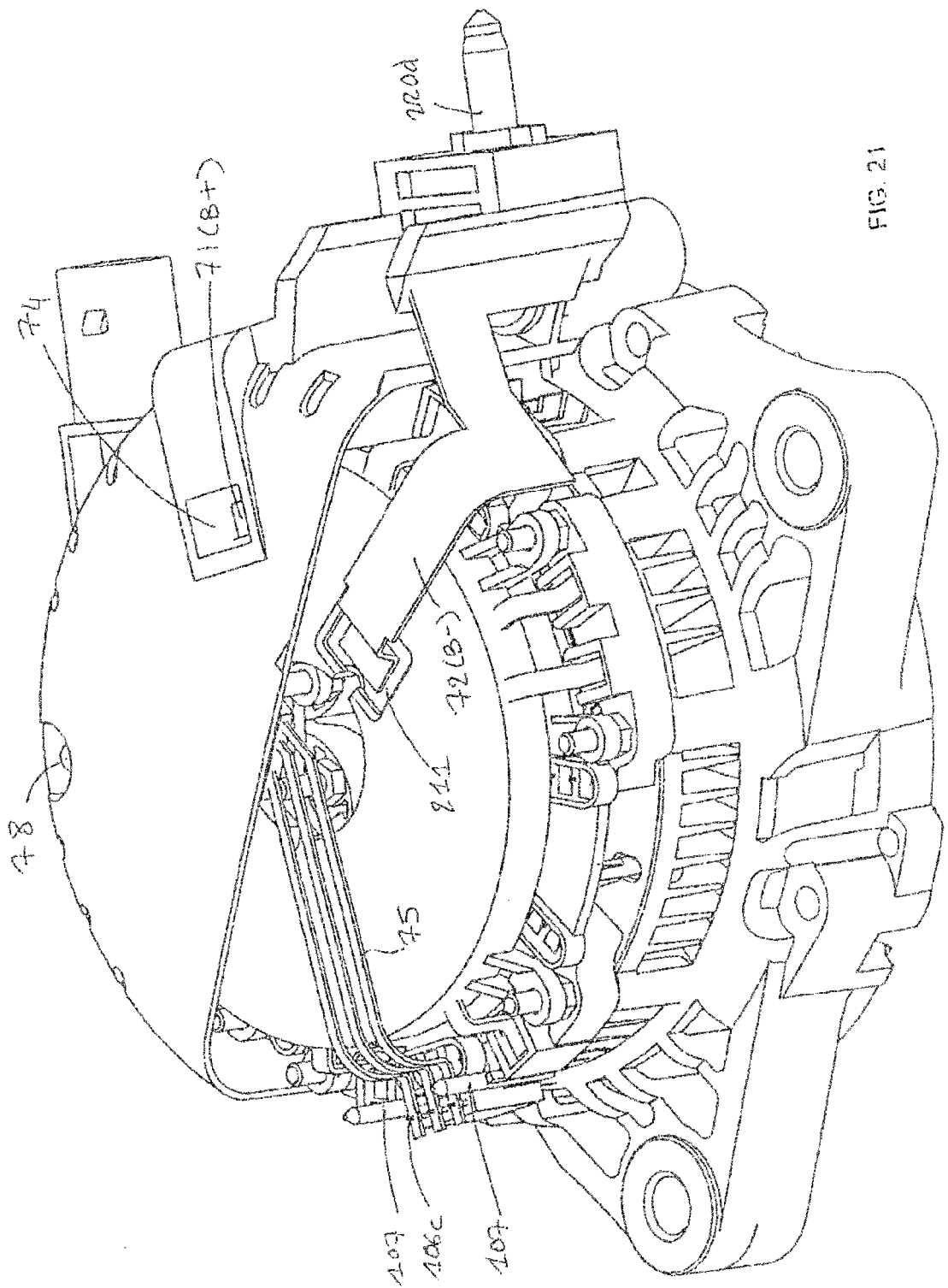
FIG. 21 depicts the arrangement of FIG. 20 with a cover in partial cross-section.
Figure 22:
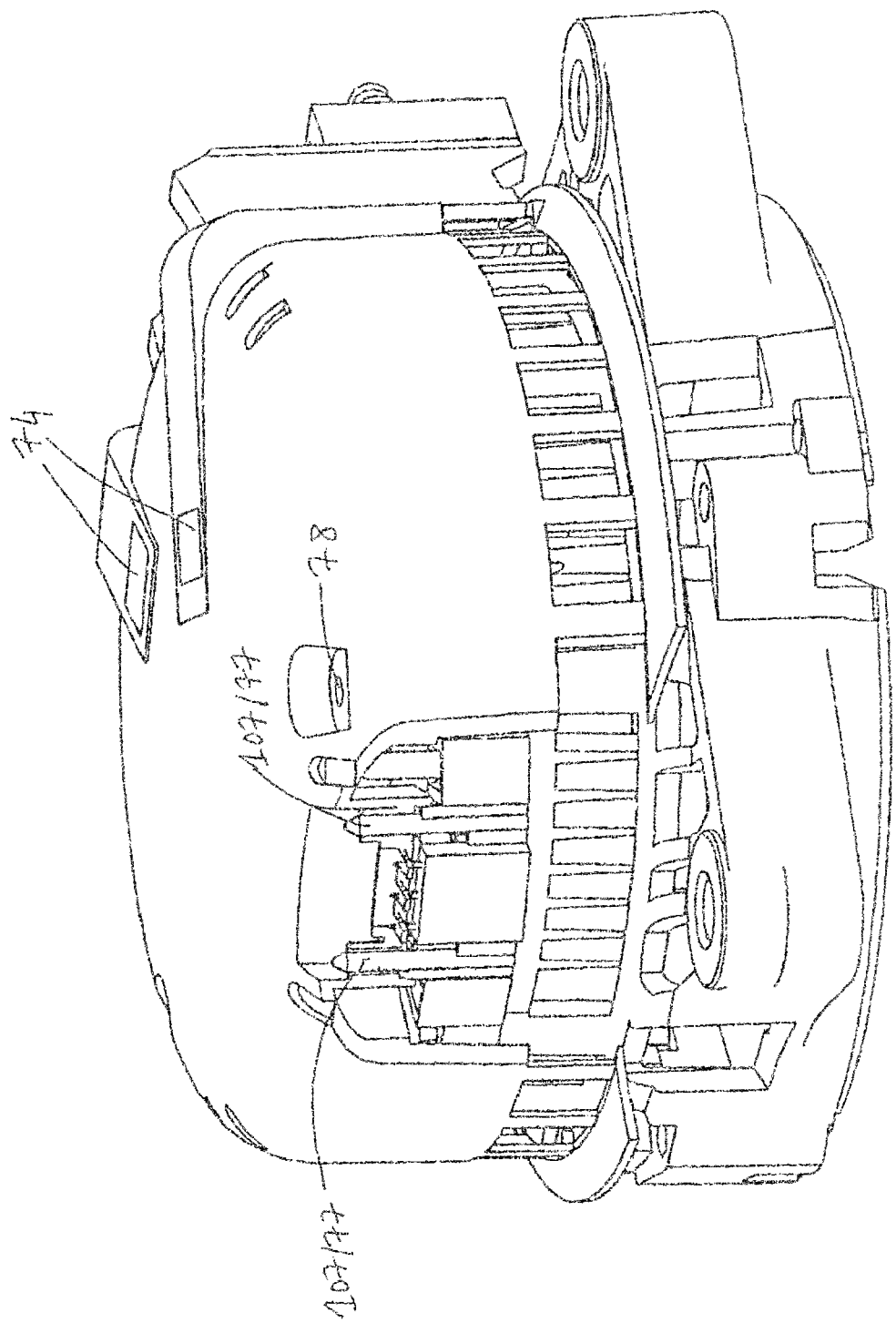
FIG. 22 is a complete view of the arrangement according to FIG. 21 with the cover in place, showing a positioning of the cover with respect to a module.

According to a first non-limitative way, illustrated in FIGS. 21 and 22, the cover 70 is placed on the power interconnection piece 21 so that the grooves 77 of the cover are situated opposite the guides 107 of the control module 30. These guides and grooves serve as a positive location device.

Next, after pressing, the grooves are inserted in the guides so that:
- contact is established between the signal tracks 75 of the cover 70 and the signal tongues 106c of the control module 30; and
- contact is established between the power tracks 71 (B+), 72 (B−) of the cover and respectively the power interconnection tracks 212, 211 of the power interconnection piece 21.

Finally, after installation of the cover, the electrical connection is made between the power tracks 71, 72 of the cover and the power interconnection tracks 212, 211 by laser welding via the openings 74.

The cover is fixed by three screws or nuts 78.

According to a second non-limitative preferential way, illustrated in FIG. 26, the cover 70 is placed on the power interconnection piece 21 in the same way as the first way with a view to establishing the electrical contacts. In addition, the openings 79 are placed above the three studs 226g that fix the electronic assembly.

Next, after pressing, the cover 70 is fixed by means of the studs to the electronic assembly (bearing/modules/interconnection plates).

In this case, the cover 70 bears on all the elements of the arrangement and thus ensures sufficiently strong support in order both to immobilize the power interconnection piece 21 on the dissipator bearing and to provide the necessary electrical contacts.

Thus, as can be seen, according to this first assembly mode, the electronic modules 10, the signal interconnection piece 22, the power interconnection piece 21 and the dissipator occupy respectively first, second, third and fourth planes all parallel to one another, and the planes are superimposed in the following order starting from the plane closest to the rear bearing of the machine:
- fourth plane;
- first plane;
- second plane; and
- third plane.

Thus the power interconnection piece 21 is independent of the electronic modules and is connected to the modules in particular only by its power electrical terminals.

The same applies to the signal interconnection piece 22, which is connected to the modules in particular only by its signal connection element 106.

According to a second module assembly mode, or arrangement, an electronic module interfaces with the following elements:
- a dissipator 80;
- a signal interconnection piece 22 according to the third embodiment;
- a power interconnection piece 21 according to the third embodiment; and
- a cover 70, according to the third embodiment.

Thus the second method of assembling all the parts described above is effected as follows.

It should be noted that, in the example taken for this assembly method, there exist four modules that are fixed to the dissipator 80. Three power modules 20 and one control module 30.

Figure 27A:
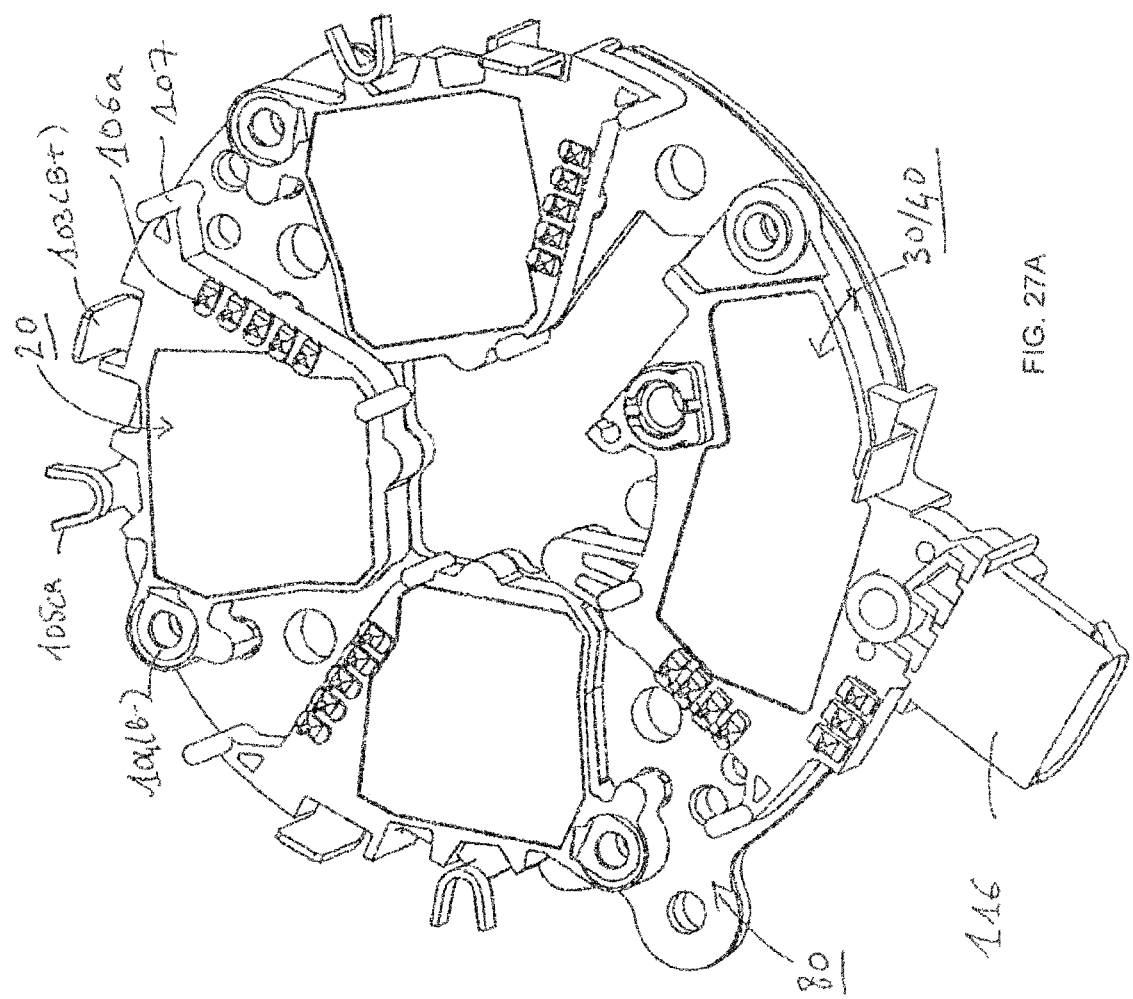
FIG. 27A depicts a mounting of the modules of FIG. 4A on a dissipator.

In a first step 1), illustrated in FIG. 27A the modules are positioned on the top face of the dissipator 80 so as to fix them.

The positioning takes place by means of the positioning pins 109a and 109b, which are placed opposite the orifices 810 of the dissipator 80, and during the positioning the insert 120 of each module comes to be positioned opposite each associated orifice 804 in the dissipator 80.

Subsequently the fixing is carried out by means of:
- screws 1150 that are inserted in the fixing orifices 115 of the modules and the corresponding orifices 804 of the dissipator 80. These fixing screws also make it possible to connect the modules to earth via the insert 120; and
- the signal connector 116 of the control module 30, which is screwed into the associated orifice 807 of the dissipator, by means of a via screw.

During assembly,
the electrical protection means 126 of the modules are inserted in the recesses 809 of the dissipator provided for this purpose.

In addition, the modules are also bonded to the dissipator 80 by means of an adhesive, such as a glass ball adhesive.

It should be noted that, prior to the fixing of the control module 30 to the dissipator 80, the brush holder 50 was fixed to the module by means of the screw 117a provided for this purpose. In another variant, it is possible to fix it after the installation of the control module 30 on the dissipator 80.

Figure 28:
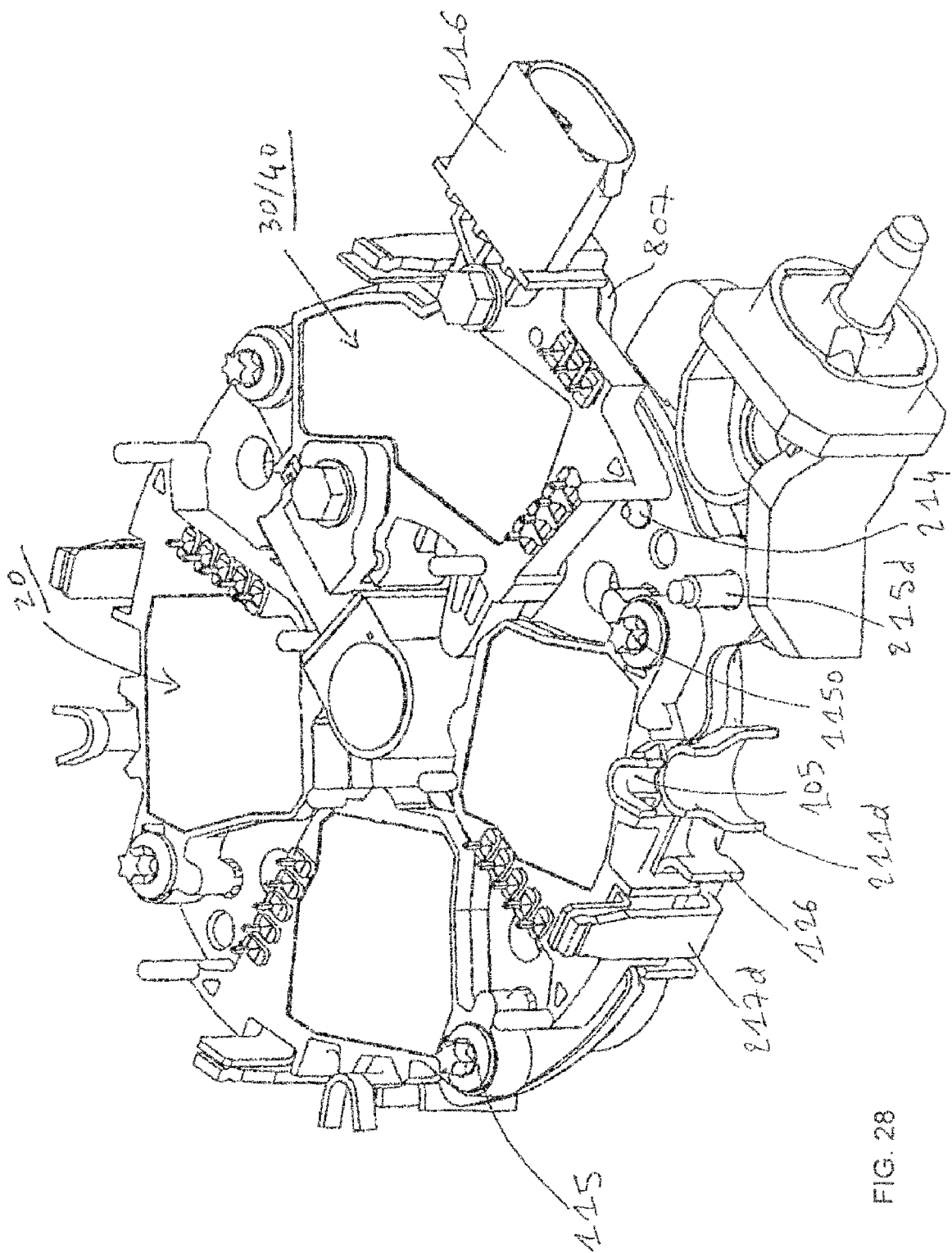
FIG. 28 depicts a mounting of the power interconnection piece of FIG. 14A on the dissipator/modules assembly of FIG. 27A.

In a second step 2), illustrated in FIG. 28, the power interconnection piece 21 is positioned on the bottom face of the dissipator so as to fix the power interconnection piece 21 to the dissipator 80.

The positioning is effected by means of:
- means 214d of positioning the power interconnection piece 21 that come opposite the associated mechanical positioning orifices 808 in the dissipator; and
- the fixing terminal 215d, which comes opposite the electrical connection orifice 805.

The fixing of the power interconnection piece 21 on the dissipator 80 is effected by means of:
- the two positioning means 214, which are placed in the corresponding mechanical positioning orifices 808 in the dissipator;
- the fixing terminal 215d, which is plugged into the electrical connection orifice 805; and
- the four force stays 213d, which are placed opposite the corresponding support zones 814 of the dissipator.

During assembly,
phase protection means 211d are integrated in the recesses 812 provided for this purpose in the dissipator.

Thus, as can be seen in FIG. 28:
- the means 221d will protect the phase tongues of the stator;
- the axial tongues of the fixing terminals 215d are then opposite the corresponding positive electrical conductor 103 (B+) of each electronic module 10, which will make it possible to establish an electrical connection between the electrical conductor 103 and the positive track 221d (B+) of the power interconnection piece 21; and the electrical insert 216d integrated in the terminal 215d makes it possible to earth the dissipator 80.

Figure 29:
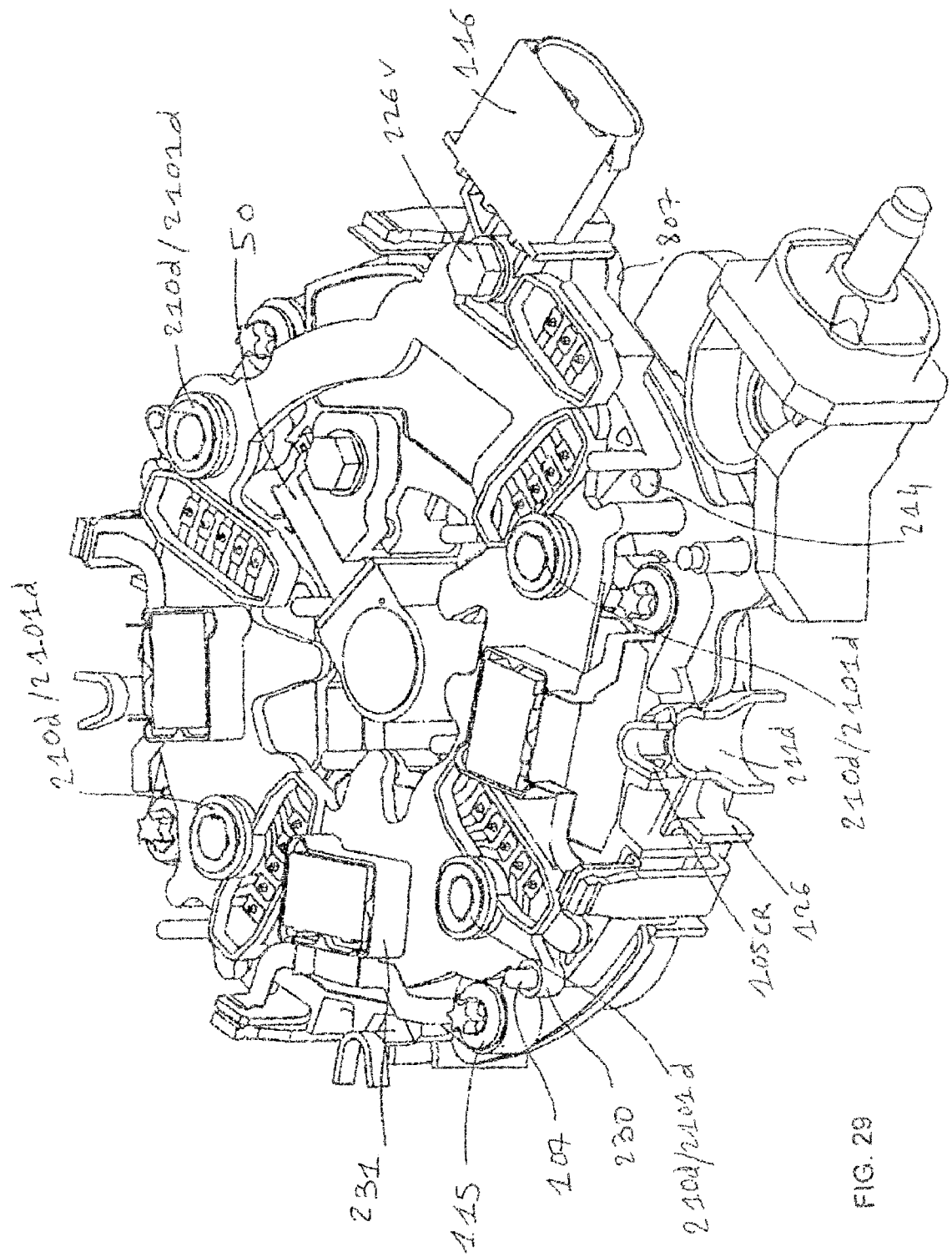
FIG. 29 depicts a mounting of the signal interconnection piece on the assembly of FIG. 28.

In a third step 3), illustrated in FIG. 29, the signal interconnection piece 22 is positioned on the electronic modules 10 so as to fix it.

It should be noted that the signal interconnection piece 22 is pre-positioned (pre-guided) by virtue of two protection pins or guides 107 of two electronic modules 10, the pins being the furthest away from each other in order to pre-guide well.

The positioning is effected by means of:
the two hollowed-out protuberances 230 serving for pre-guidance and which are pre-positioned on two positioning pins or guides 107 belonging to electronic modules.

Then, subsequently, it is possible to position the signal interconnection piece 22 by means of the positioning pins 224 in the corresponding orifices 811 of the dissipator 80.

During assembly, there are:
the connection recesses 221a that are placed opposite the signal tongues 106a of the modules;
the connection recesses 221b that are placed opposite the signal tongues 106b of the modules;
the stays 225a and 225b that are placed opposite the support 119, 114 respectively of the modules; and
the inserts 226 that are placed opposite the corresponding orifices 806 of the dissipator.

The fixing takes place by means of:
insulated hollow rivets 2101d associated with the inserts 210d of the power plate. These rivets 2101d inside the inserts allow on the one hand an assembly of the signal plate and on the other hand an insulation of the mass of the dissipator with respect to the mass of the bearing, and finally the creation of an electronic sub-assembly (the two plates, the dissipator and the electronic modules) pre-assembled so that, during assembly on the bearing, by means of screws or studs, after welding the signal connection element 106 with the signal interconnection piece 22, there are no additional forces that would risk mechanically stressing the welds.

Next, after pressing, the signal connection element 106 are inserted in the corresponding interconnection orifices 2210, 2211, the stays 225 bearing on the support 119, 114 of the modules.

It should also be noted that the housings 231 of the signal plate comprise in the example illustrated in FIG. 29 a capacitor associated with each of the power modules 20, which is connected firstly to the positive electrical conductor 103 (B+) of the associated module and secondly to the negative electrical conductor 104 (B−) of the associated module.

In addition, preferentially, it is possible to effect a tin or laser welding, or to deposit a resin plus polymerization in the connection recesses 221a and 221b of the signal connection element 106 in order in particular to protect them from salt spray.

Figure 30A:
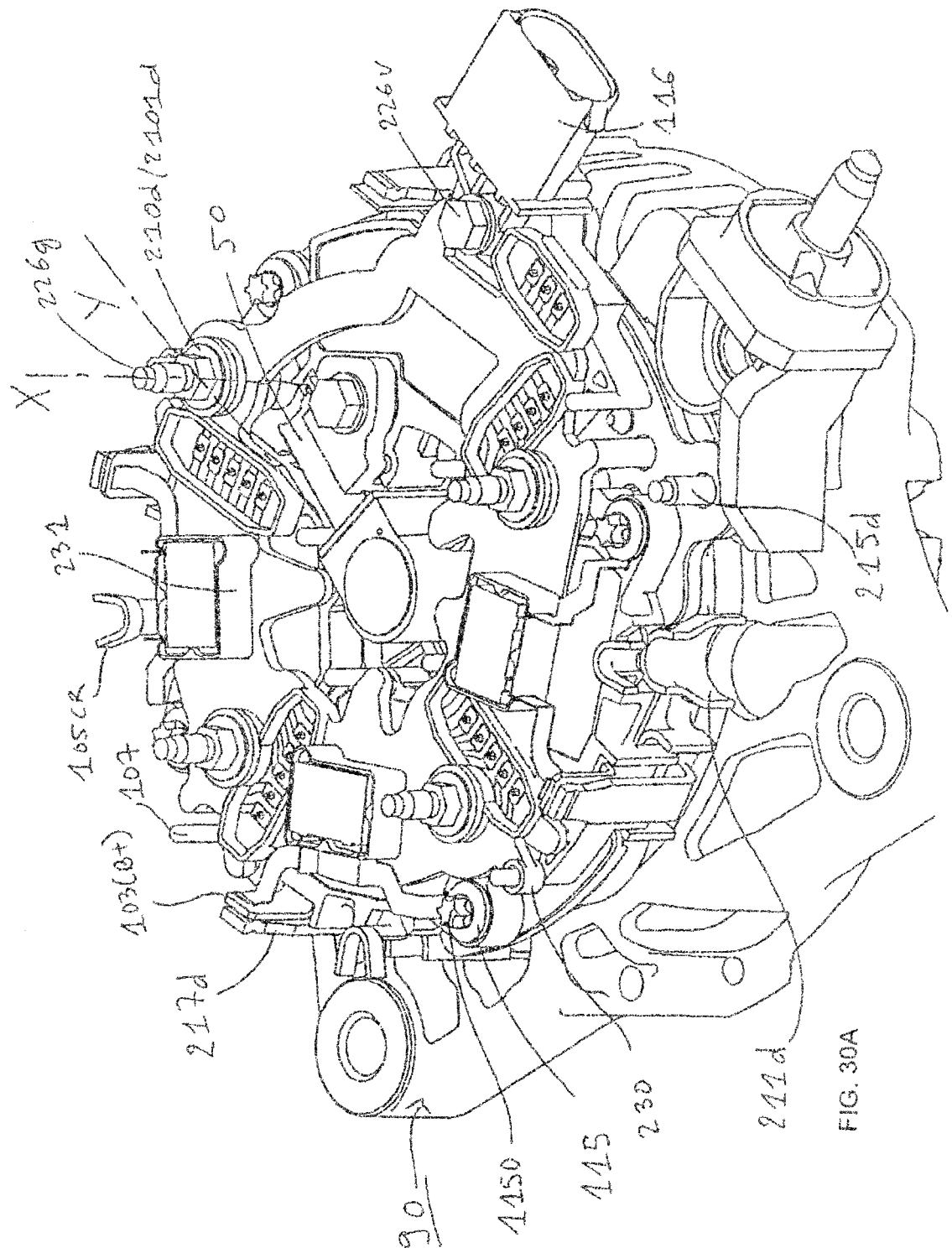
FIG. 30A is an assembling of the assembly of FIG. 29 on a bearing.

In a fourth step 4), illustrated in FIG. 30A, the whole of the electronics thus obtained are positioned on the rear bearing 90 of the machine.

Fixing takes place by means of:
four studs 226g or screws in the rear bearing 90 by means of the inserts 226 of the signal interconnection piece 22, inserts 210d of the power interconnection piece 21 and fixing orifice 806 of the corresponding dissipator 80. The studs bear on the same plate and consequently on the plate/dissipator/bearing assembly so as to create an electronic assembly on the bearing. In the same way, the screw 226v is screwed in the respective corresponding inserts 226 and 807 of the signal interconnection piece 22 and dissipator 80.

Figure 30B:
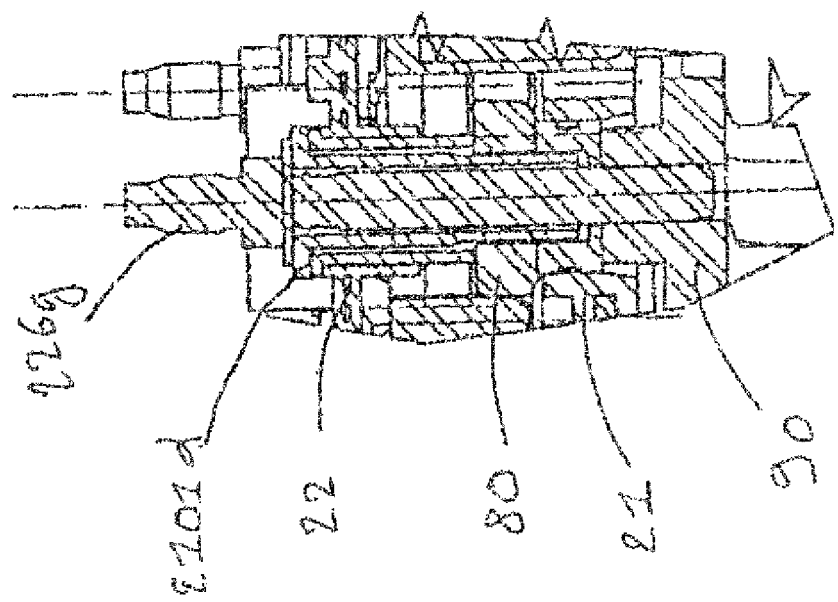
FIG. 30B is a section along a plane X-Y of FIG. 30A of the assembled power interconnection piece of FIG. 14A.

FIG. 30B is a view in section along the plane X-Y shown in FIG. 30A, showing an entire assembly of the main parts cited above. It shows in particular:
the rear bearing 90;
the power interconnection piece 21;
the dissipator 80;
the signal interconnection piece 22;
a rivet 2101d; and
a fixing stud 226g.

Figure 30C:
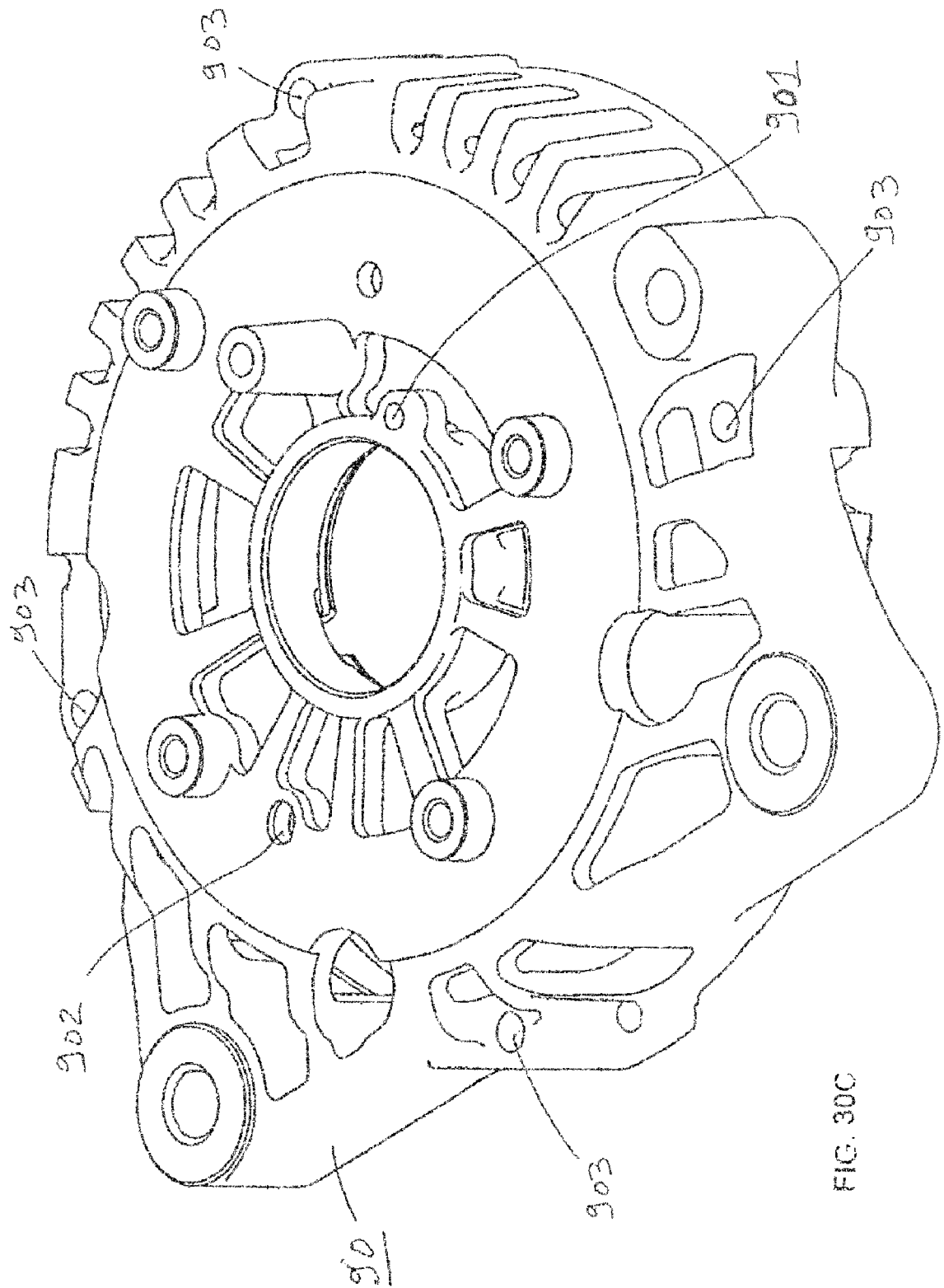
FIG. 30C depicts a bearing on which the assembly of FIG. 29 is assembled.

It should be noted that, prior to the electronic assembly, the rear bearing 90 of the machine is fixed to the front bearing (not shown) of the machine by means of four tie rods in orifices 903, the orifices being illustrated in FIG. 30C of the rear bearing 90. The tie rods are thus screwed before the electronic assembly, which makes it possible to position the phases of the stator in advance and therefore to facilitate the assembly of the electronic sub-assembly with the phases.

The rear bearing comprises in particular:
a positioning orifice 901 configured so as to receive the positioning pin 1151 of the control module 30, which allows precise positioning of the position sensors with respect to the bearing; and
a referencing orifice 902 in which the pin 212d of the power interconnection piece 21 is inserted.

The phase hooks 105cr are also welded to the phases of the stator (standard wires or using a thimble).

Finally, in a fifth step 5), the plastic cover 70 is put in place by means of fixing clips that are snapped onto the studs.

Figure 27B:
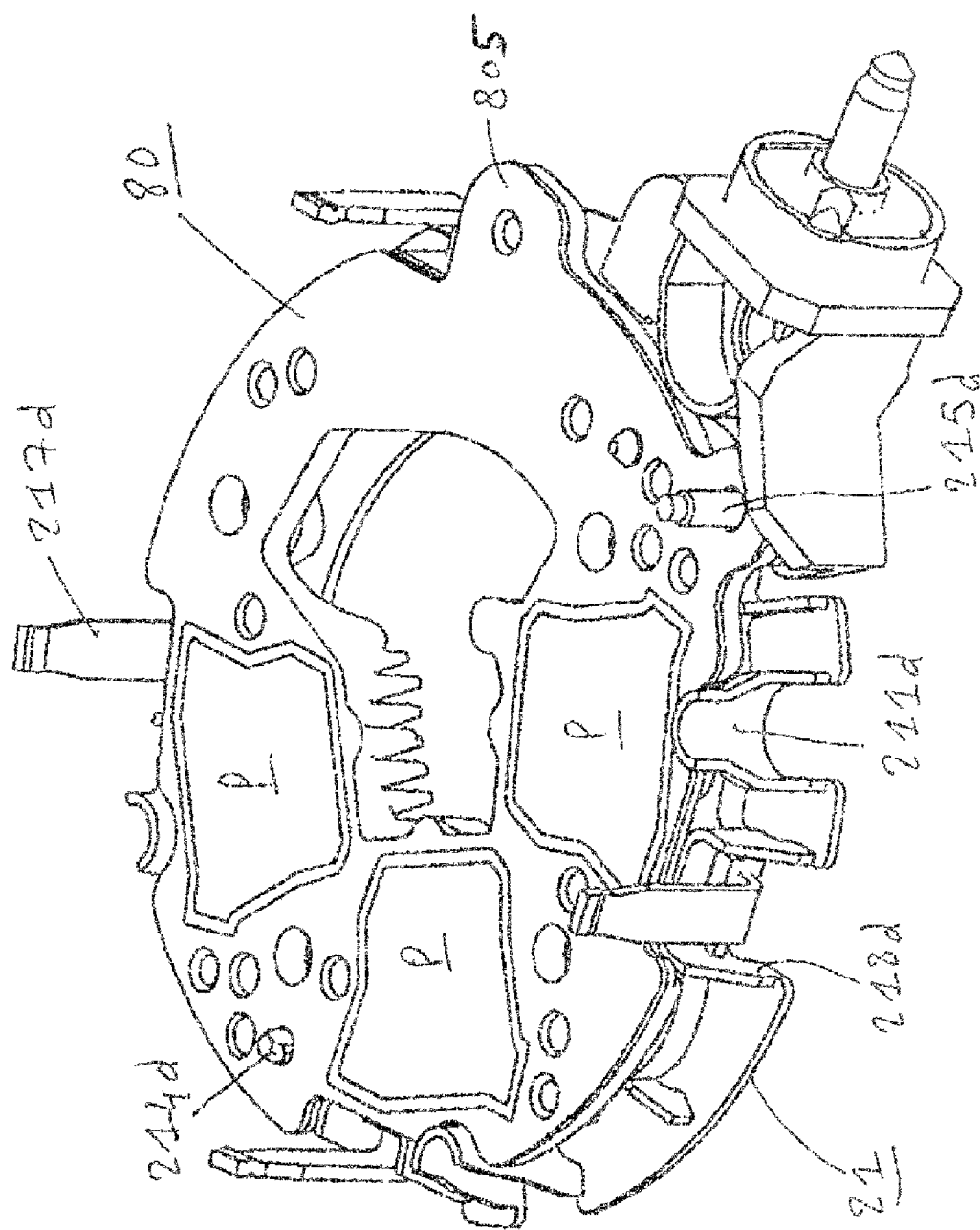
FIG. 27B depicts a mounting of the power interconnection piece of FIG. 14A on a dissipater.

It should be noted that the steps specified above can be performed in a different order. For example, the second step can of course be performed before the first step (FIG. 27B illustrates this case) or after the third step.

Thus the second assembly method has the following advantages:
firstly, the assembly of the entire electronic part (modules, power and signal plates) takes place outside the rear bearing so that it is possible to test the electronics before assembly on the machine; in this way only the electronics that function in the machine are integrated, which saves time in terms of process, and makes it possible to have two independent processes and therefore not to modify the "process" method of standard machine assembly that already exists;
secondly, the assembly of the electronic part can take place after the assembly of the rear bearing of the machine on the front bearing, or more particularly after the fitting of the tie rods fixing the bearings, which will then be covered by the electronics;
thirdly, the performance with regard to thermal cooling is improved because of the axial air flow added to the radial air flow. There is a reduction in pressure drops with an axial air inlet;
fourthly, the cover is now no more than a simple plastic cover. There are no molded-on tracks in the cover, the power tracks and the signal tracks being integrated respectively in the power plate and in the control/excitation module, which makes it possible to limit the number of interconnection welds to be carried out;
fifthly, the earth plane is implemented by the dissipator. There is therefore a reduction in the resistance and inductance of the internal power circuit between the client two-phase power connector and the power module because of the proximity of the positive-polarity track (B+) of the power interconnection piece 21 to the dissipator mass; and sixthly, the earth plane is implemented by the dissipator, so that there is a saving in axial space. In this way an existing part is used for conveying current.

Thus, according to this second assembly method, the electronic modules 10, the signal interconnection piece 22, the power interconnection piece 21 and the dissipator occupy respectively first, second, third and fourth planes all parallel to one another, and the planes are superimposed in the following order, starting from the plane closest to the rear bearing:

third plane;
fourth plane;
first plane; and
second plane.

Thus the power interconnection piece 21 is independent of the electronic modules and is connected to the modules in particular only by its electrical power terminals.

The same applies to the signal interconnection piece 22, which is connected to the modules in particular only by its signal connection element 106.

Thus all the four parts form an independent electronic sub-assembly of a bearing of the machine.

It should be noted that the two assembly methods have the advantage of using the maximum surface available on the rear of the machine for the modules by virtue of the stacking of the various elements for the power and signal interconnections, unlike a solution in which the power and signal interconnection tracks occupy surface on the rear of the machine to the detriment of the modules.

It should be noted that the signal interconnection piece 22 according to the various embodiments described above can be used when there is no power interconnection piece 21. For example with modules themselves effecting their power interconnection.

As for the power interconnection piece 21 according to the various embodiments described previously, it can also be used without the signal interconnection piece 22. For example, with an electronic card PCB effecting the signal interconnection.

The assembly according to all the embodiments presented above has the following additional advantages:

it avoids stacking all the tracks on one another, a stack not being propitious to good holding in position of the tracks;

it comprises means of fixing to the dissipator or to the dissipator bearing that are not concentrated on the periphery of the dissipator or bearing, so that there exists a distribution of forces so as to withstand the mechanical vibrations well;

it enables the various components (interconnection plates and modules) to be in different planes and perpendicular to the rotation axis of the machine, so that it creates more space for the power tracks, which gives rise to a reduction in the resistivity of the tracks. Thus this assembly makes it possible to convey higher power; and it makes it possible to use in an optimum fashion the space available for the electronic modules on the rear bearing of the machine, the various components (interconnection plates and modules) being on different planes and perpendicular to the rotation axis of the machine.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. A power interconnection piece for a rotary electrical machine, wherein said power interconnection piece comprises at least one power track provided with electrical power terminals to cooperate with a power track of at least one electronic module so as to distribute electrical power to said electronic module, said electronic module being integrated on said rotary electrical machine;

wherein said power interconnection piece is configured so as to be placed on the bottom face of a dissipater;

wherein said power interconnection piece also comprises at least one force stay for axial deformation of said power interconnection piece, said at least one force stay preferably having a greater height than the insert.

2. The power interconnection piece according to claim 1, wherein said power interconnection piece comprises a base plate made from insulating material that at least partially overmolds said power track.

3. The power interconnection piece according to claim 2, wherein said base plate comprises at least one recess for an electrical connection of a power interconnection track with a cover.

4. The power interconnection piece according to claim 1, wherein said power interconnection piece is configured so as to be placed on a plane different from that of the electronic module, preferably above the electronic module.

5. The power interconnection piece according to claim 1, wherein said power terminals extend towards the external periphery of said power interconnection piece.

6. The power interconnection piece according to claim 1, wherein said power terminals comprise curved free ends.

7. The power interconnection piece according to claim 1, wherein said power track is flat.

8. The power interconnection piece according to claim 1, wherein said power interconnection piece comprises at least one positive power interconnection track and at least one negative power interconnection track.

9. The power interconnection piece according to claim 1, wherein said power interconnection piece also comprises fixing devices for fixing to an electronic module, said fixing devices extending radially on the external periphery of said power interconnection piece.

10. The power interconnection piece according to claim 1, wherein said power interconnection piece also comprises devices for pre-assembly on a signal interconnection piece, said signal interconnection piece conveying control signals between electronic modules.

11. The power interconnection piece according to claim 1, wherein said power interconnection piece also comprises inserts for receiving fixing means for fixing on said rotary electrical machine.

12. The power interconnection piece according to claim 1, wherein said power interconnection piece also comprises support devices for supporting said power interconnection piece on a dissipator of said rotary electrical machine during assembly.

13. The power interconnection piece according to claim 1, wherein said power interconnection piece comprises a central recess for the insertion of a brush holder.

14. The power interconnection piece according to claim 1, wherein said power interconnection piece also comprises at least one insert for receiving a hollow rivet and effecting a pre-assembly with an electronic module and a signal interconnection piece and a dissipator.

15. The power interconnection piece according to claim 1, wherein it also comprises means of protecting stator phases of said rotary electrical machine.

16. The power interconnection piece according to claim 1, wherein it also comprises means of positioning on the bearing of said rotary electrical machine, said means extending over a bottom face of said power interconnection piece, and preferably other devices for positioning said power interconnection piece on a dissipator of said rotary electrical machine.

17. The power interconnection piece according claim 1, wherein said power interconnection piece also comprises a metal insert so as to effect an electrical connection with a negative power track.

18. The power interconnection piece according to claim 1, wherein the power interconnection terminals issue from a positive power track.

19. The power interconnection piece according to claim 1, wherein the electrical interconnection terminals are axial tongues projecting beyond the top face of said power interconnection piece.

20. The power interconnection piece according to claim 1, wherein said power interconnection piece also comprises a power connector in which positive and negative power tracks are inserted in a visible fashion.

21. The power interconnection piece according to claim 1, wherein said power interconnection piece also comprises a terminal for mechanical connection to a client connector.

22. The power interconnection piece according to claim 1, wherein said power interconnection piece also comprises a collar intended to cover air outlet openings in the bearing of said rotary electrical machine so as to guide the outlet air and attenuate a looping of air.

* * * * *